US011711967B2

(12) United States Patent
Wheeler et al.

(10) Patent No.: US 11,711,967 B2
(45) Date of Patent: Jul. 25, 2023

(54) SWITCHABLE PHOTOVOLTAIC DEVICES

(71) Applicant: Alliance for Sustainable Energy, LLC, Golden, CO (US)

(72) Inventors: Lance Michael Wheeler, Golden, CO (US); Bryan Anthony Rosales, Boulder, CO (US); Shuang Cui, Lakewood, CO (US); David Todd Moore, Arvada, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 367 days.

(21) Appl. No.: 16/986,234

(22) Filed: Aug. 5, 2020

(65) Prior Publication Data

US 2021/0043854 A1    Feb. 11, 2021

Related U.S. Application Data

(60) Provisional application No. 63/003,564, filed on Apr. 1, 2020, provisional application No. 62/893,472, filed
(Continued)

(51) Int. Cl.
*H01L 51/00* (2006.01)
*H01G 9/20* (2006.01)
(Continued)

(52) U.S. Cl.
CPC ............ *H10K 85/30* (2023.02); *C04B 35/78* (2013.01); *H01G 9/20* (2013.01);
(Continued)

(58) Field of Classification Search
CPC ....... H01L 51/0077; H01L 51/42; H01G 9/20; G02F 1/0147; G02F 1/17; G02F 1/178; G02F 1/1516
See application file for complete search history.

(56) References Cited

U.S. PATENT DOCUMENTS

2017/0089128 A1* 3/2017 Wheeler .................. C03C 4/06
2017/0321117 A1* 11/2017 Weidman ............... C09K 11/06
2018/0252028 A1    9/2018 Wheeler et al.

FOREIGN PATENT DOCUMENTS

WO    20190126820 A1    6/2019
WO     2019157352 A1    8/2019
(Continued)

OTHER PUBLICATIONS

Lianfeng Zhao, Ross A. Kerner, Zhengguo Xiao, YunHui L. Lin, Kyung Min Lee, Jeffrey Schwartz, and Barry P. Rand, Redox Chemistry Dominates the Degradation and Decomposition of Metal Halide Perovskite Optoelectronic Devices, ACS Energy Lett. 2016, 1, 595-602. (Year: 2016).*

(Continued)

*Primary Examiner* — Bijan Ahvazi
(74) *Attorney, Agent, or Firm* — Michael A. McIntyre

(57) ABSTRACT

The present disclosure relates to a composition that includes a scaffold having an internal space and a mixture positioned within the space, where the mixture includes a first phase having a metal halide perovskite and a second phase including at least one of a perovskite precursor and/or a switching molecule, the composition is capable of reversibly switching between a first state having at least one of a first transparency and/or a first color and a second state having at least one of a second transparency and/or a second color.

10 Claims, 59 Drawing Sheets

Related U.S. Application Data on Aug. 29, 2019, provisional application No. 62/882,903, filed on Aug. 5, 2019.

(51) Int. Cl.
| | |
|---|---|
| *G02F 1/01* | (2006.01) |
| *G02F 1/17* | (2019.01) |
| *H10K 85/30* | (2023.01) |
| *C04B 35/78* | (2006.01) |
| *H10K 30/00* | (2023.01) |
| *C09K 9/00* | (2006.01) |

(52) U.S. Cl.
CPC .......... *C04B 2235/768* (2013.01); *C09K 9/00* (2013.01); *H10K 30/00* (2023.02)

(56) References Cited

FOREIGN PATENT DOCUMENTS

| WO | WO-2019157352 A1 * | 8/2019 | ........... C01G 21/006 |
|---|---|---|---|
| WO | 2021007530 A1 | 1/2021 | |

OTHER PUBLICATIONS

Hsien-Yi Hsu, Li Ji, Minshu Du, Ji Zhao, † Edward T. Yu, and Allen J. Bard, Optimization of PbI2/MAPbI3 Perovskite Composites by Scanning Electrochemical Microscopy,J. Phys. Chem. C 2016, 120, 19890-19895. (Year: 2016).*

Cao, D. H. et al., "2D Homologous Perovskites as Light-Absorbing Materials for Solar Cell Applications," J. Am. Chem. Soc., vol. 137, 2015, 8 pages.

Fraccarollo, A. et al., "Ab initio modeling of 2D layered organohalide lead perovskites," Journal of Chem. Physics, vol. 144, 2016, 13 pages.

Gratia, P. et al., "The Many Faces of Mixed Ion Perovskites: Unraveling and Understanding the Crystallization Process," ACS Energy Letters, vol. 2, 2017, 8 pages.

Hua, Y. et al., "Ethanol induced structure reorganization of 2D layered perovskites (OA)2(MA)n-1PbnI3n+1," Journal of Luminescence, vol. 220, 2020, 6 pages.

Kostopoulou, A. et al., "Perovskite nanostructures for photovoltaic and energy storage devices," J. Mater. Chem. A, vol. 6, 2018, 34 pages.

La, T-G et al., "Highly Flexible, Multipixelated Thermosensitive Smart Windows Made of Tough Hydrogels," Applied Materials & Interfaces, vol. 9, 2017, 7 pages.

Leng, K. et al., "Molecularly thin two-dimensional hybrid perovskites with tunable optoelectronic properties due to reversible surface relaxation," Nature Materials, vol. 17, Oct. 2018, 9 pages.

Li, Z. et al., "Stabilizing Perovskite Structures by Tuning Tolerance Factor: Formation of Formamidinium and Cesium Lead Iodide Solid-State Alloys," Chem. Of Materials, vol. 28, 2016, 9 pages.

Lin, J. et al., "Thermochromic halide perovskite solar cells," Nature Materials, vol. 17, 2018, 9 pages.

Liu, M. et al., "Unveiling Solvent-Related Effect on Phase Transformations in CsBr—PbBr2 System: Coordination and Ratio of Precursors," Chem. Mater. vol. 30, 2018, 7 pages.

Manser, J.S. et al., "Making and Breaking of Lead Halide Perovskites," Acc. Chem. Res., vol. 49, 2016, 9 pages.

Mao, L. et al., "Two-Dimensional Hybrid Halide Perovskites: Principles and Promises," J. Am. Chem. Soc., vol. 141, 2019, 20 pages.

Quan, L.N. et al., "Ligand-Stabilized Reduced-Dimensionality Perovskites," J. Amer. Chem. Soc., vol. 138, 2016, 7 pages.

Sharma, S.K. et al., "Reversible Dimensionality Tuning of Hybrid Perovskites with Humidity: Visualization and Application to Stable Solar Cells," Chemistry of Materials, vol. 31, 2019, 7 pages.

Vidinha, P. et al., "Ion jelly: a tailor-made conducting material for smart electrochemical devices," ChemComm, 2008, DOI: 10.1039/b811647d, 3 pages.

Vinni, V. et al., "High Contrast Optical Switching in Electrochromic Prussian Blue Films for Display/Window Applications," Conference Proceedings of SPIE, Jul. 12, 2019, 5 pages.

Wheeler, L. et al., "Dynamic Evolution of 2D Layers within Perovskite Nanocrystals via Salt Pair Extraction and Reinsertion," J. Phys. Chem. C, vol. 122, 2018, 10 pages.

Wheeler, L., "Detailed Balance Analysis of Photovoltaic Windows," ACS Energy Letters, vol. 4, 2019, 7 pages.

Wheeler, L. et al., "Switchable photovoltaic windows enabled by reversible photothermal complex dissociation from methylammonium lead iodide," Nature Communications, DOI: 10.1038/s41467-017-01842-4, 9 pages.

Xiao, Z. et al., "Searching for promising new perovskite-based photovoltaic absorbers: the importance of electronic dimensionality," Materials Horizons, vol. 4, 2017, 11 pages.

* cited by examiner

Panel (A)

Panel (B)

ITO 1.58 ± 0.02 µm $Al_2O_3$ Scaffold

SWITCHABLE PHOTOVOLTAIC DEVICES

CROSS-REFERENCE TO RELATED APPLICATIONS

This application claims priority from U.S. Provisional Patent Application Nos. 62/882,903, 62/893,472, and 62/003,564 filed on Aug. 5, 2019, Aug. 29, 20219, and Apr. 27, 2020, respectively, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

An aspect of the present disclosure is a composition that includes a scaffold having an internal space and a mixture positioned within the space, where the mixture includes a first phase having a metal halide perovskite and a second phase including at least one of a perovskite precursor and/or a switching molecule, the composition is capable of reversibly switching between a first state having at least one of a first transparency and/or a first color and a second state having at least one of a second transparency and/or a second color, the first state corresponds to the perovskite being substantially in a first crystalline form and the second state corresponds to the perovskite being substantially in a second crystalline form.

In some embodiments of the present disclosure, the first crystalline form may have a first dimensionality, and the second crystalline from may have a second dimensionality that is different than the first dimensionality. In some embodiments of the present disclosure, A may be a first cation that includes at least one of methylammonium, formamidinium (FA), cesium, dimethylammonium, methylammonium, and/or ethylammonium. In some embodiments of the present disclosure, B may be a second cation that includes at least one of lead and/or tin. In some embodiments of the present disclosure, X may be an anion that includes at least one of iodine, bromine, and/or chlorine.

In some embodiments of the present disclosure, the perovskite may include at least one of FA, lead, and/or iodine. In some embodiments of the present disclosure, the first crystalline form may include at least one of $FA_4PbI_6$ or $FA_3PbX_5$, and the second crystalline form may include at least one of $FA_2PbI_4$, $FA_3Pb_2I_7$, and/or $FAPbI_3$. In some embodiments of the present disclosure, the scaffold may include at least one of a metal oxide and/or a polymer. In some embodiments of the present disclosure, the metal oxide may include at least one of $Al_2O_3$, $TiO_2$, $SiO_2$, NiO, ZnO, $ZrO_2$, ZnS, CdS, and/or BaS.

In some embodiments of the present disclosure, the space may be defined by a plurality of pores having a pore size between about 1 nm and about 0.1 mm. In some embodiments of the present disclosure, the switching molecule may include at least one of water, an alcohol, and/or an amine. In some embodiments of the present disclosure, the perovskite precursor may include A and X. In some embodiments of the present disclosure, the second phase may further include an additive. In some embodiments of the present disclosure, the additive may include at least one of a polar solvent and/or a polar aprotic ionic liquid. In some embodiments of the present disclosure, both the first color and the second color may include at least one of colorless, yellow, orange, red, brown, and/or black.

An aspect of the present disclosure is a device that includes a photovoltaic layer having a composition that includes a scaffold having an internal space and a mixture positioned within the space, where the mixture includes a first phase having a metal halide perovskite and a second phase that includes at least one of a perovskite precursor and a switching molecule, and the composition is capable of reversibly switching between a first state having at least one of a first transparency and/or a first color and a second state having at least one of a second transparency and/or a second color, where the photovoltaic layer has a thickness between about 50 nm and about 1.5 m. In some embodiments of the present disclosure, the device may further include a reservoir capable of supplying the switching molecule to the mixture.

An aspect of the present disclosure is a method of reversibly switching a chromic window, where the method includes reversibly switching a condition between at least two end-states, where changing the condition results in the reversible transferring of a switching molecule between a reservoir and a perovskite-containing composition, the transferring results in the reversible switching of a perovskite of the perovskite-containing composition between a first crystalline form and a second crystalline form, resulting in a color change to the chromic window. In some embodiments of the present disclosure, the condition may include at least one of a temperature, a concentration of the switching molecule, a pressure of a gas comprising the switching molecule, and/or a voltage. In some embodiments of the present disclosure, the condition may be the relative humidity of water.

SHORT DESCRIPTION OF THE DRAWINGS

Some embodiments are illustrated in referenced Figures of the drawings. It is intended that the embodiments and Figures disclosed herein are to be considered illustrative rather than limiting.

Figure 10A:
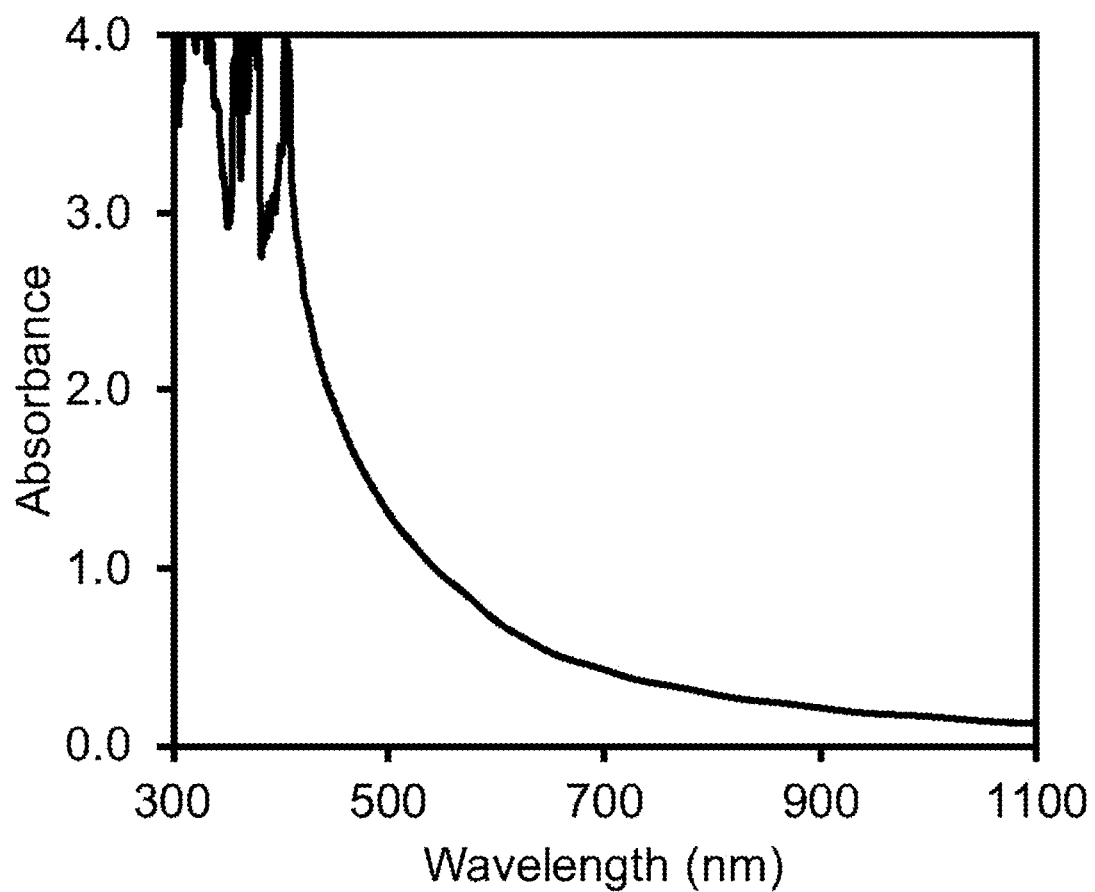
Figure 10B:
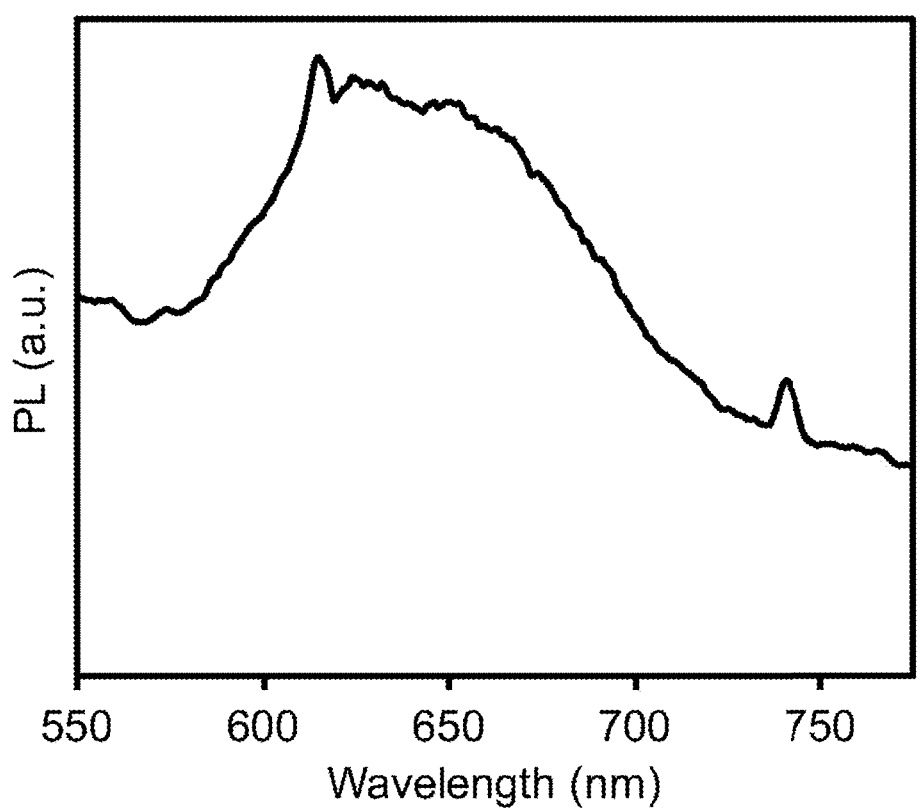
Figure 10C:
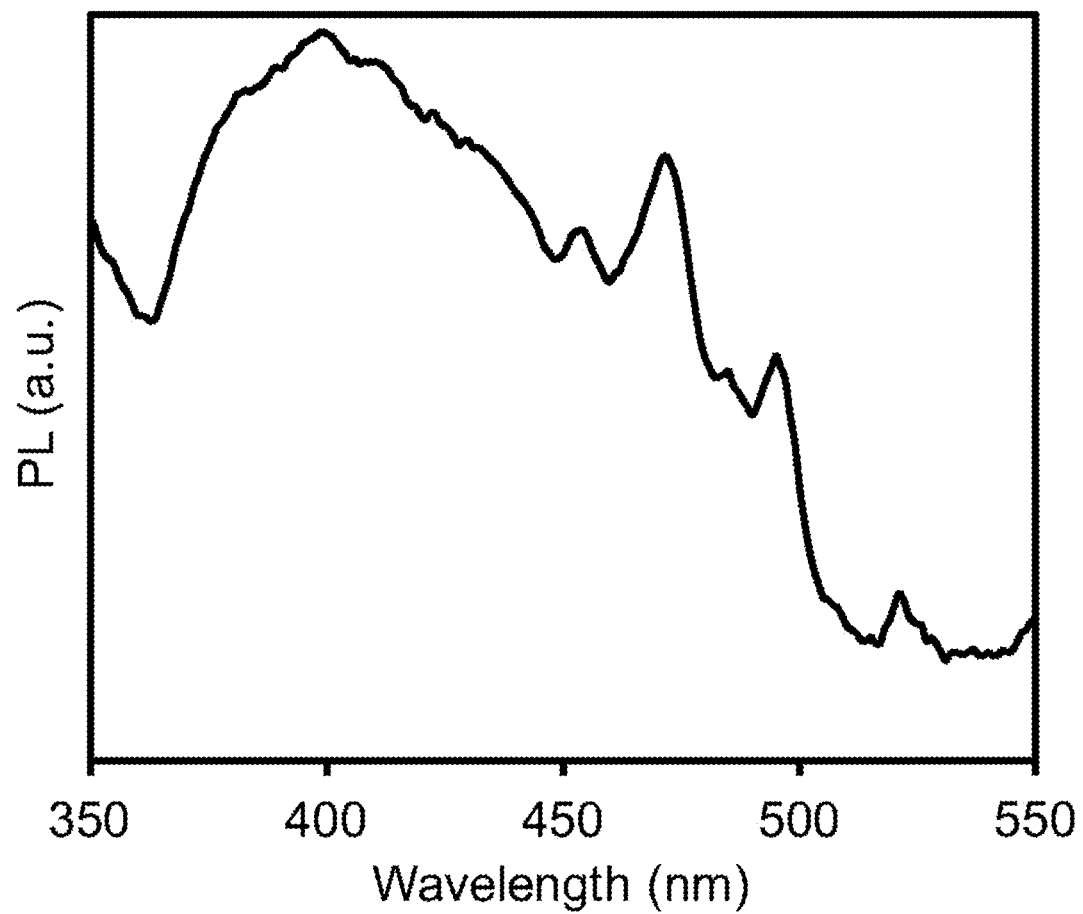

FIGS. 10A, 10B, and 10C illustrate the optical properties of $MA_4PbI_6$ including minimal absorbance of visible light (FIG. 10A) and weak photoluminescence (FIGS. 10B and 10C), according to some embodiments of the present disclosure.

Figure 11:
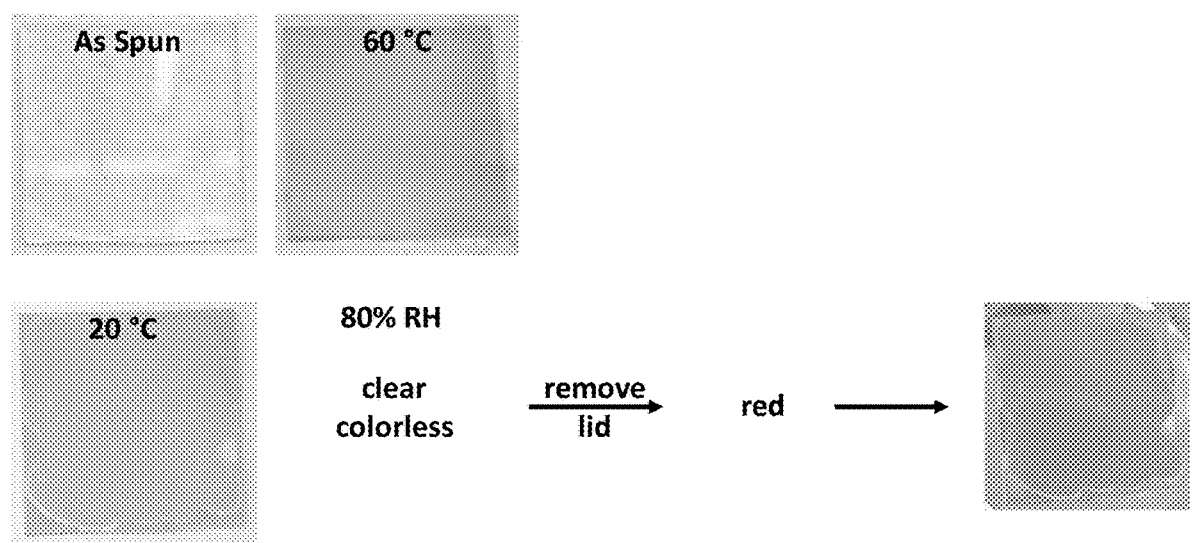

FIG. 11 illustrates results obtained for a device that included a $FA_4PbI_6$ perovskite layer, according to some embodiments of the present disclosure.

Figure 12A:
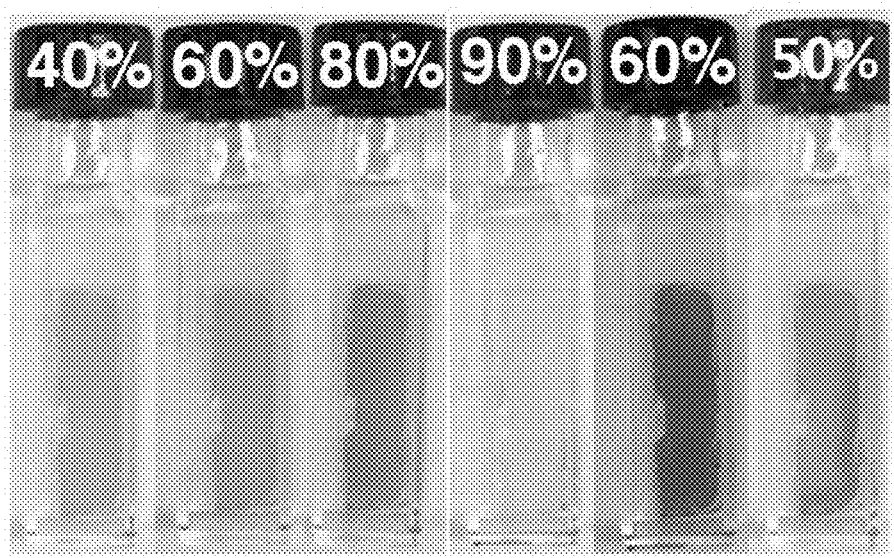
Figure 12B:
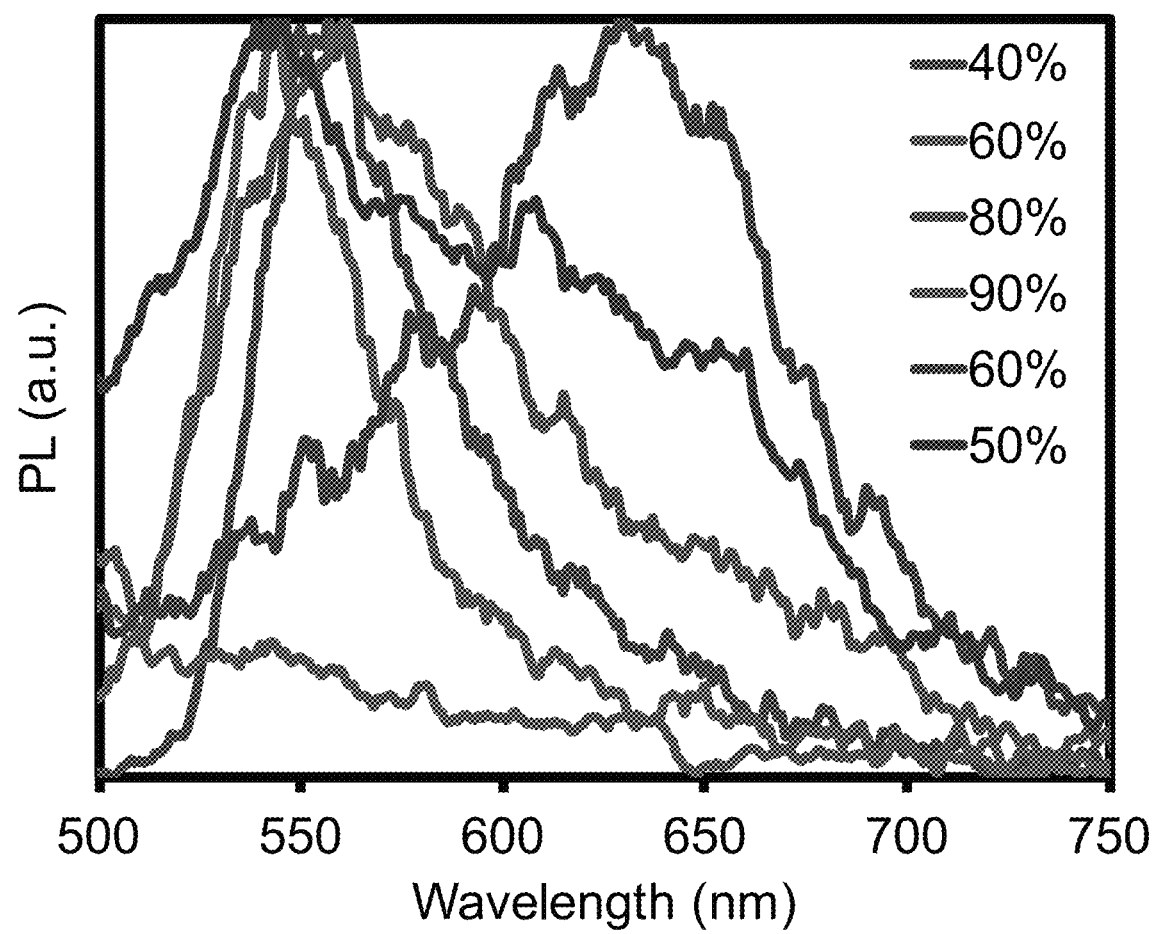
Figure 12C:
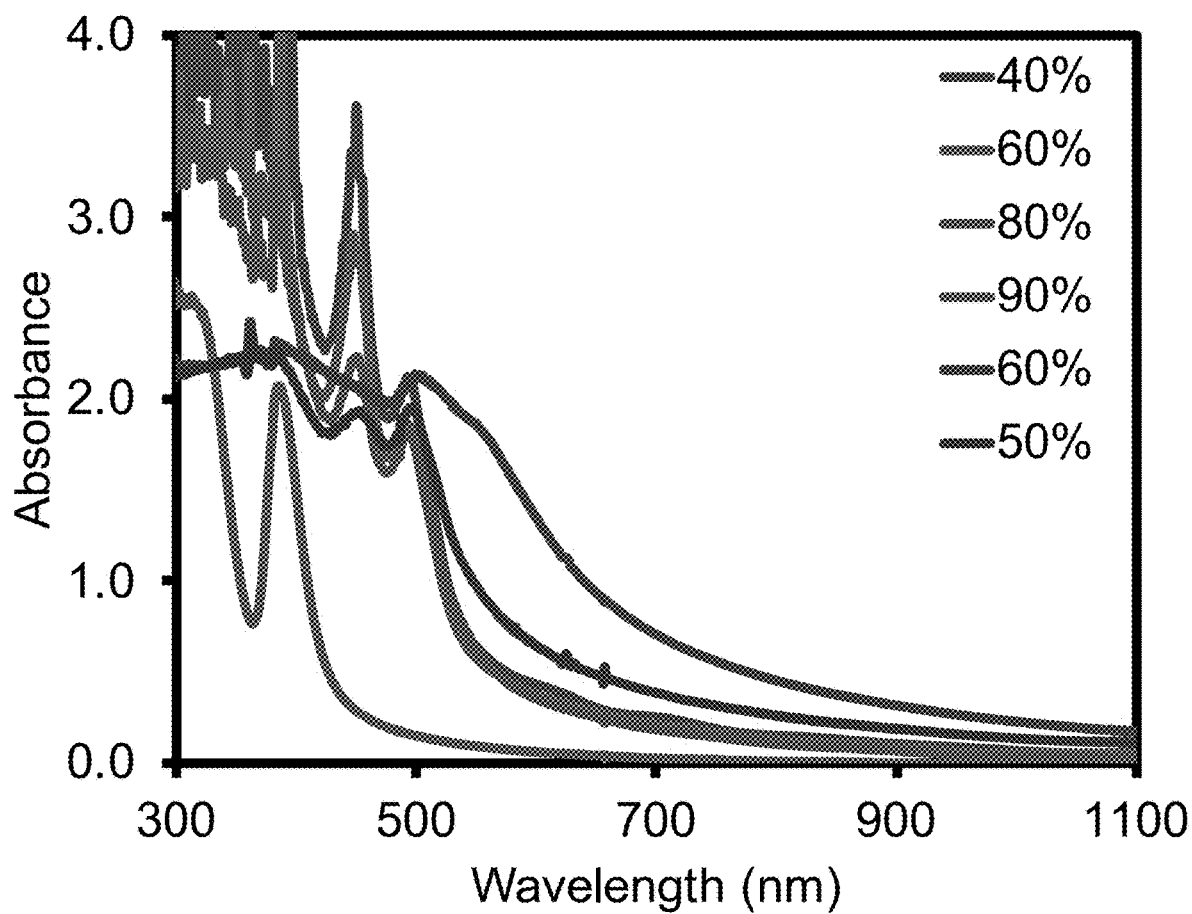
Figure 12D:
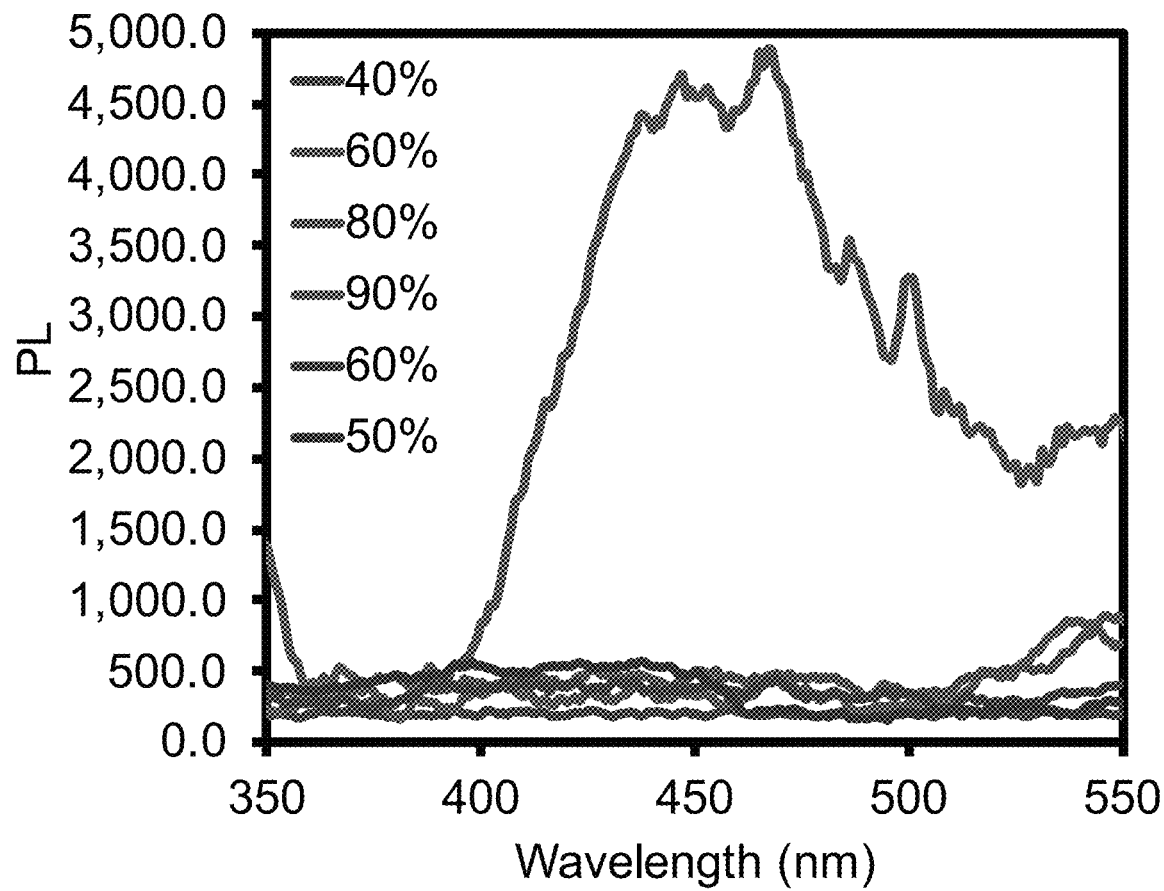

FIG. 12A-12D illustrate the reversible switching behavior of $FA_4PbI_6$, as a result of exposure to water, according to some embodiments of the present disclosure. FIG. 12A —color changes due to changing relative humidity (RH); FIGS. 12A and 12D —photoluminescence; and FIG. 12C—absorbance.

Figure 13:
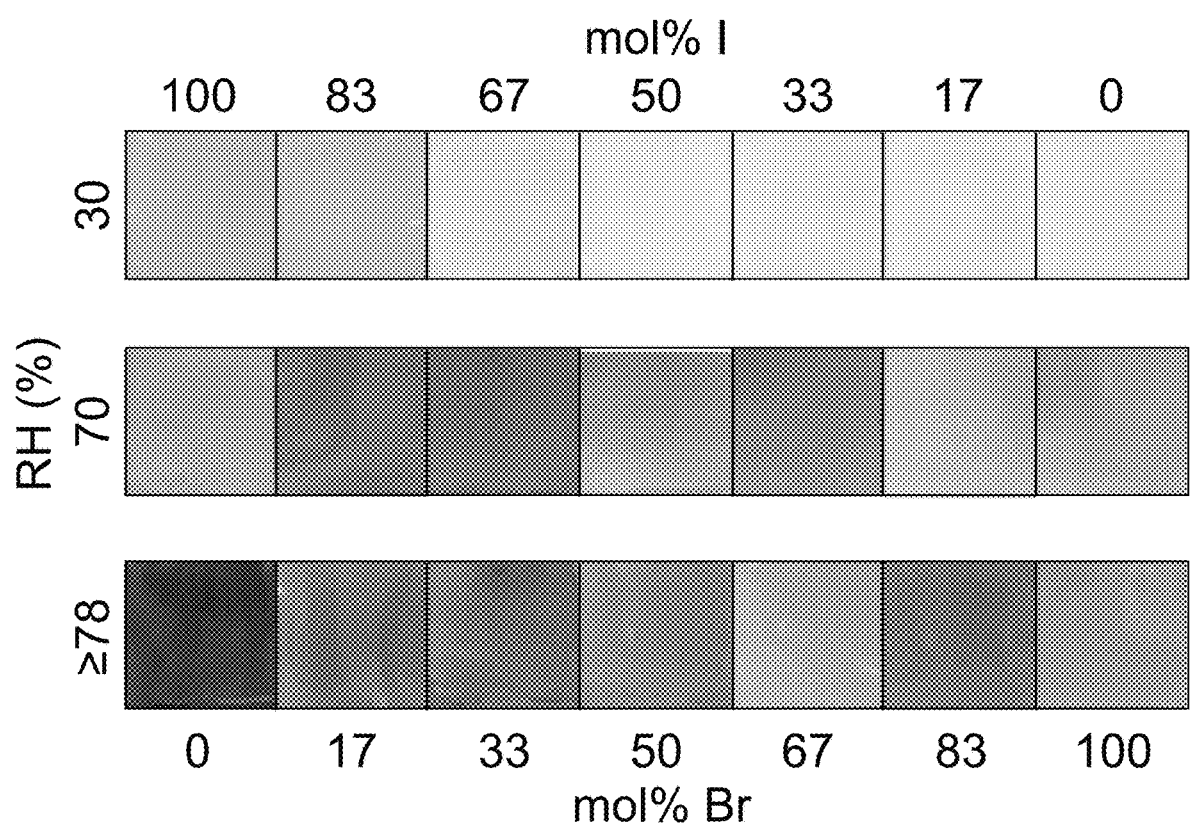

FIG. 13 illustrates representative optical photographs of $FA_{n+1}Pb_nX_{3n+1}$ perovskite films highlighting the diverse colors obtainable upon exposure to humidity, according to some embodiments of the present disclosure. Note that films rich in iodide (>80% I) color bleach to white/transparent upon exposure to >80% RH.

Figure 14:
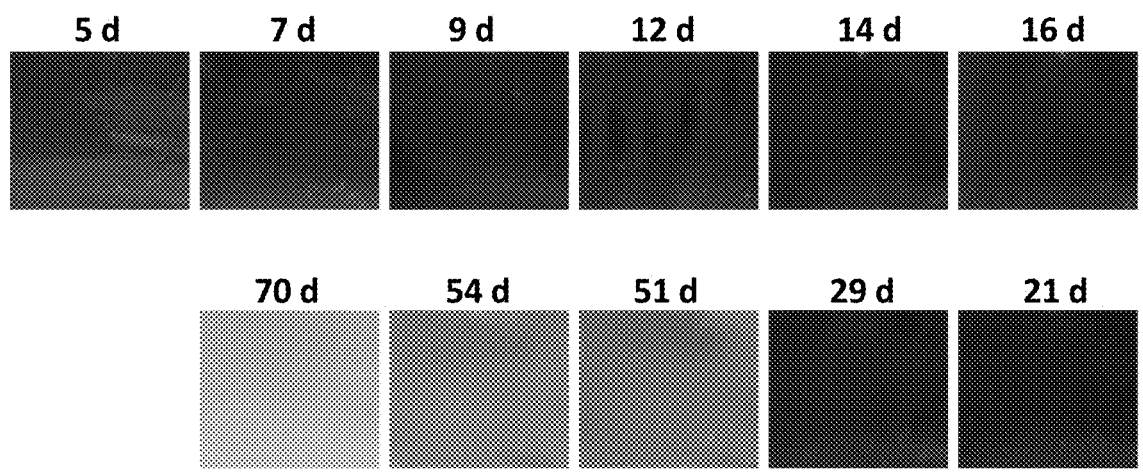

FIG. 14 illustrates photographs of a 4:1 $FAI:PbI_2$ film held at 75% RH until irreversible bleaching occurred, according to some embodiments of the present disclosure.

Figure 15A:
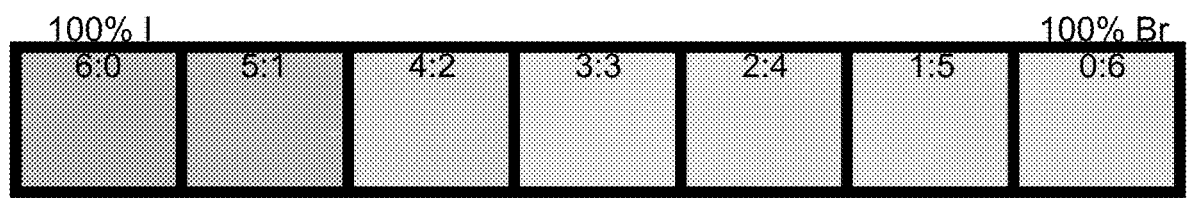
Figure 15B:
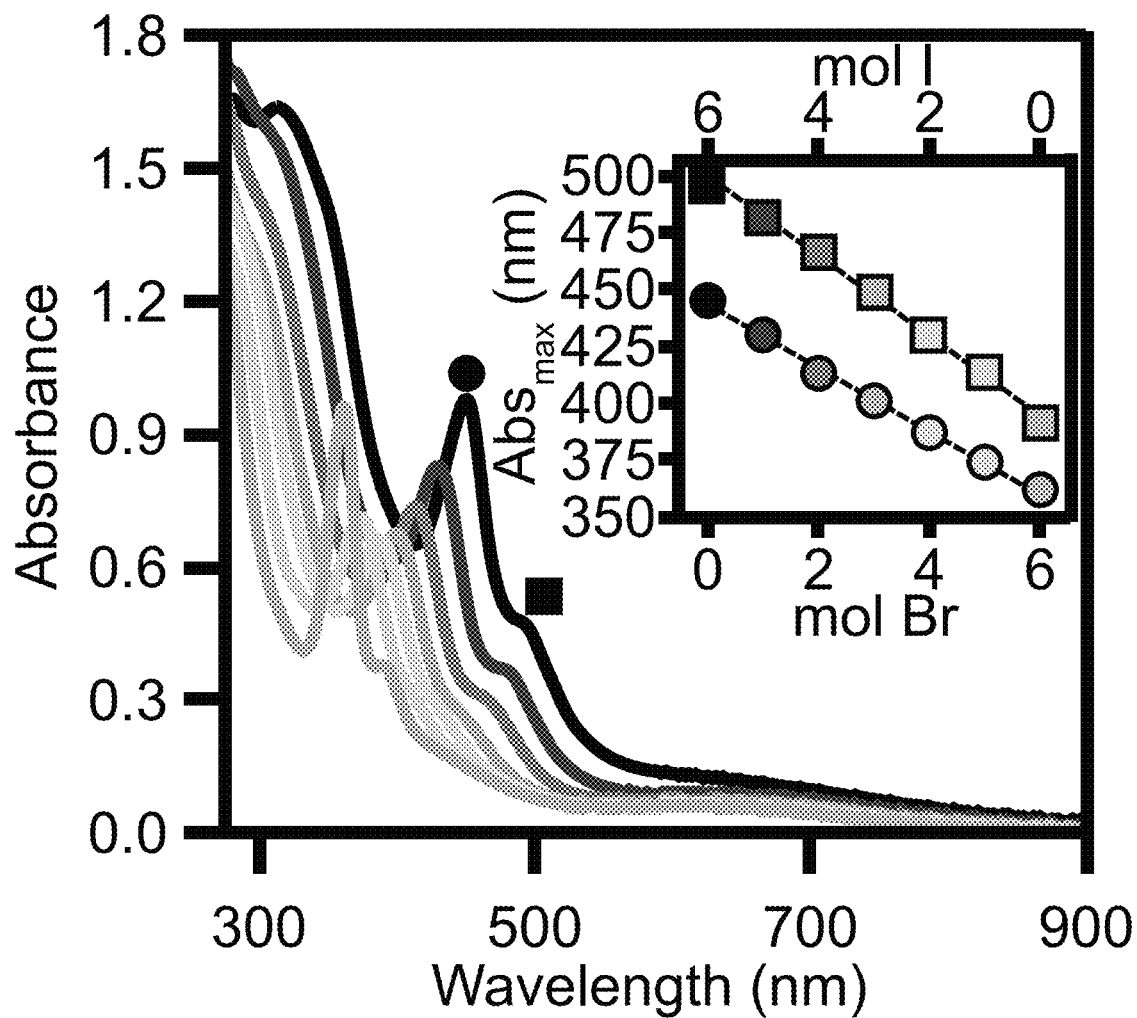
Figure 15C:
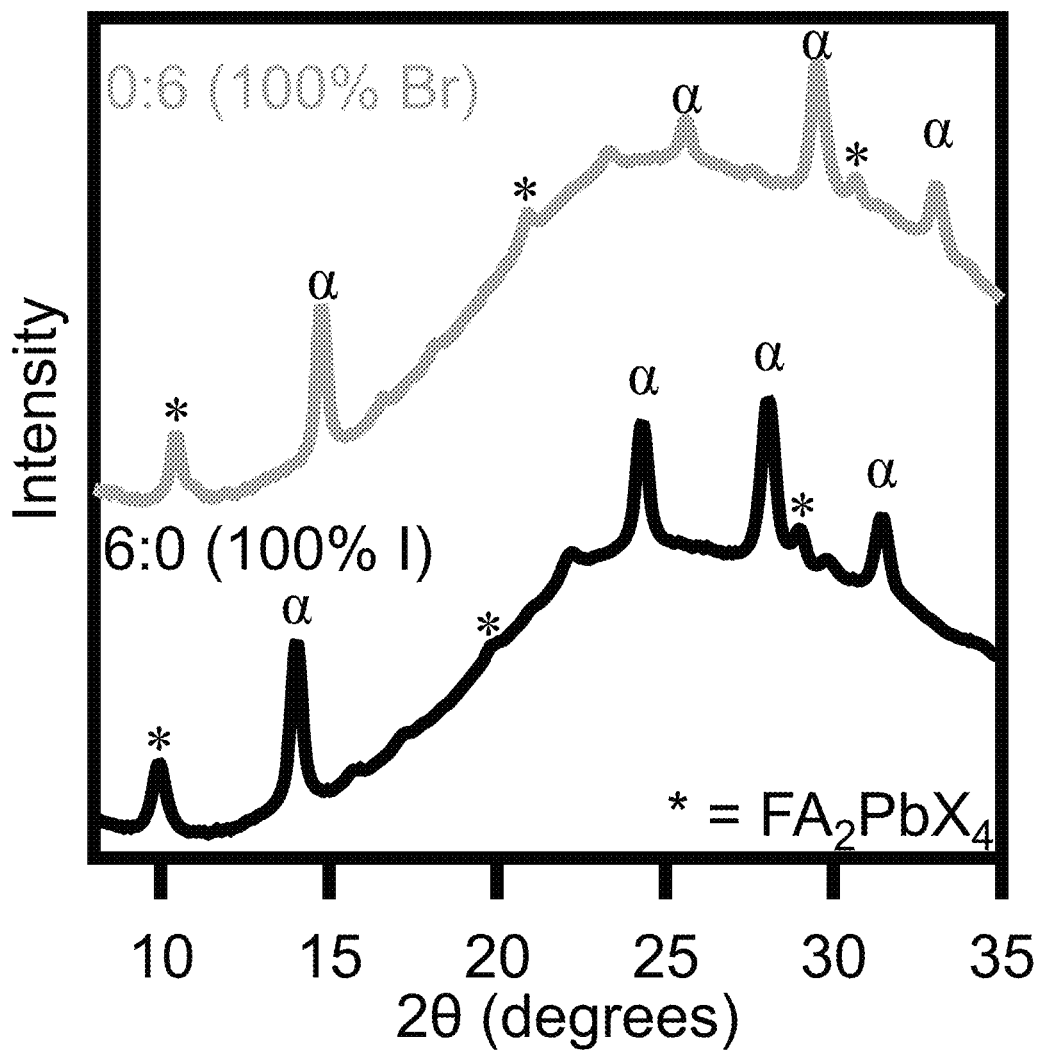

FIGS. 15A-15C illustrate perovskite films produced from 4:1 $FAX:PbX_2$ (4 FA: 1 Pb: 6 × mole ratios; X=I, Br) and show that these perovskite films exhibit composition-tunable band gaps, according to some embodiments of the present disclosure. FIG. 15A —representative visual images; FIG. 15B—absorbance; and FIG. 15C synchrotron XRD.

Figure 16:
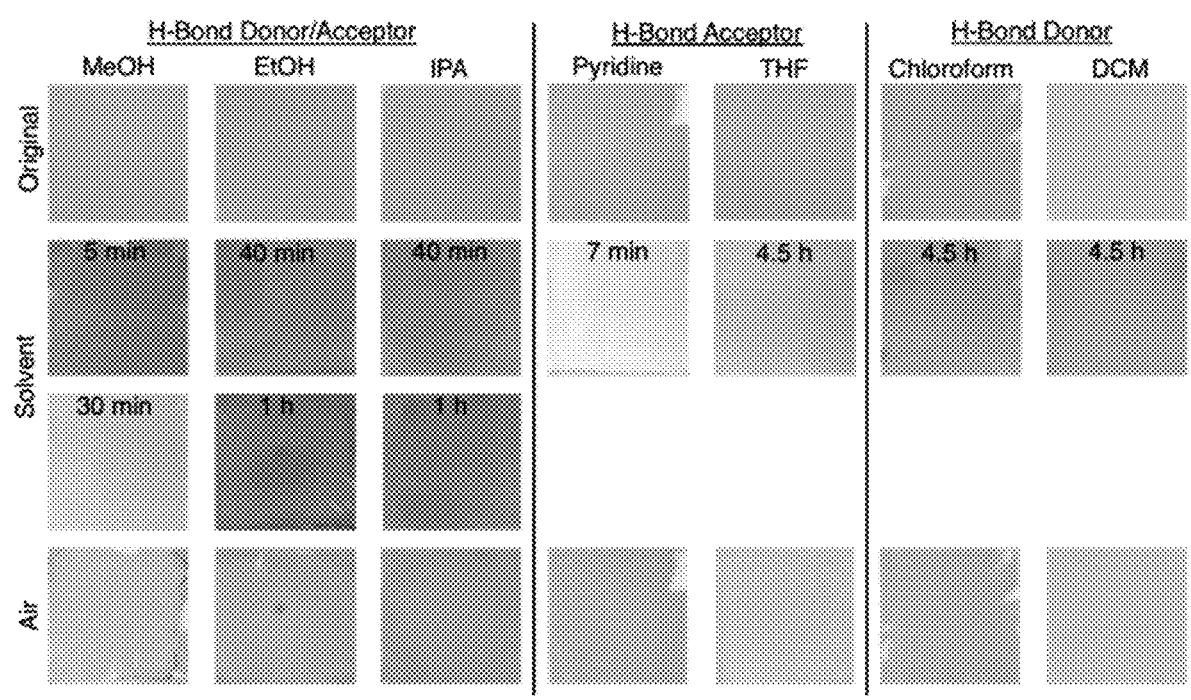

FIG. 16 illustrates chromic perovskite films prepared from 4:1 $FAI:PbI_2$ exposed to various switching molecule vapors, according to some embodiments of the present disclosure. Multiple colors were obtained if the switching molecule was both an H-bond donor and acceptor.

Figure 17:
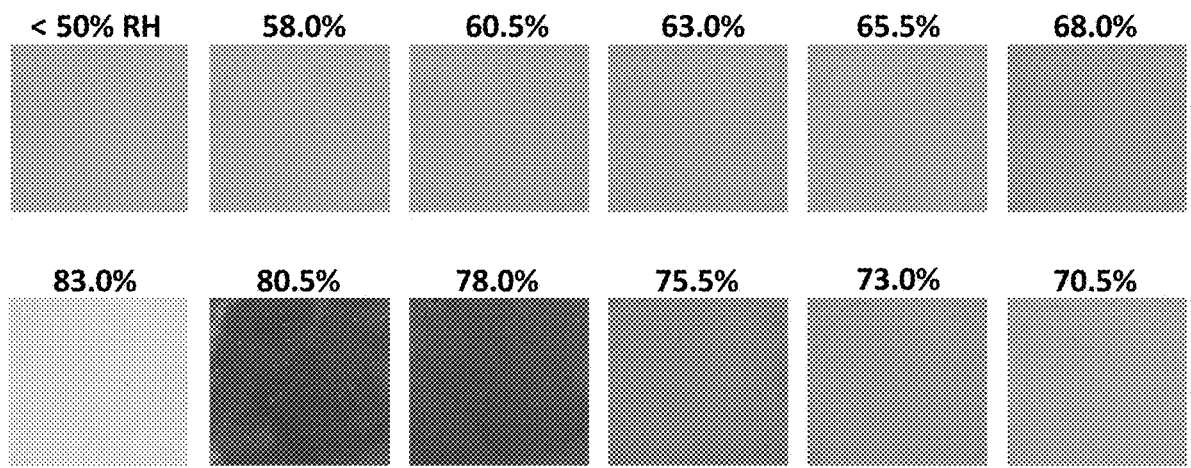

FIG. 17 illustrates photographs of a hygrochromic perovskite films prepared from 4:1 $FAI:PbI_2$ exposed to varying RH levels, according to some embodiments of the present disclosure.

Figure 18:
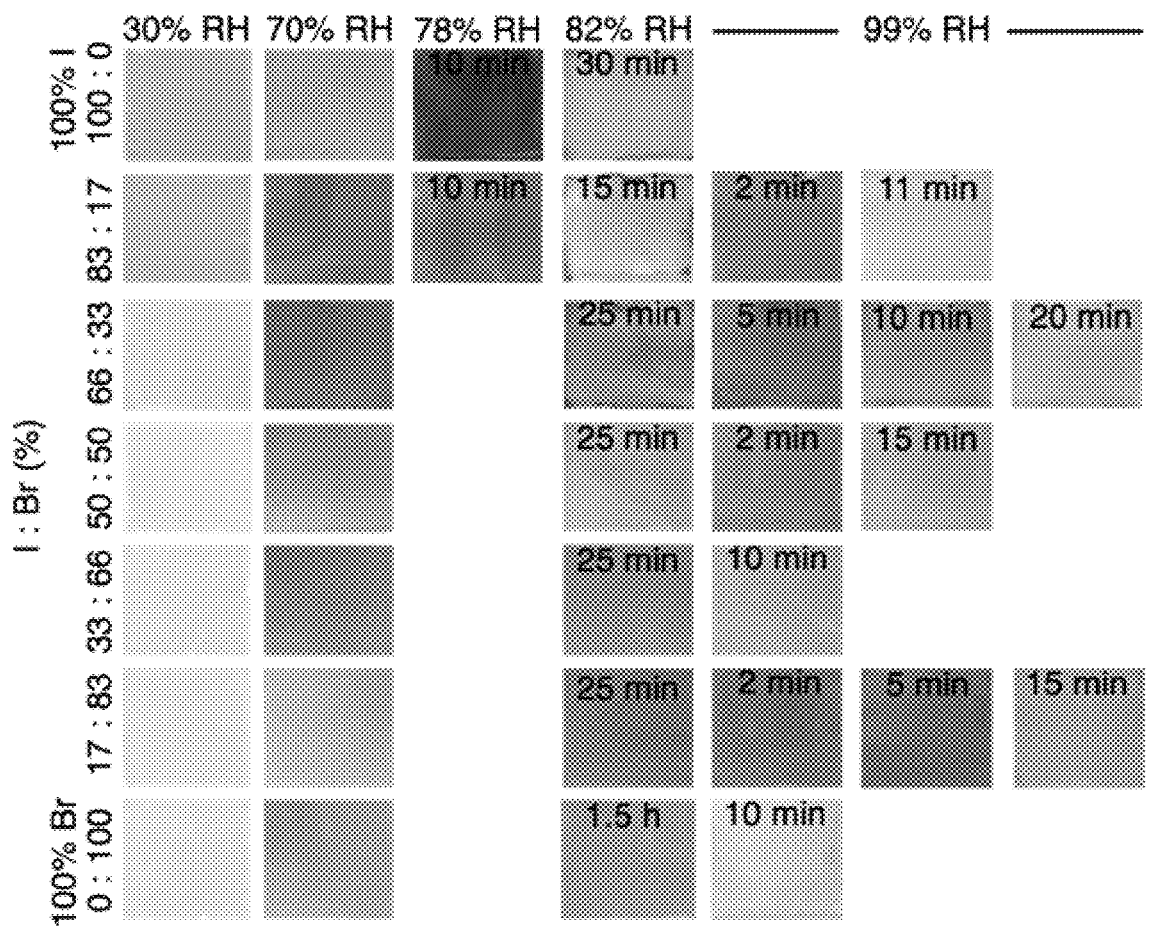

FIG. 18 illustrates the variety of colors achieved by chromic layered FA-based metal halide perovskite films prepared from 4:1 $FAX:PbX_2$ (4 FA:1 Pb:6 × mole ratios; X=I, Br) in DMSO (i.e. additive) when exposed to varying RH levels, according to some embodiments of the present disclosure.

Figure 19A:
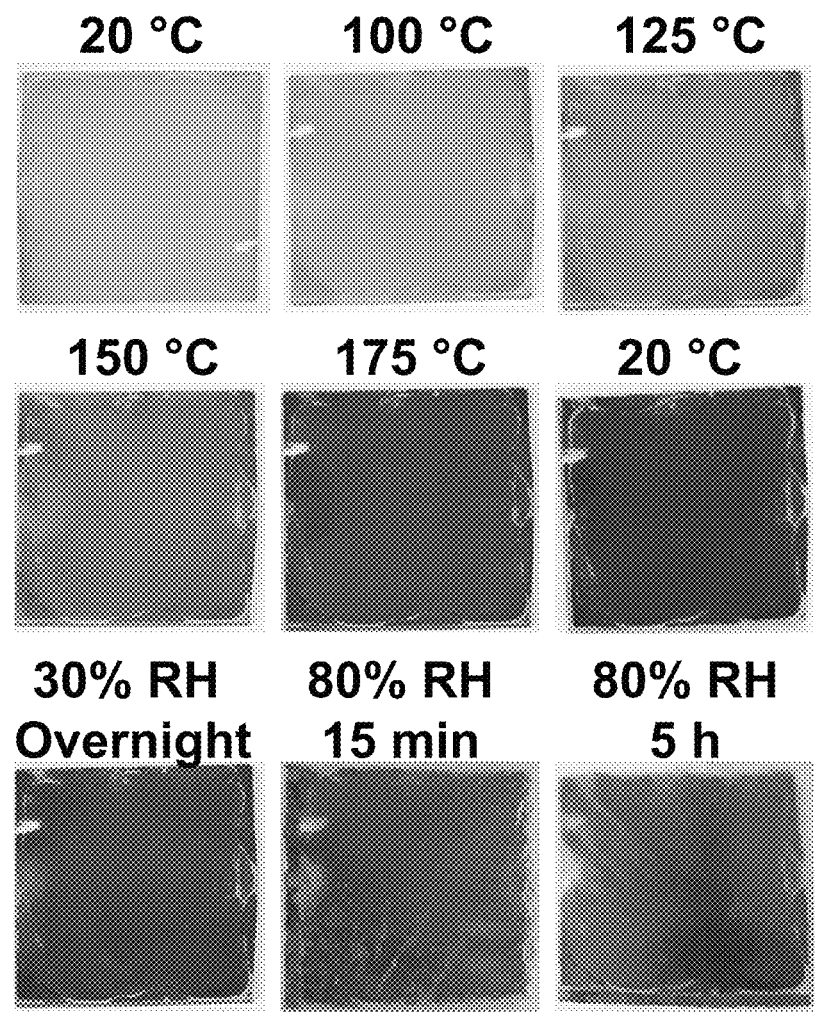
Figure 19B:
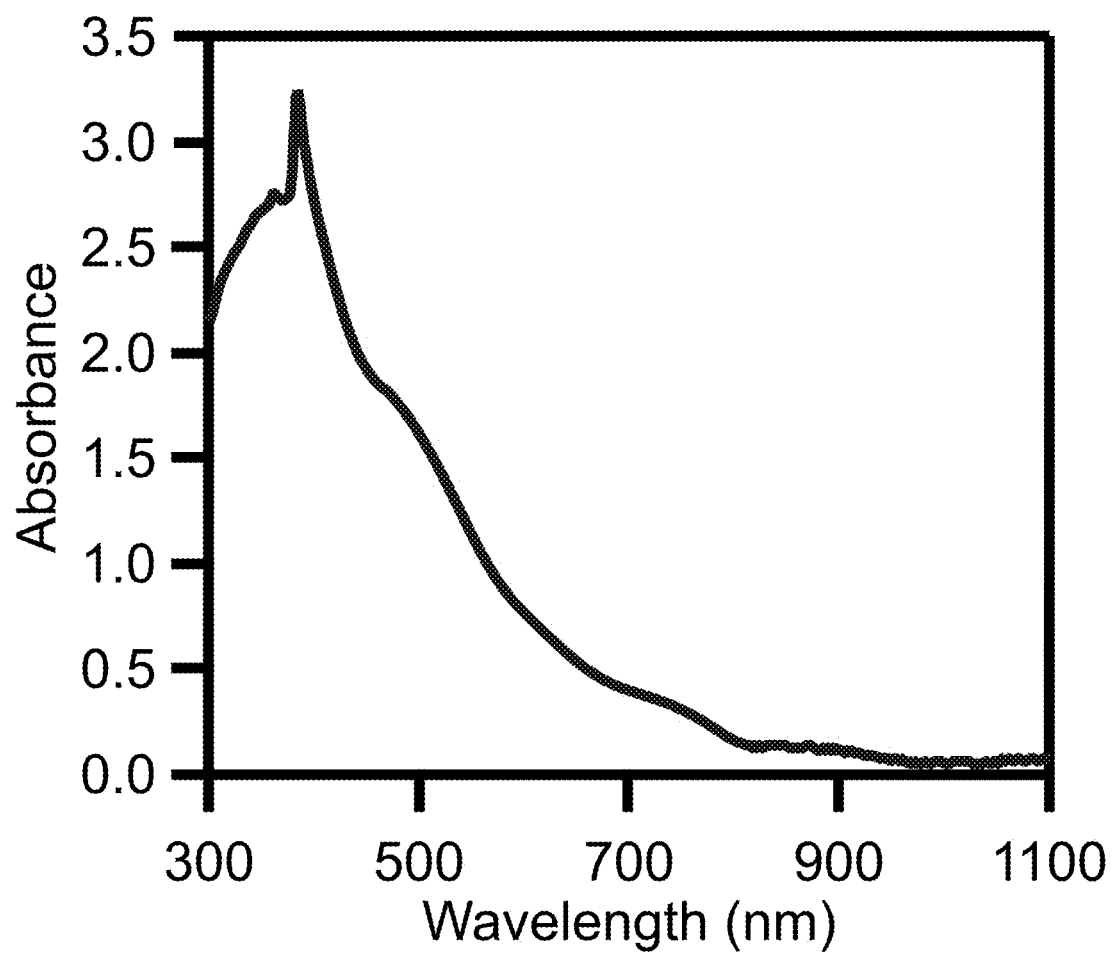

FIG. 19A illustrates photographs of a 4:1 $FAI:PbI_2$ perovskite film annealed at higher temperatures and exposed to 80% static RH (no flow, jar of saturated salt solution); and FIG. 19B absorbance of film after heating at 175° C. followed by cooling to 20° C., according to some embodiments of the present disclosure.

Figure 20A:
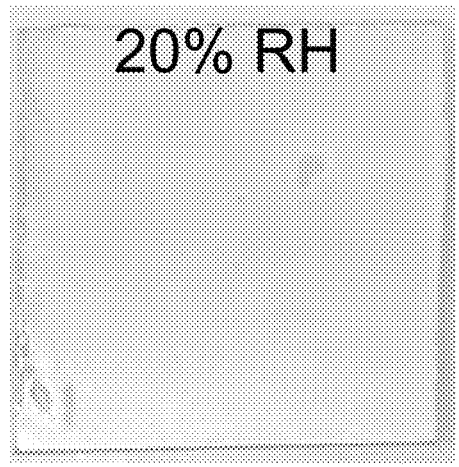
Figure 20A:
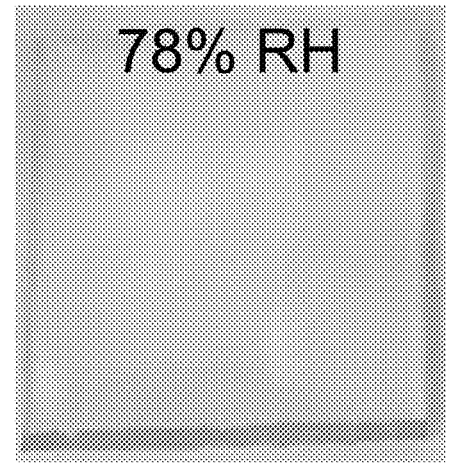
Figure 20A:
Figure 20A:
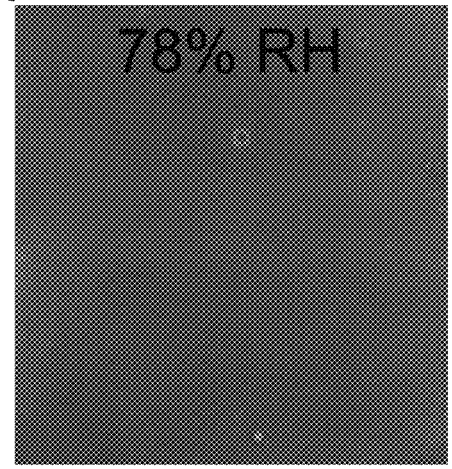
Figure 20B:
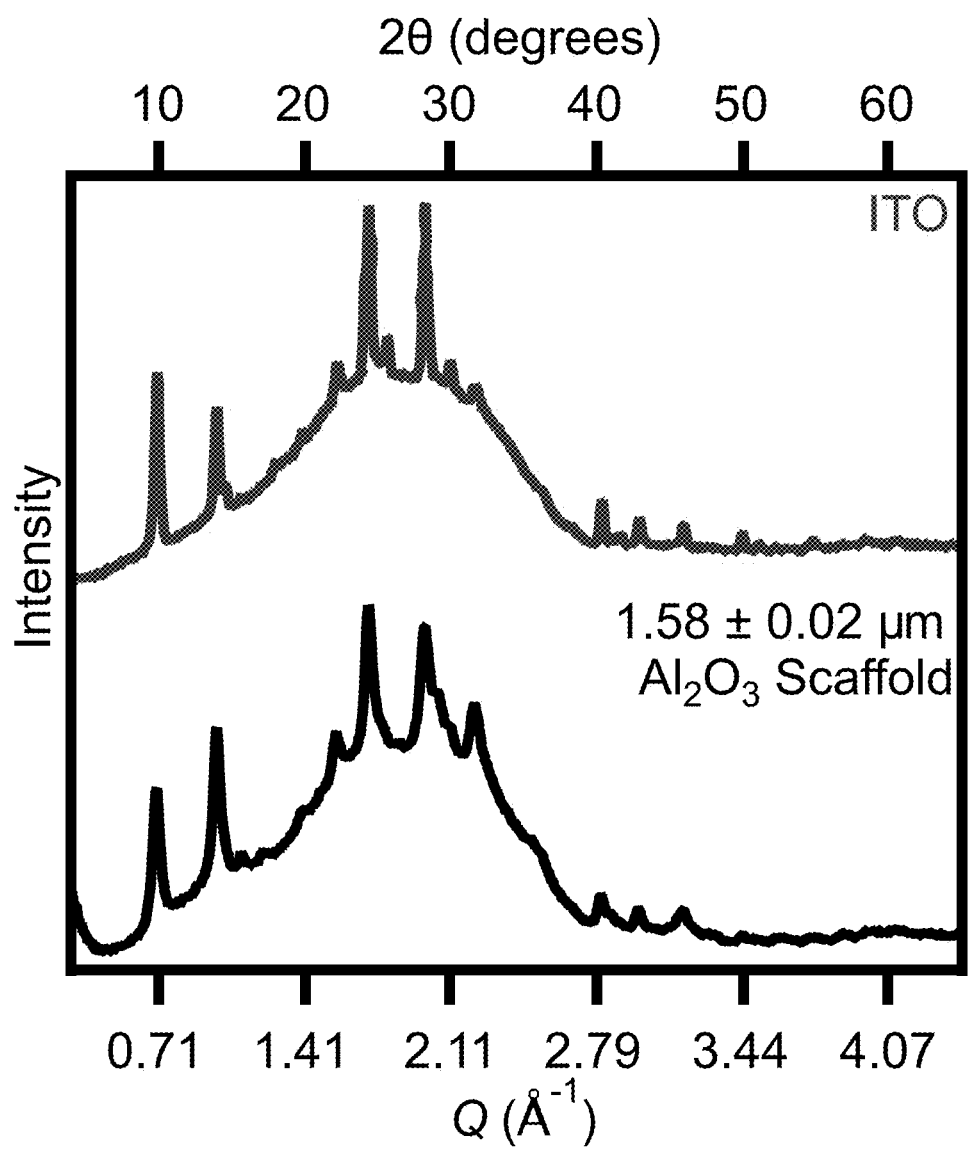

FIG. 20A illustrates photographs showing no hygrochromic behavior when 4:1 $FAI:PbI_2$ perovskite films were prepared on ITO and hygrochromic behavior when prepared on a 1.58±0.2 μm $Al_2O_3$ scaffold; and FIG. 20B XRD comparison of 4:1 $FAI:PbI_2$ films prepared on both substrates, according to some embodiments of the present disclosure.

Figure 21A:
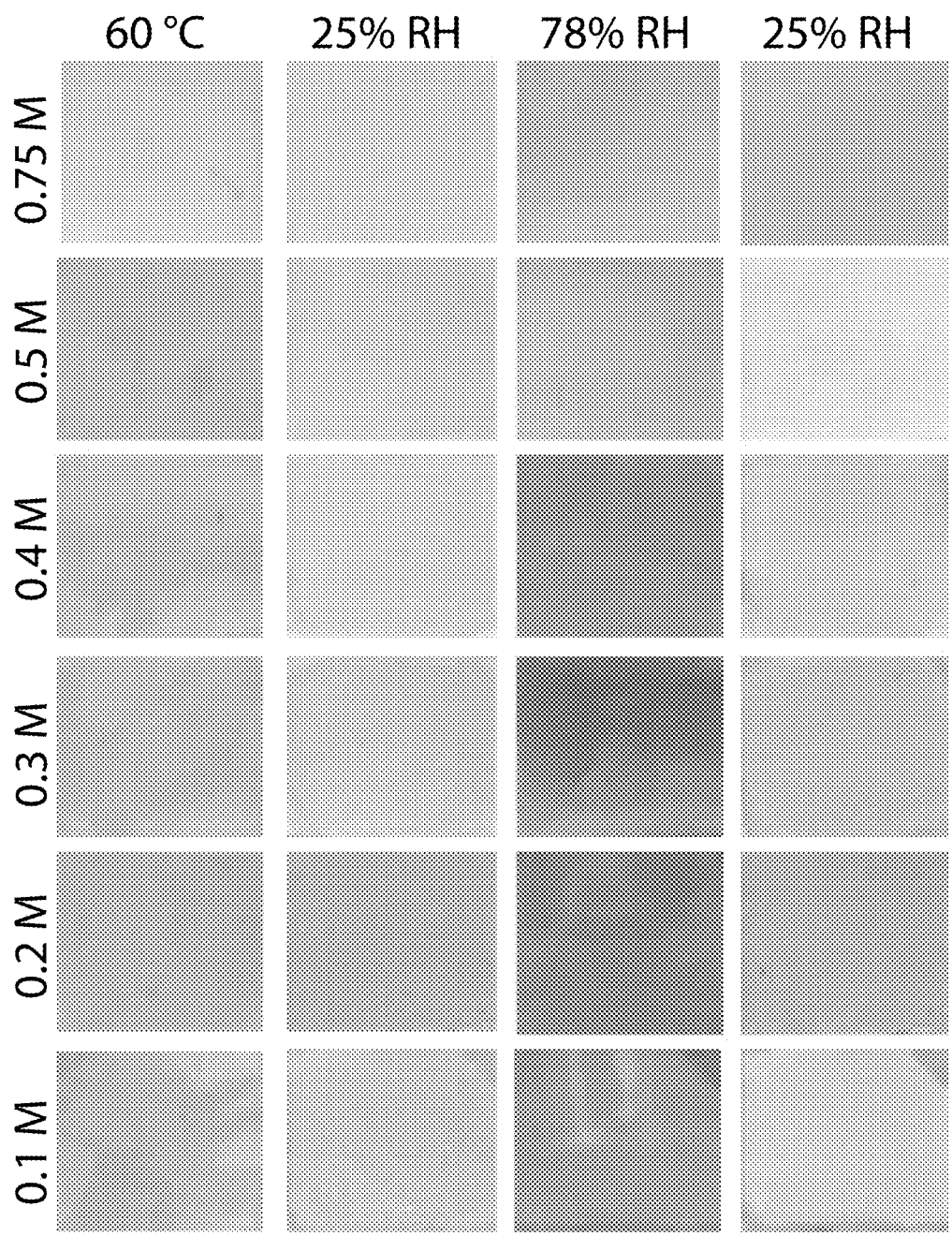
Figure 21B:
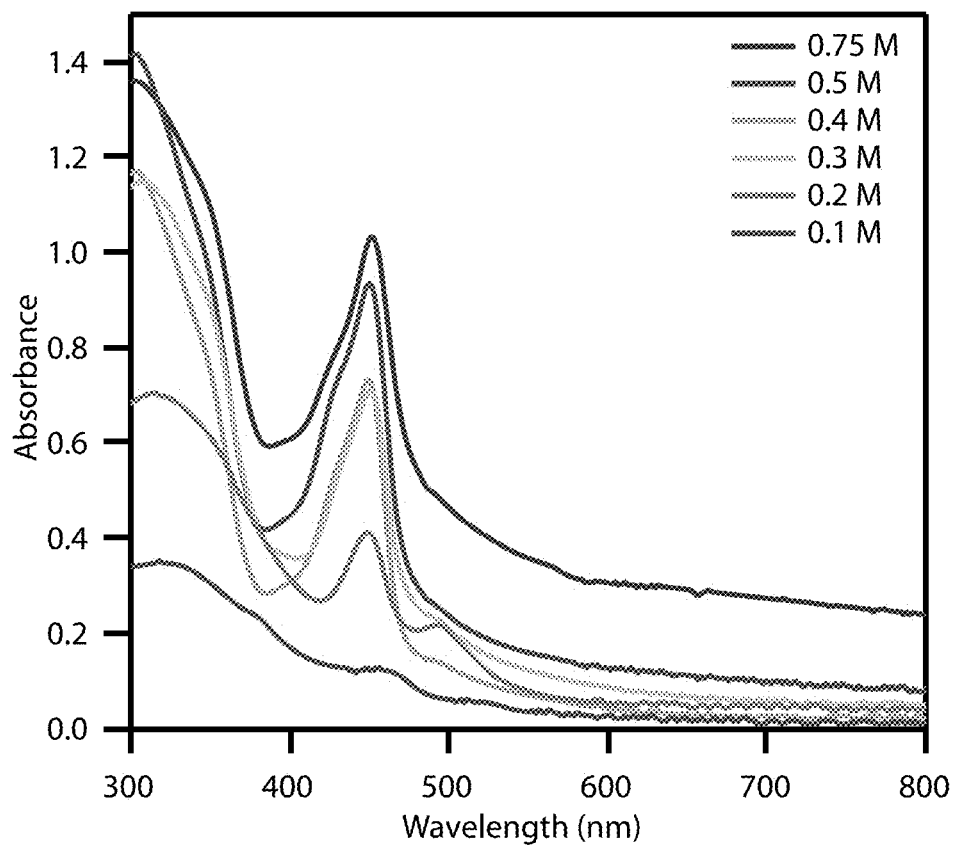

FIG. 21A photographs showing the influence of 4:1 $FAI:PbI_2$ perovskite precursor concentration on the hygrochromic switching behavior when a 326±22 nm thick $Al_2O_3$ scaffold was used; hygrochromic properties were only observed at perovskite precursor concentrations between about 0.3 M and about 0.4 M; the perovskite precursor concentration should be matched with a specific scaffold thickness for hygrochromic properties to occur; and FIG. 21B absorbance data collected of as-prepared perovskite films exposed to 25% RH, according to some embodiments of the present disclosure.

Figure 22:
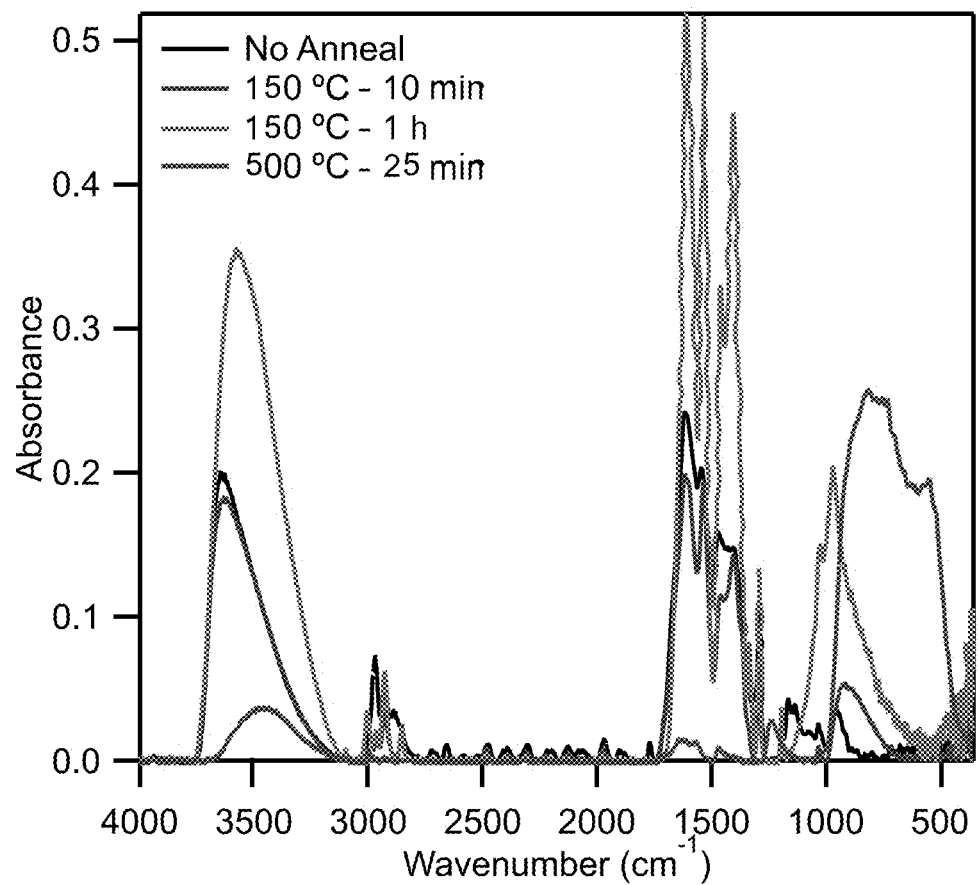

FIG. 22 illustrates diffuse-reflectance infrared Fourier transform spectroscopy (DRIFTS) collected of $Al_2O_3$ scaffolds annealed at various temperatures, according to some embodiments of the present disclosure. Upon annealing to 500° C., all hydrophobic ligands were burned off and the surface is hydroxyl-terminated.

Figure 23:
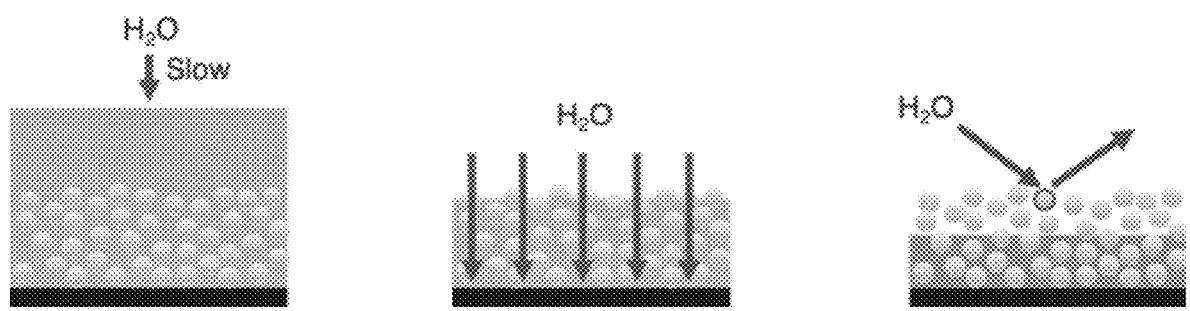

FIG. 23 illustrates a cartoon of an overfilled, sufficiently filled (target), and underfilled $Al_2O_3$ NP scaffold (from left to right), according to some embodiments of the present disclosure.

Figure 24A:
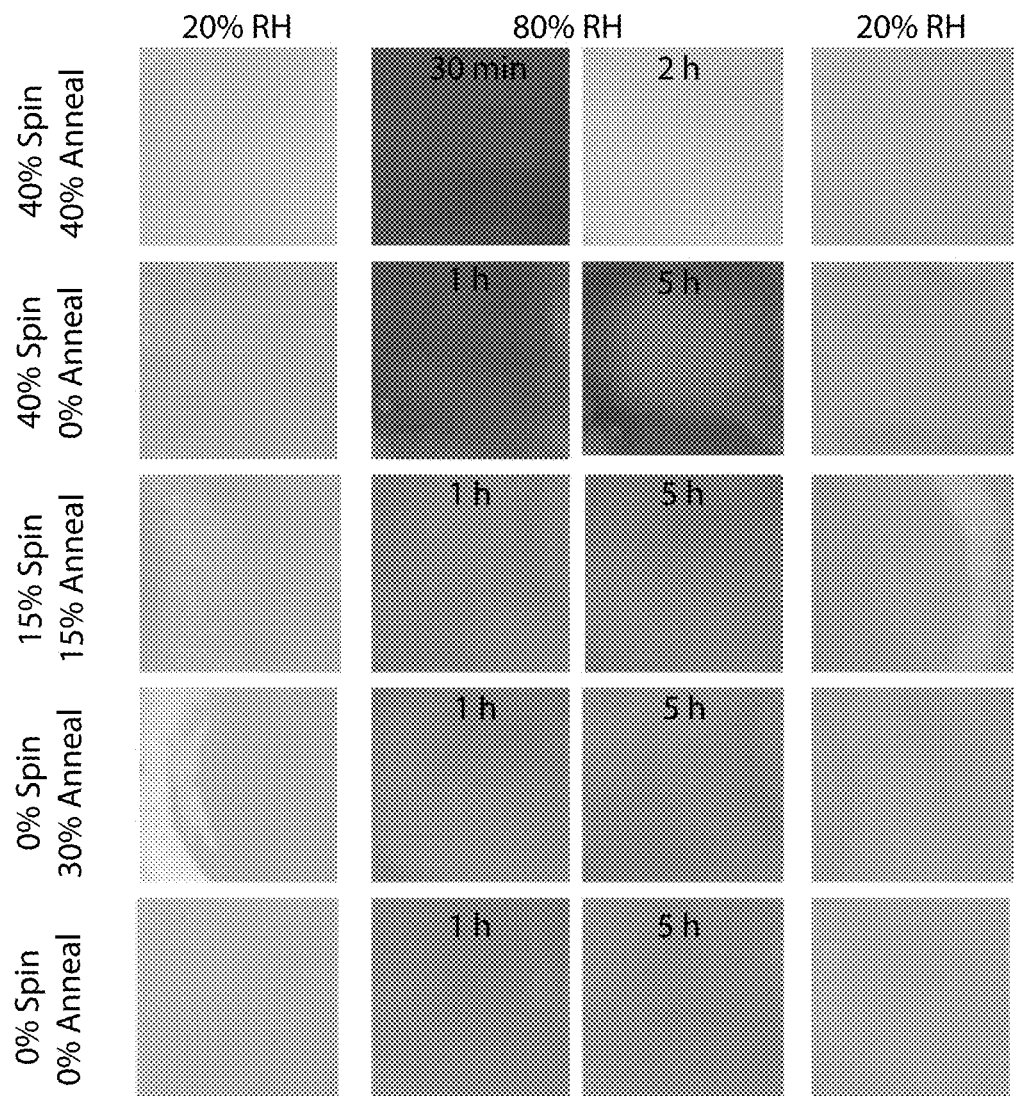

FIG. 24A illustrates photographs of 4:1 $FAI:PbI_2$ perovskite films prepared by various methods and then exposed to 80% static RH (no flow, jar of saturated salt solution) for various times, according to some embodiments of the present disclosure.

Figure 24B:
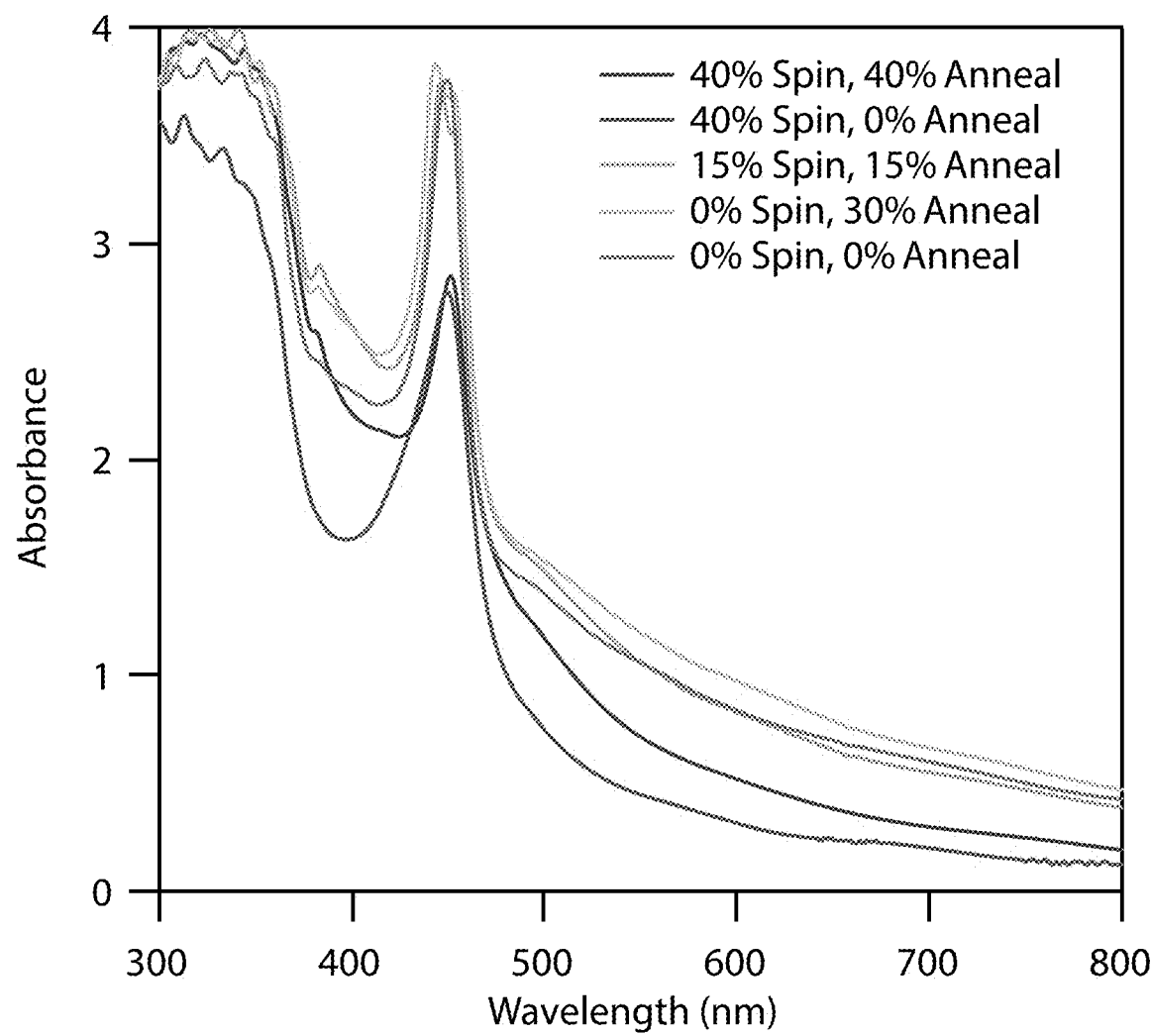

FIG. 24B illustrates absorbance data of 4:1 $FAI:PbI_2$ perovskite films prepared by various methods and then exposed to 80% static RH (no flow, jar of saturated salt solution) for various times, according to some embodiments of the present disclosure.

Figure 24C:
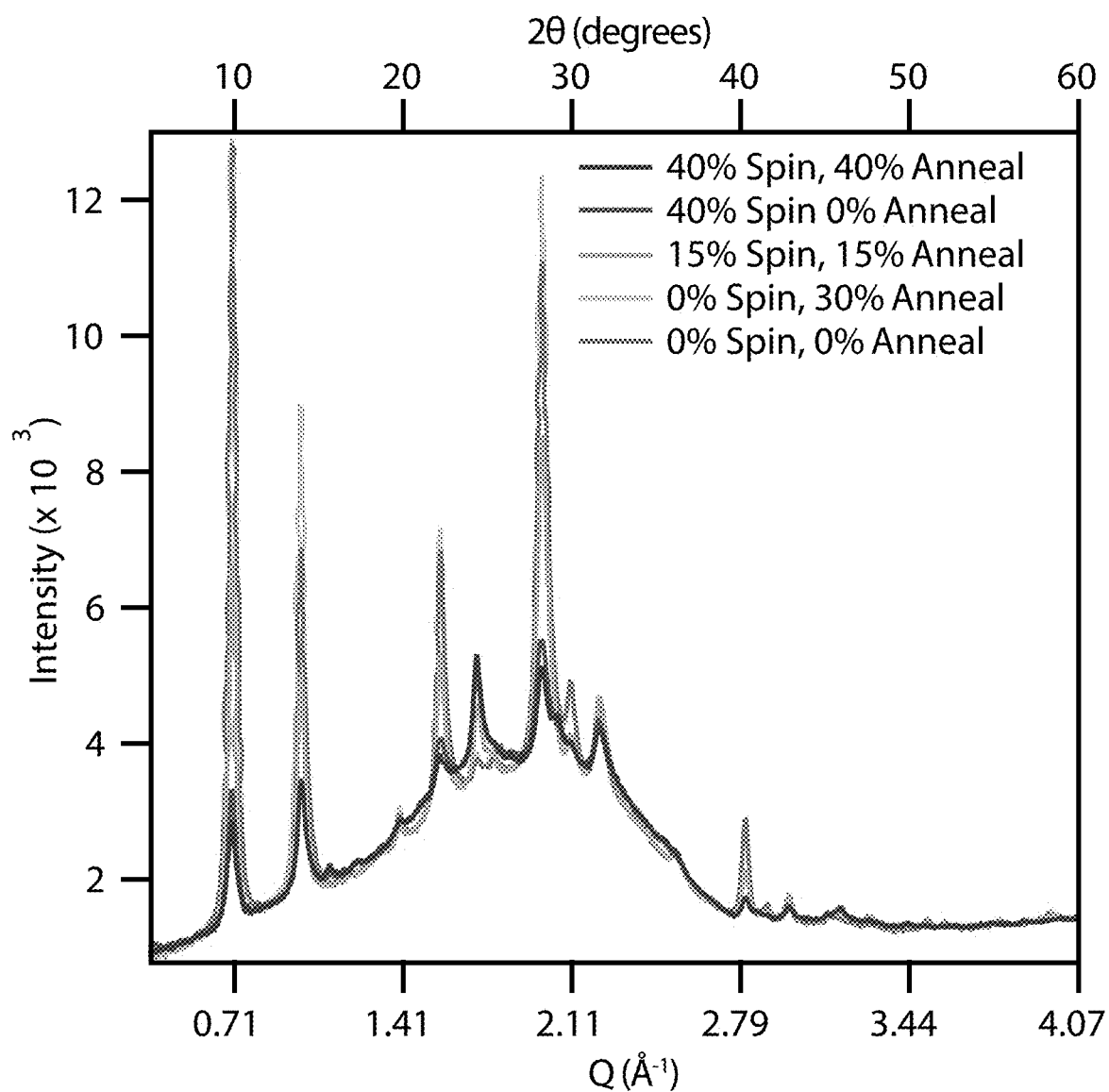

FIG. 24C illustrates XRD data of 4:1 $FAI:PbI_2$ perovskite films prepared by various methods and then exposed to 80% static RH (no flow, jar of saturated salt solution) for various times, according to some embodiments of the present disclosure.

Figure 24D:
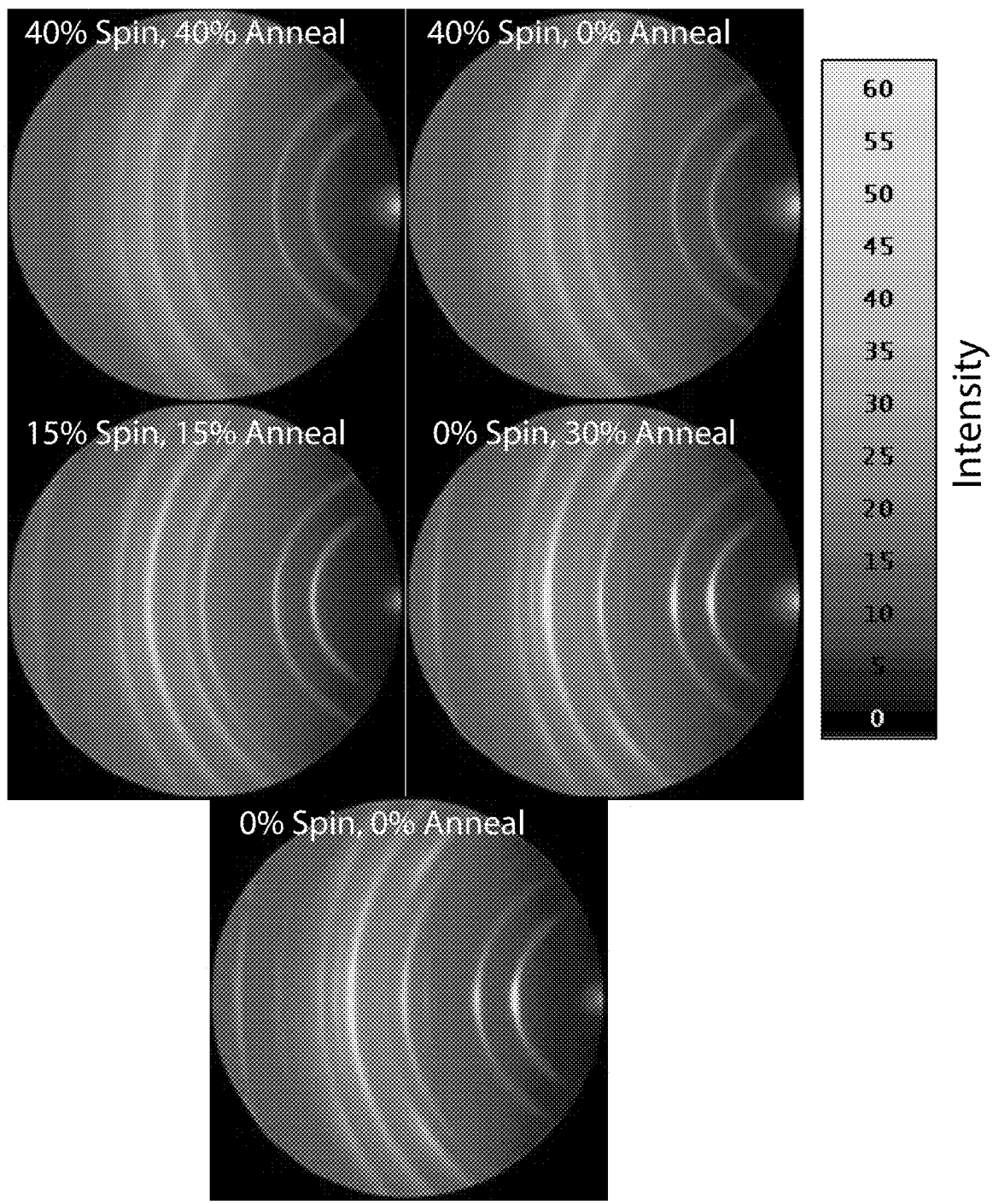

FIG. 24D illustrates 2D XRD images of 4:1 $FAI:PbI_2$ perovskite films prepared by various methods and then exposed to 80% static RH (no flow, jar of saturated salt solution) for various times, according to some embodiments of the present disclosure.

Figure 25A:
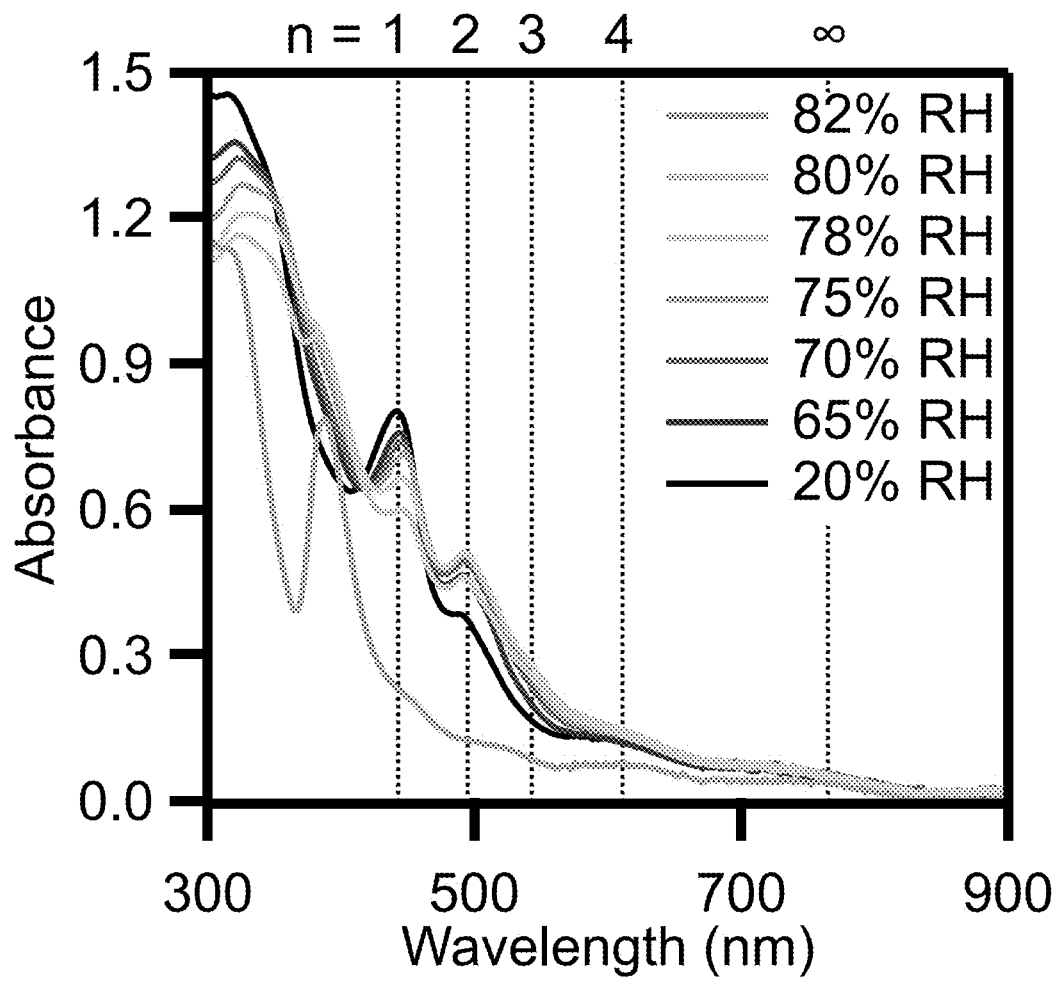

FIG. 25A illustrates absorbance data of hygrochromic perovskite films collected at various RH, according to some embodiments of the present disclosure.

Figure 25B:
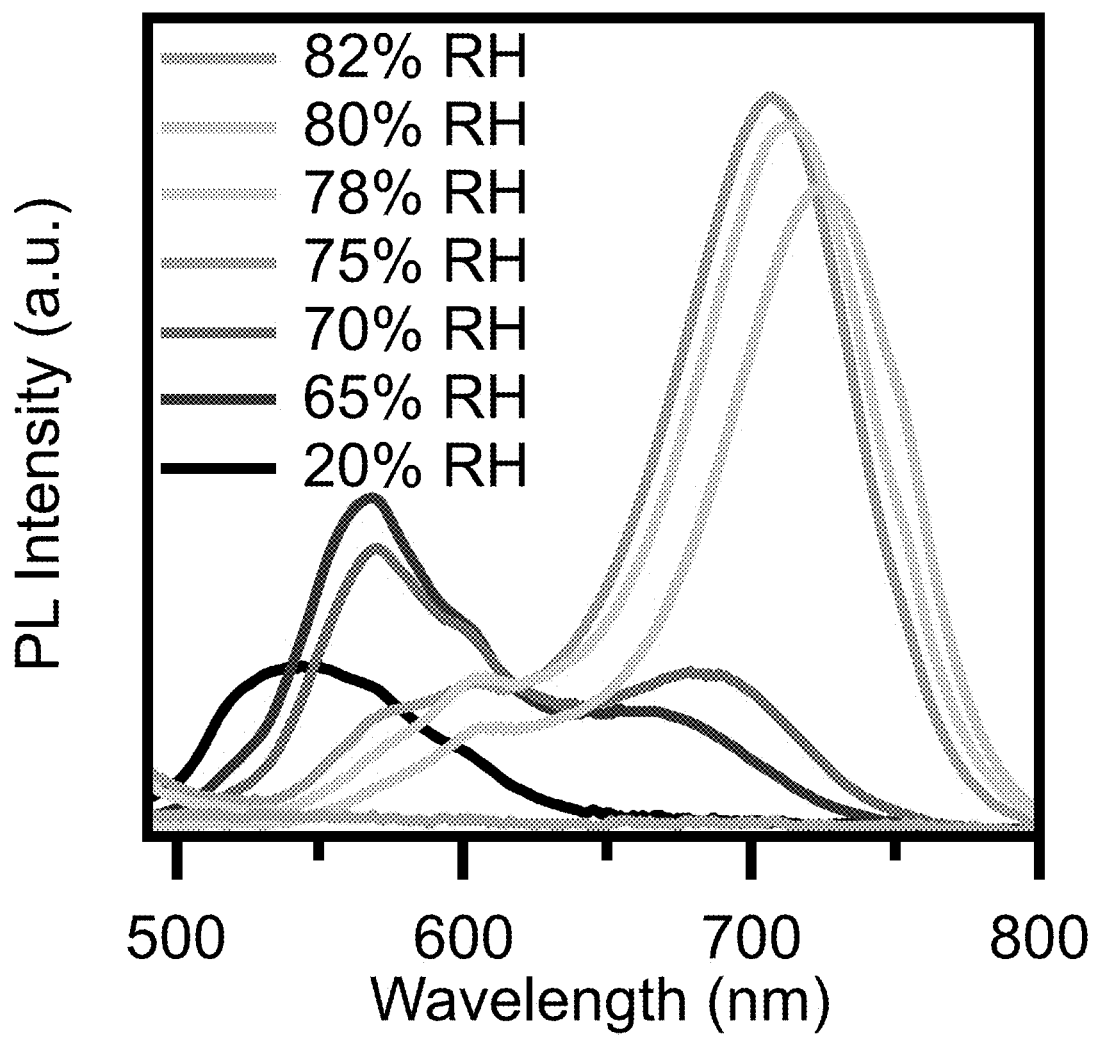

FIG. 25B illustrates PL data of hygrochromic perovskite films collected at various RH where each PL exhibits multiple peaks due to a mixture of 'n' layers, according to some embodiments of the present disclosure.

Figure 25C:
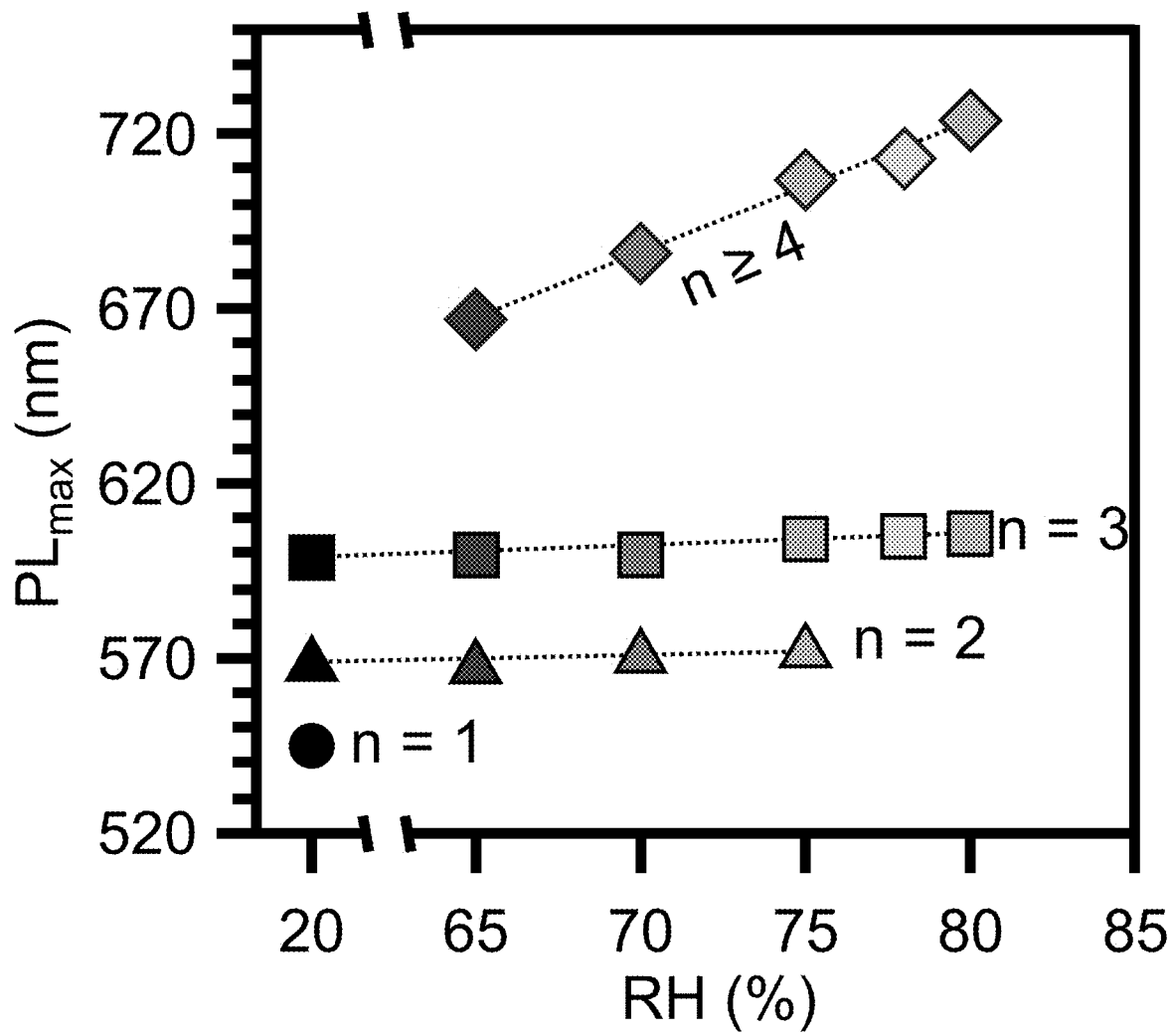

FIG. 25C illustrates a plot of each $PL_{max}$ location as a function of RH, according to some embodiments of the present disclosure.

Figure 26A:
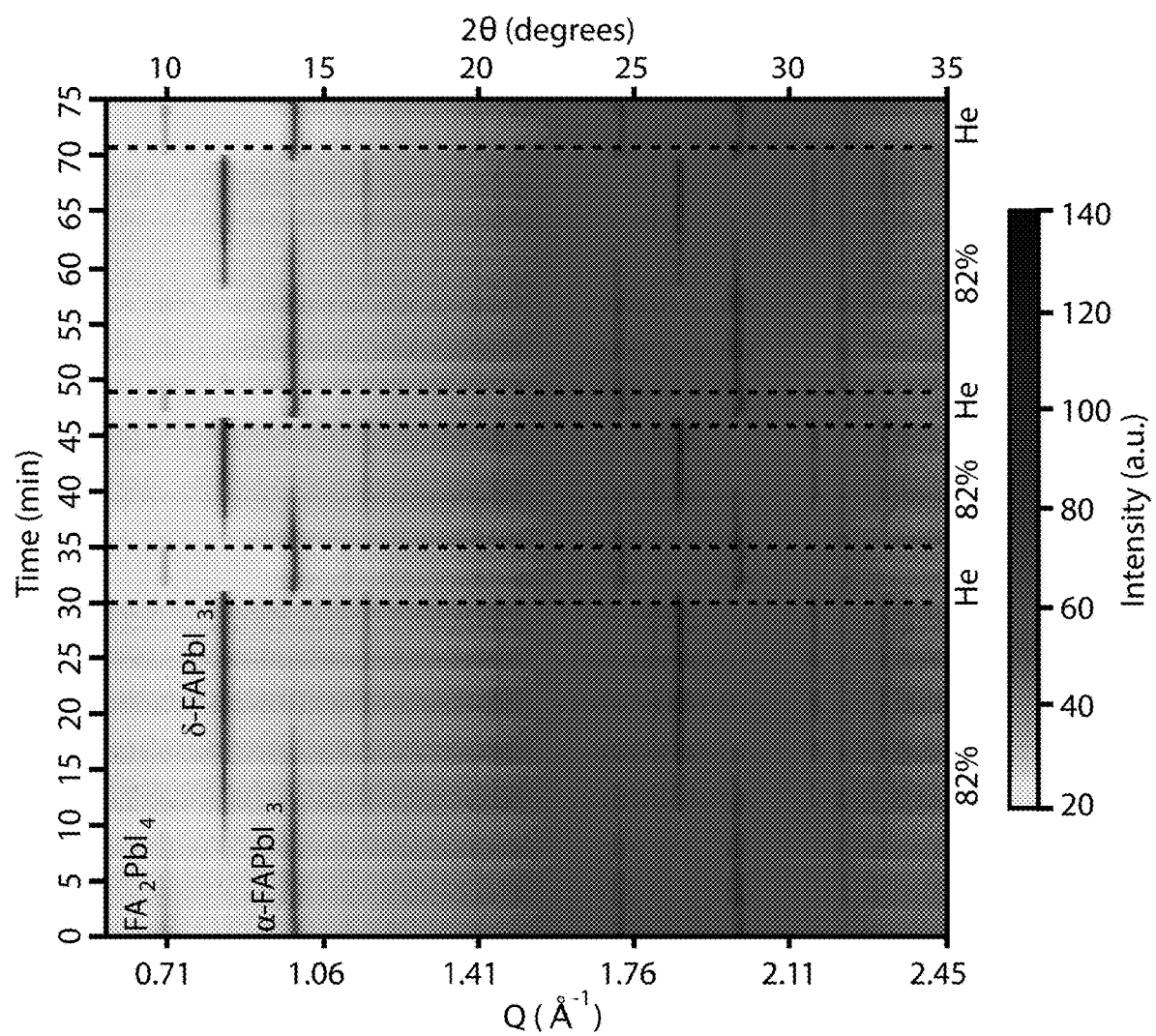

FIG. 26A synchrotron XRD data collected over three cycles of alternating exposure to 82% RH and He flow, according to some embodiments of the present disclosure.

Figure 26B:
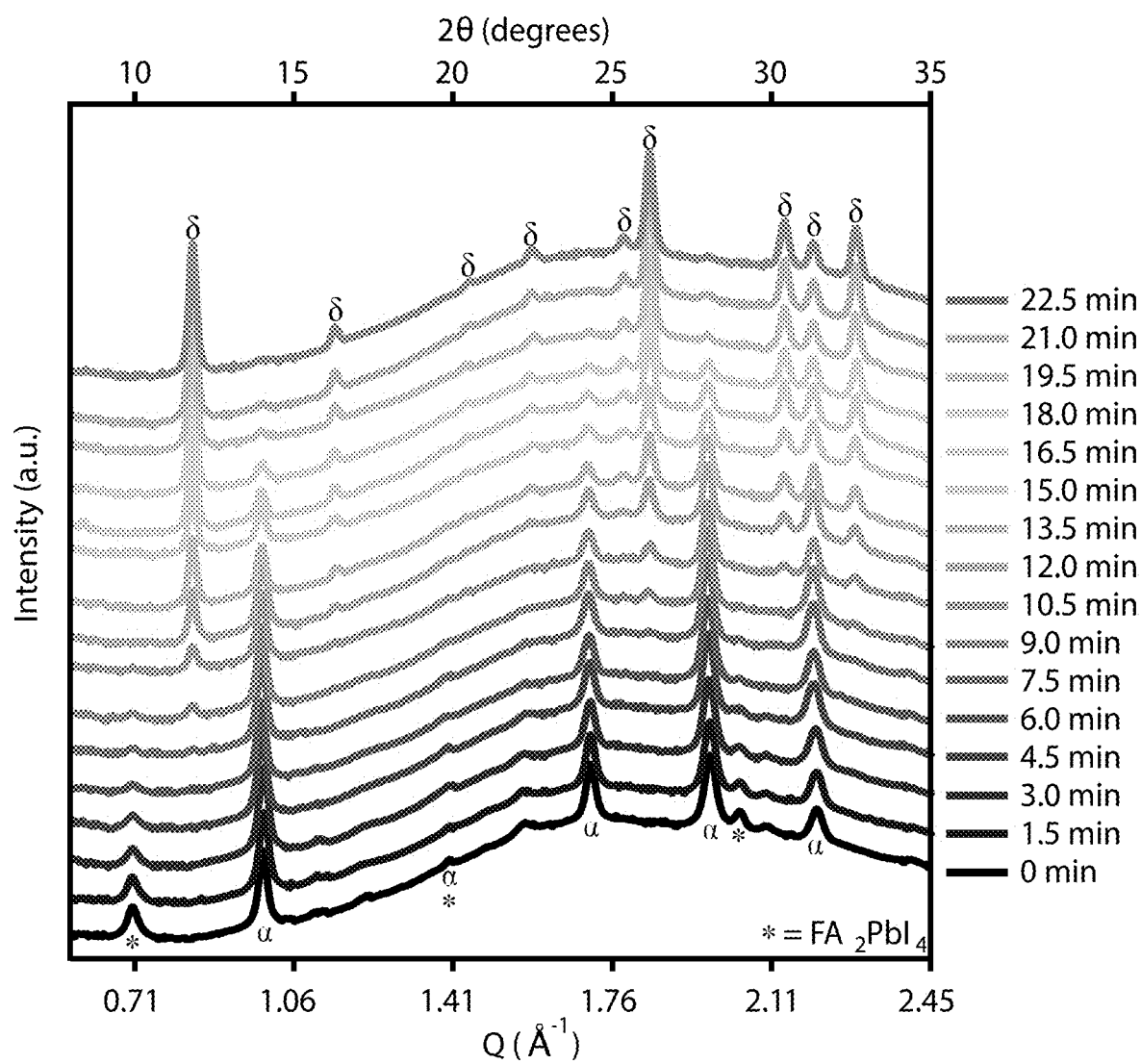

FIG. 26B illustrates XRD data extracted from FIG. 26A; note that the baseline was caused by the $Al_2O_3$ scaffold/glass substrate; zoom-in on the region corresponding to the (100) peak of α-$FAPbI_3$ of FIG. 26B, according to some embodiments of the present disclosure.

Figure 26C:
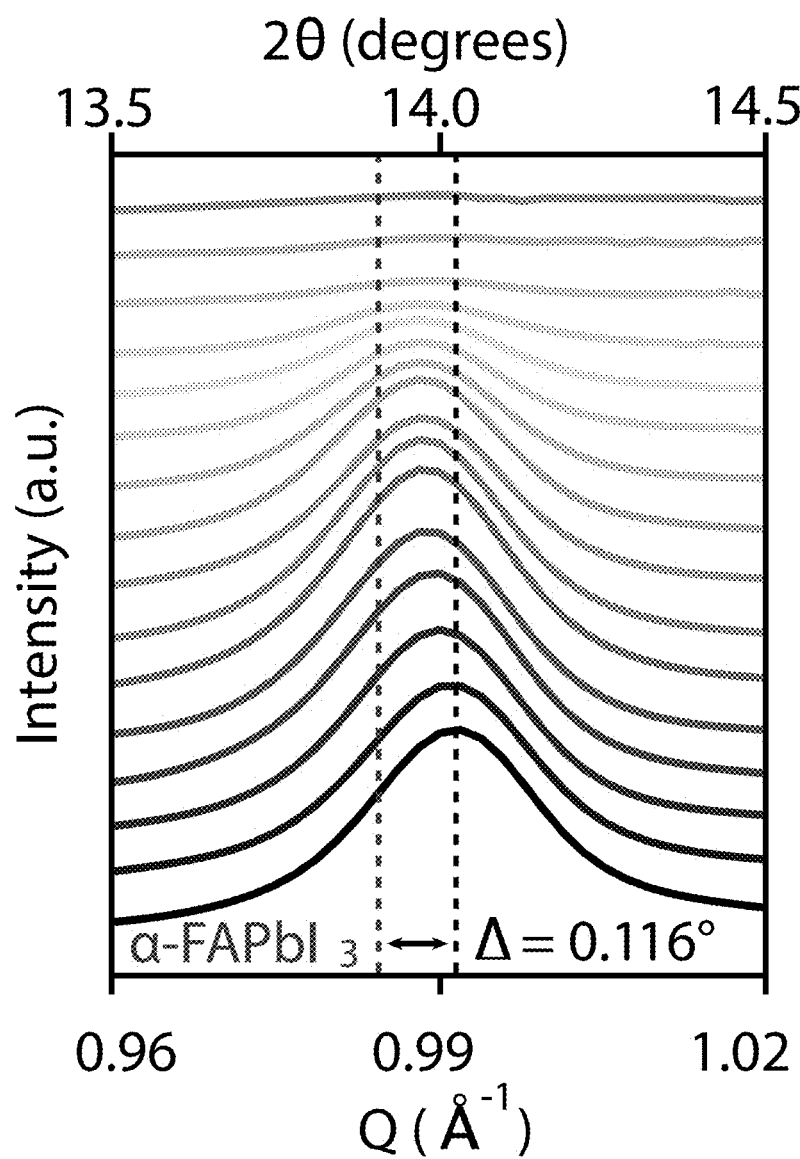
Figure 26D:
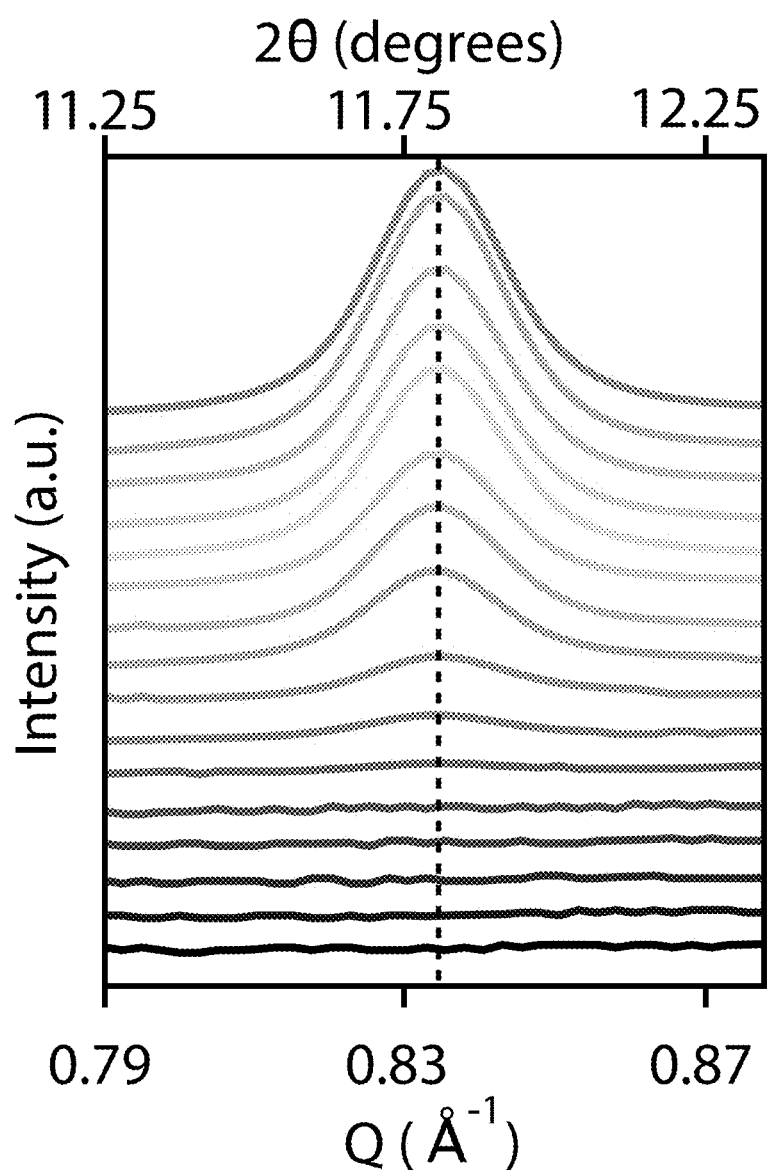

FIGS. 26C and 26D illustrates XRD data extracted from FIG. 26A; zoom-in on the region corresponding to the (100) peak of δ-$FAPbI_3$, according to some embodiments of the present disclosure.

Figure 27:
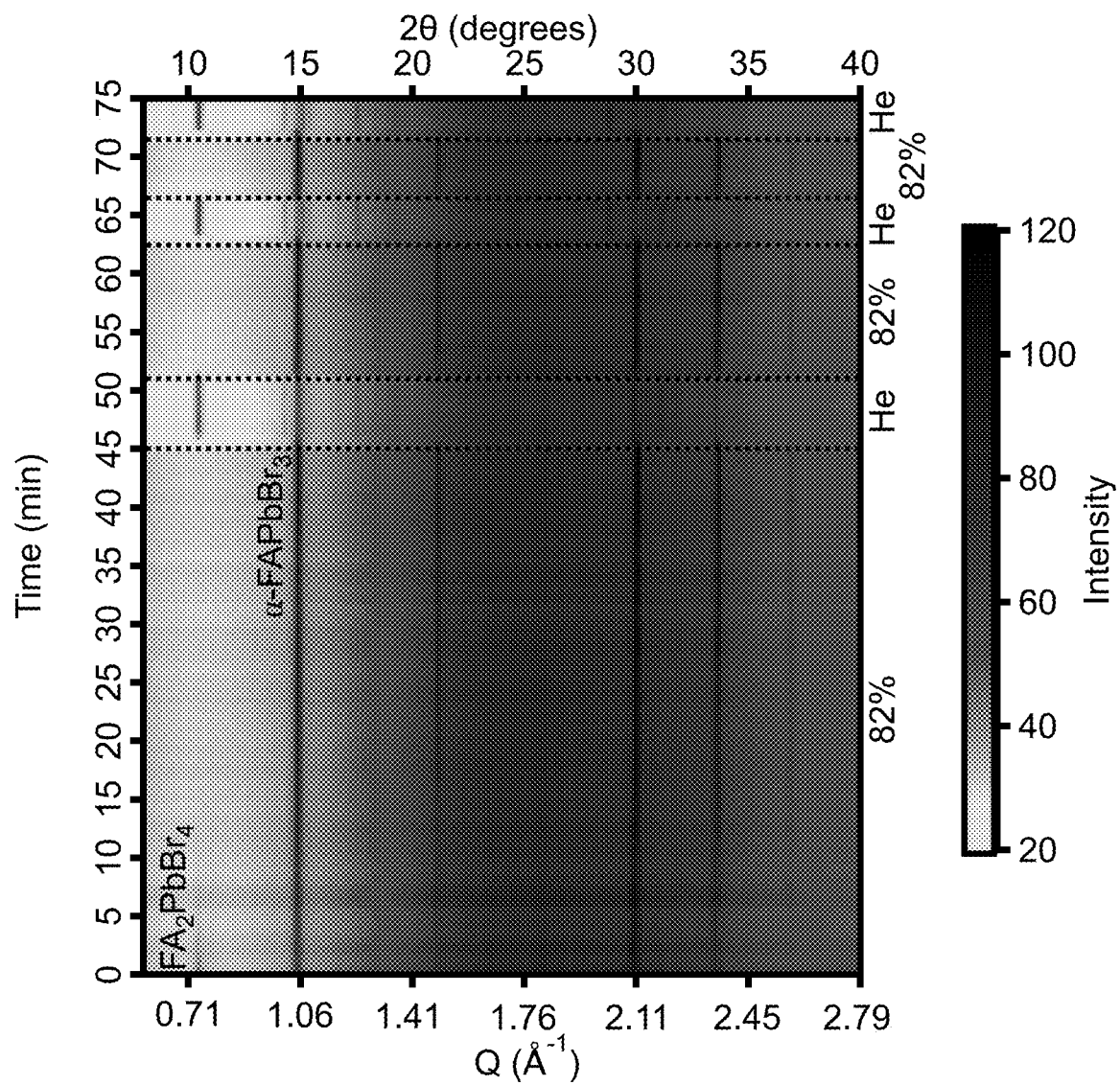

FIG. 27 illustrates synchrotron XRD data collected over three cycles of exposing a 4:1 $FABr:PbBr_2$ perovskite film to alternating 82% RH and He flow, according to some embodiments of the present disclosure.

Figure 28A:
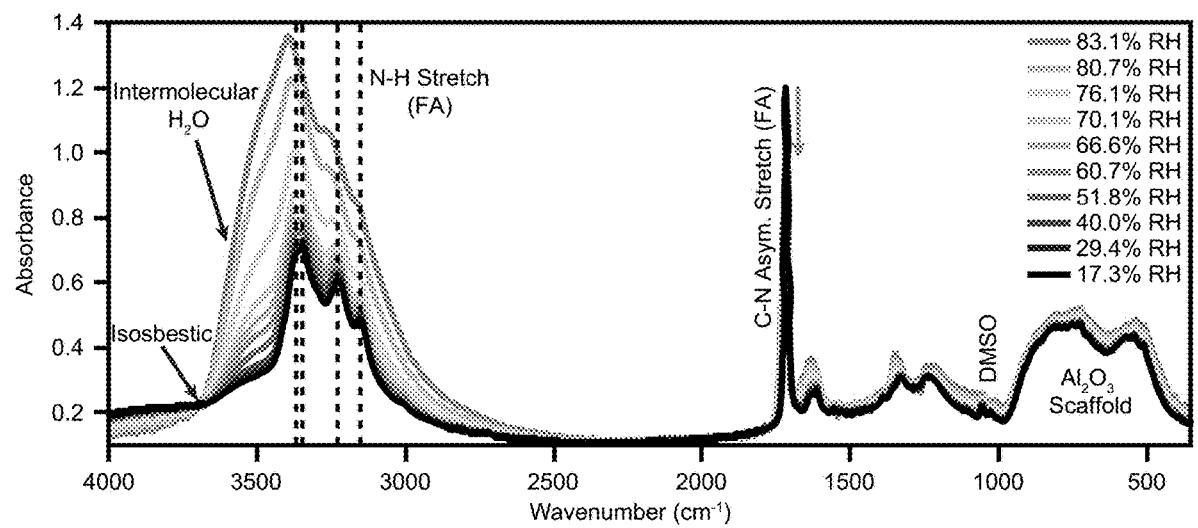

FIG. 28A illustrates diffuse-reflectance infrared Fourier-transform spectroscopy (DRIFTS) spectra collected at various RH, according to some embodiments of the present disclosure.

Figure 28B:
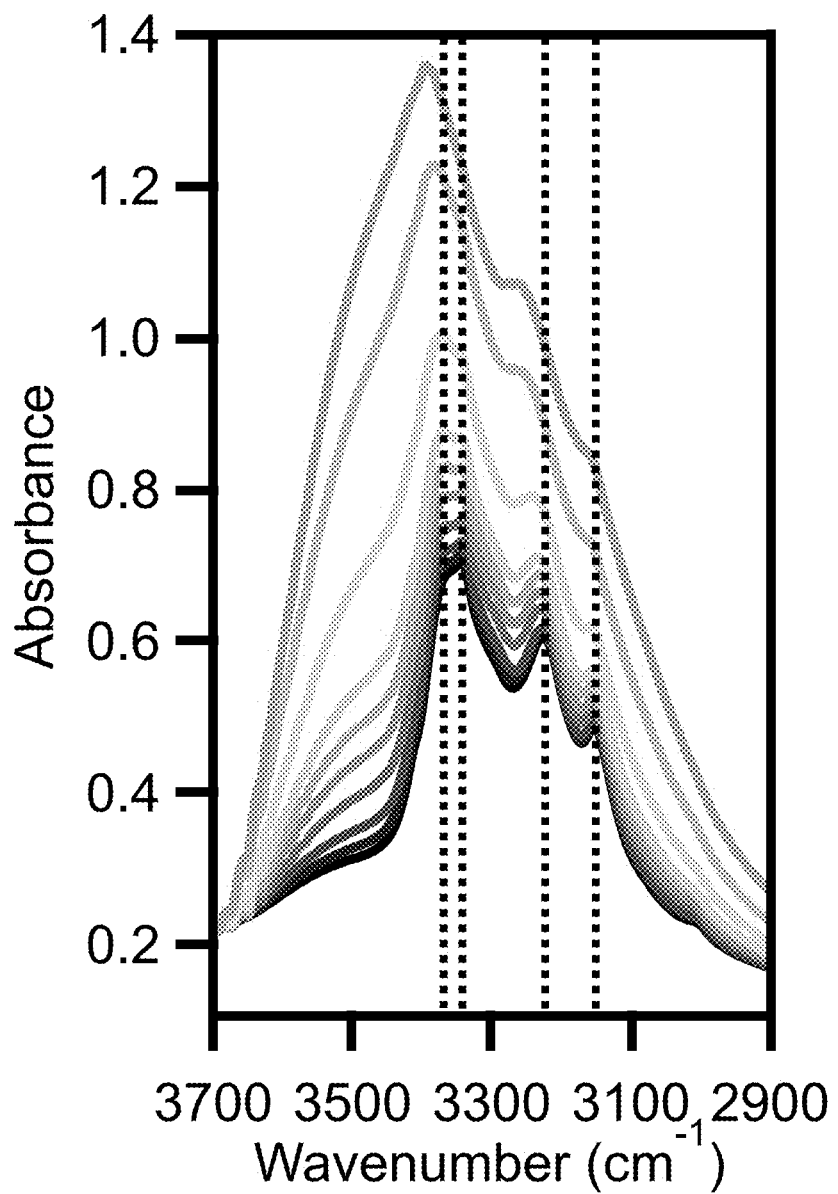

FIG. 28B illustrates diffuse-reflectance infrared Fourier-transform spectroscopy (DRIFTS) spectra collected at various RH, zoomed-in on the O—H and N—H stretch regions of $H_2O$ and FA, according to some embodiments of the present disclosure.

Figure 28C:
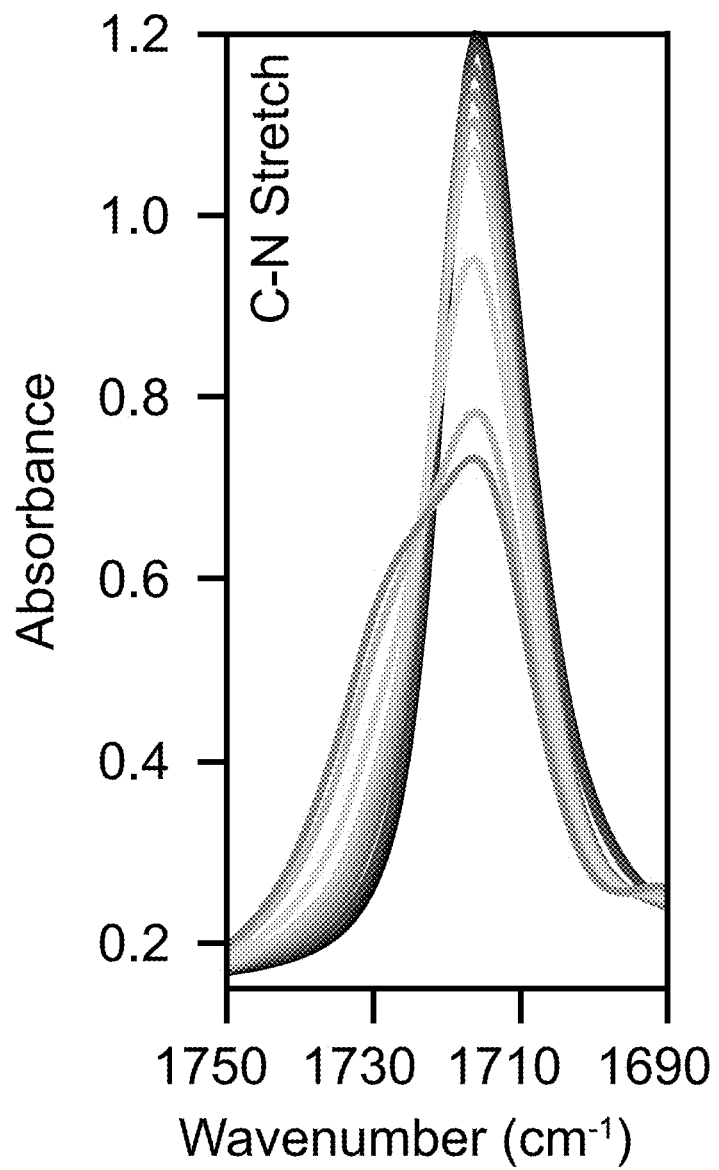

FIG. 28C illustrates diffuse-reflectance infrared Fourier-transform spectroscopy (DRIFTS) spectra collected at various RH zoomed-in on the C—N asymmetric stretch region of FA, according to some embodiments of the present disclosure.

Figure 28D:
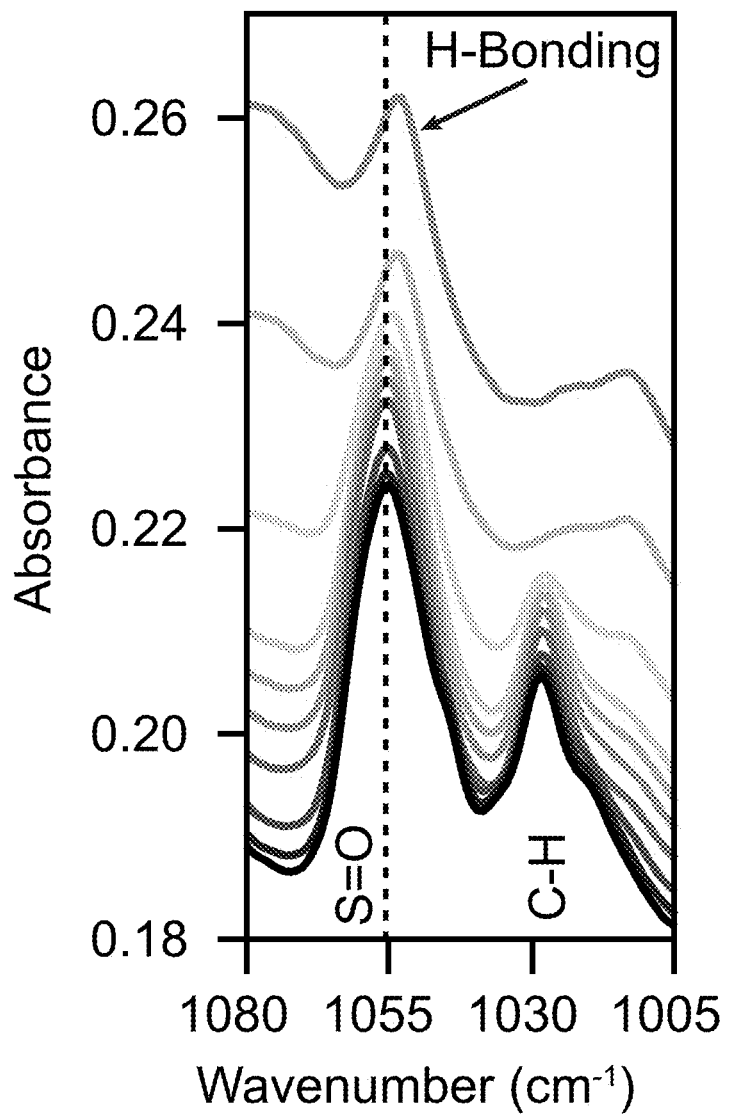

FIG. 28D illustrates diffuse-reflectance infrared Fourier-transform spectroscopy (DRIFTS) spectra collected at various RH zoomed-in on the S=O stretch and C—H rocking regions of DMSO, according to some embodiments of the present disclosure.

Figure 29A:
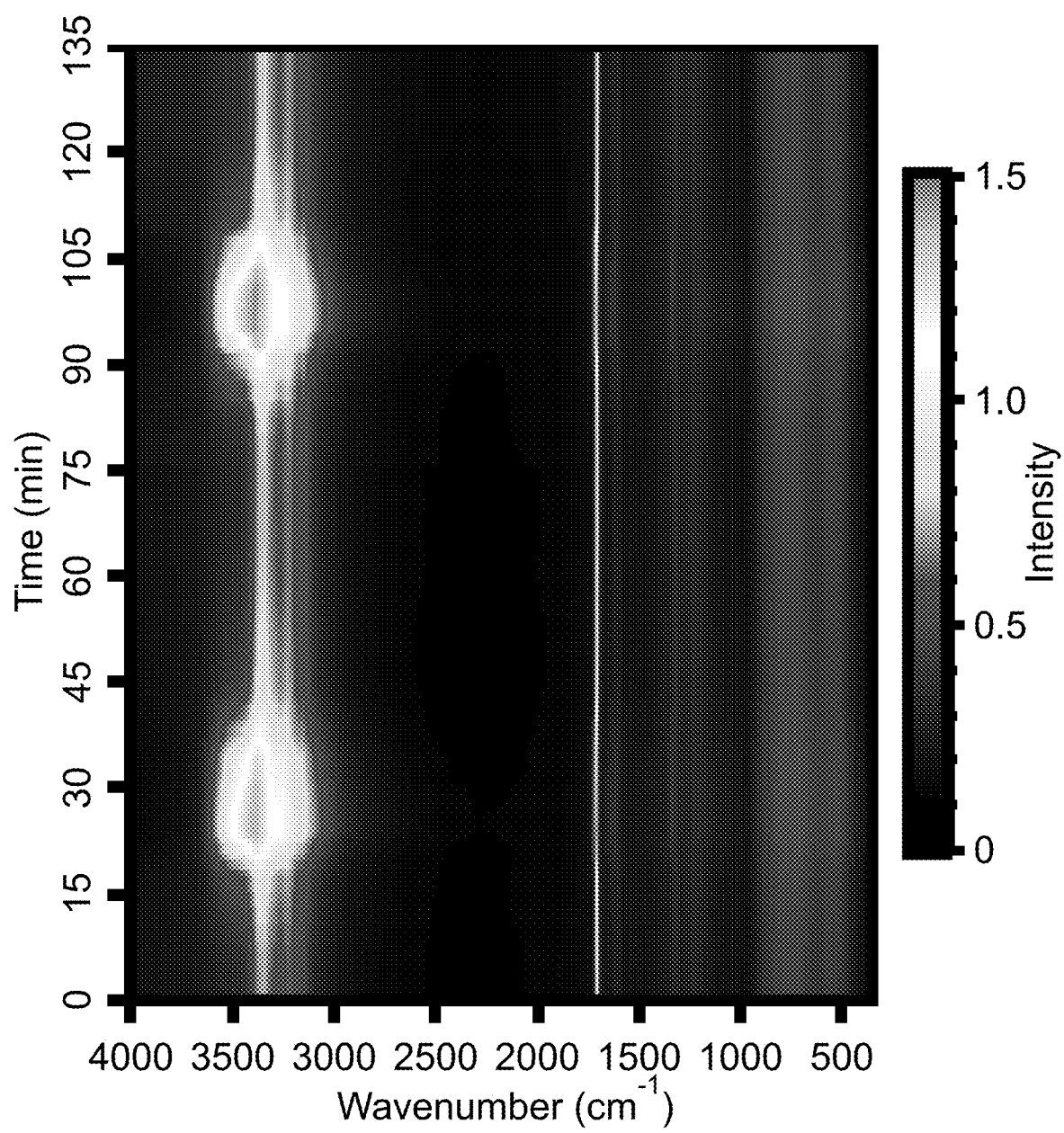

FIG. 29A illustrates diffuse-reflectance infrared Fourier-transform spectroscopy (DRIFTS) as the RH was varied as a function of time according to (b) increasing RH rate was 3.2±0.2%/min and decreasing RH rate was 1.9±0.3%/min, according to some embodiments of the present disclosure.

Figure 29B:
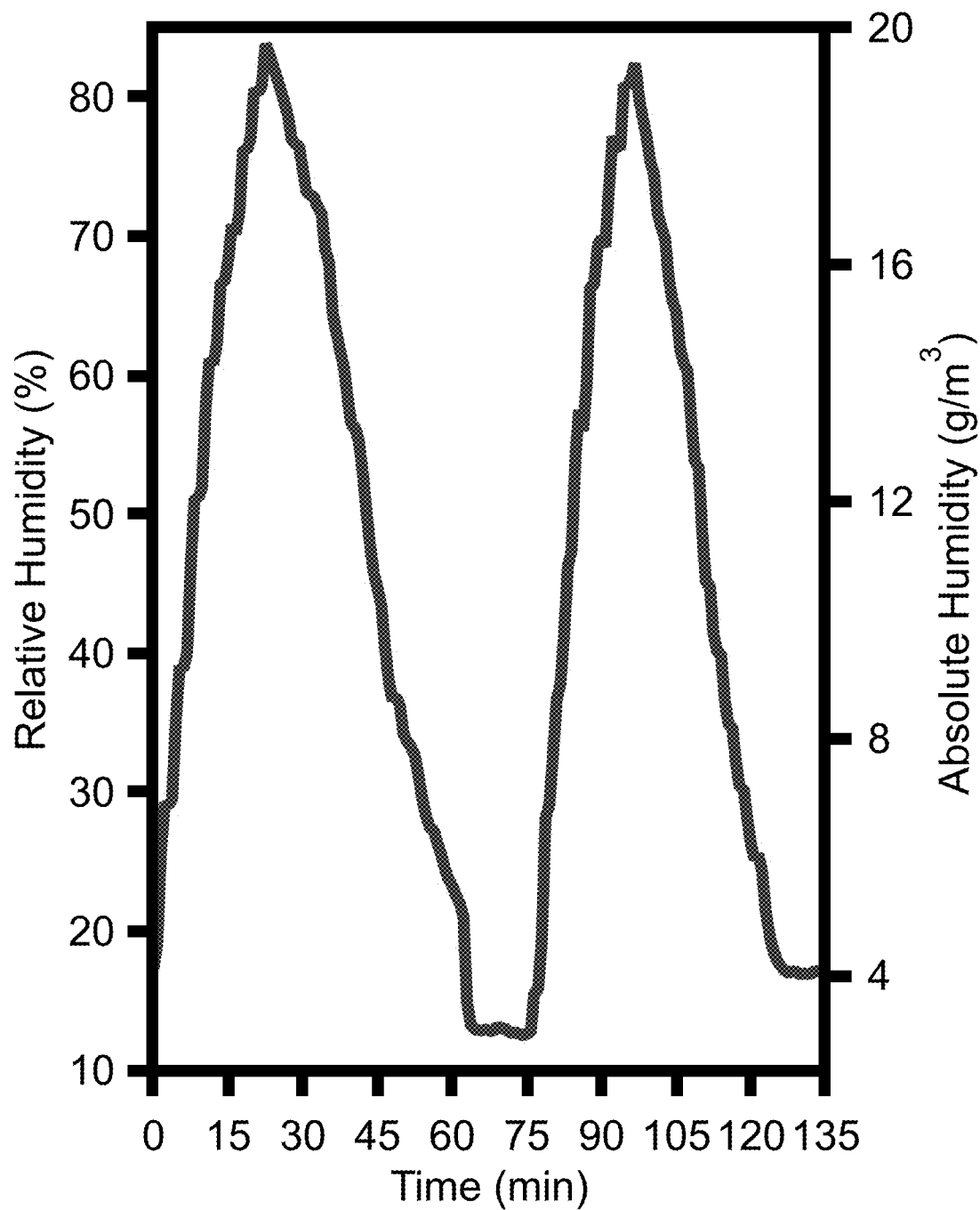

FIG. 29B illustrates diffuse-reflectance infrared Fourier-transform spectroscopy (DRIFTS) as the RH was varied as a function of time according to (b) increasing RH rate was 3.2±0.2%/min and decreasing RH rate was 1.9±0.3%/min, according to some embodiments of the present disclosure.

Figure 30:
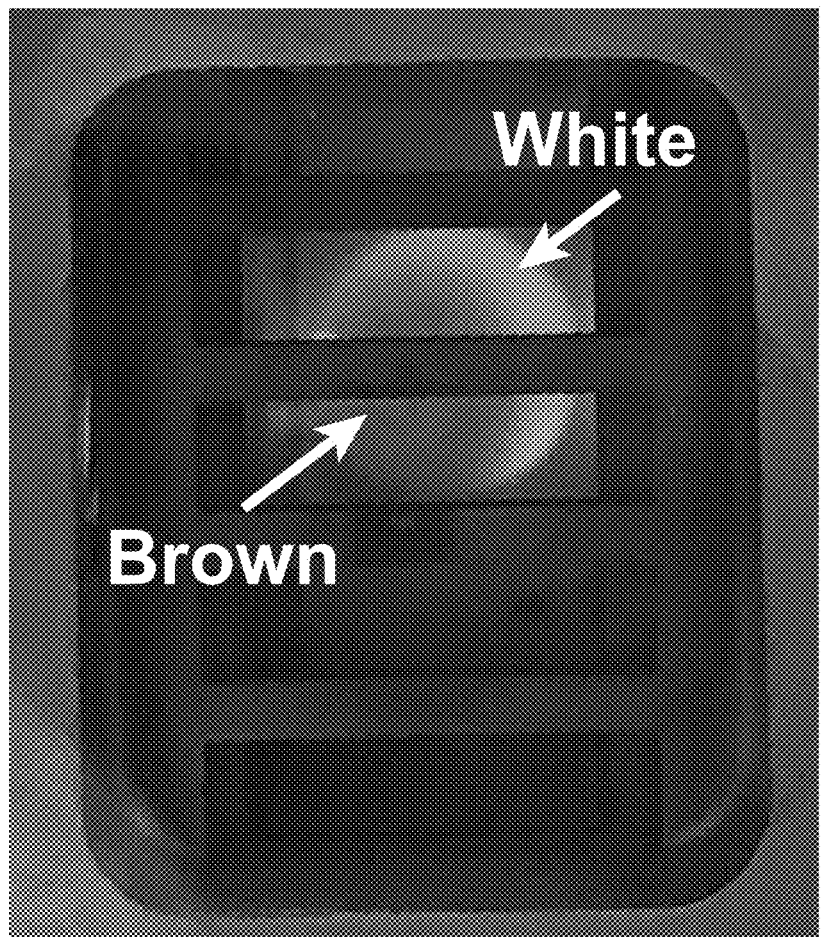

FIG. 30 illustrates a heat-induced dehydration mechanism, according to some embodiments of the present disclosure.

Figure 31A:
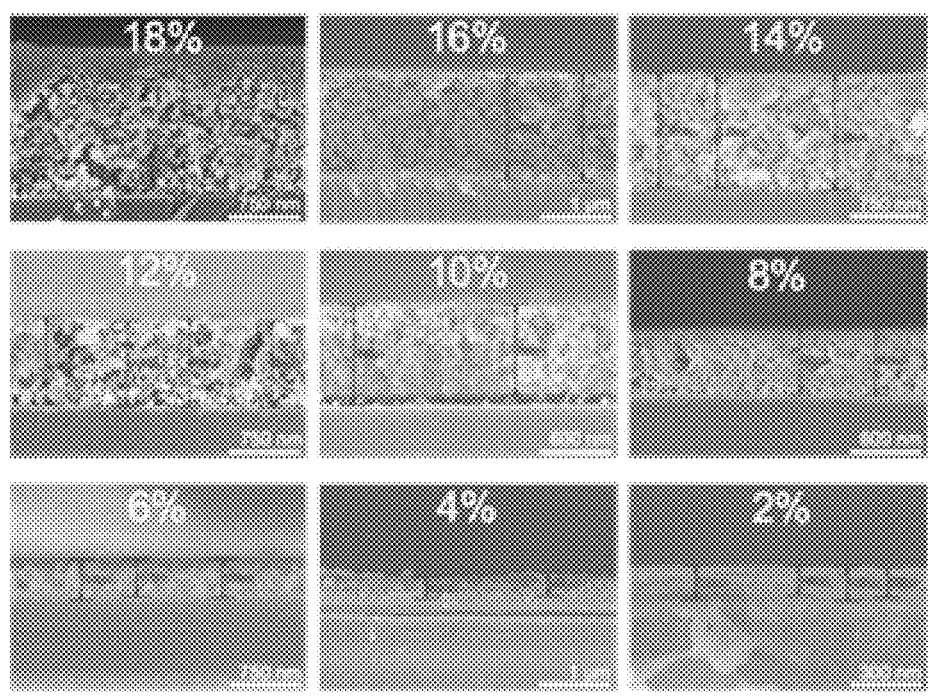

FIG. 31A illustrates cross-sectional SEM images of devices constructed using alumina nanoparticle (NP) scaffolds prepared with precursors of varying wt % of $Al_2O_3$ NP's in IPA, according to some embodiments of the present disclosure.

Figure 31B:
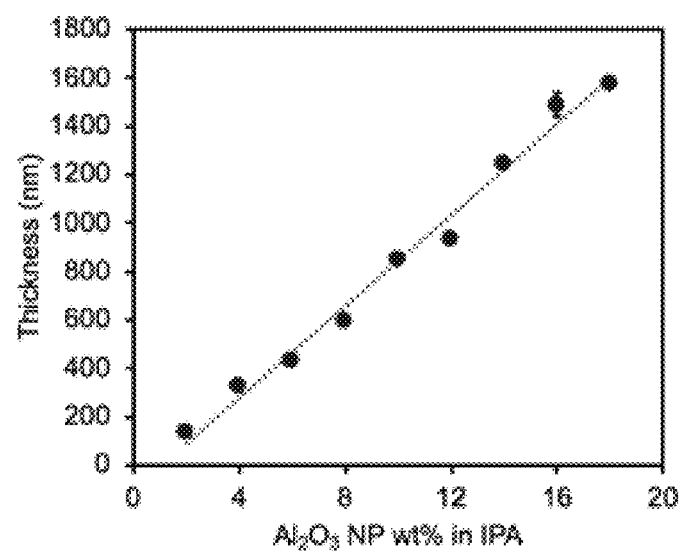

FIG. 31B illustrates the thickness variation of $Al_2O_3$ NP scaffolds prepared with precursors of varying wt % of $Al_2O_3$ NP's in IPA, according to some embodiments of the present disclosure.

REFERENCE NUMBERS

| | |
|---|---|
| 100 | device |
| 110 | composition |
| 115 | charge collecting layer |
| 120 | scaffold |
| 130 | space |
| 140 | mixture |
| 150 | perovskite-containing phase |
| 160 | second phase |
| 170 | perovskite precursor (e.g. AX) |
| 180 | switching molecule (e.g. water) |
| 190 | additive (e.g. DMSO) |
| 200 | perovskite |
| 200A | first crystalline form |
| 200B | second crystalline form |
| 210 | A-cation |
| 220 | B-cation |
| 230 | X-anion |
| 500A | first state (e.g. transparent) |
| 500B | second state (e.g. opaque) |
| 600 | first transparent layer |
| 610 | second transparent layer |
| 615 | third transparent layer |
| 620 | photovoltaic (PV) stack |
| 630 | reservoir |
| 640 | switching element |
| 650 | spacer |
| 660 | gap |
| 710 | perovskite layer |
| 720 | charge transport layer |
| 730 | charge collecting layer |
| 810 | transparent electrode |
| 820 | voltage source |
| 830 | conductor |
| 840 | electrolyte |

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to improved photovoltaic devices, photo-emitting devices, thermochromic devices, cell phones, displays, and other electronic devices. In some embodiments of the present disclosure, materials, compositions, devices, and/or methods described herein may provide improved windows, such as building windows and/or vehicle windshields. As described herein, a window device may include a photovoltaic device with one or more layers containing a photovoltaic (PV) material (i.e. layers containing active materials). For example, a suitable PV material for some embodiments of the present disclosure include a perovskite, which are described in detail below. In some embodiments of the present disclosure, a perovskite (e.g. in the form of a film) may reversibly switch between a substantially colored (i.e. opaque) state and a substantially colorless (i.e. transparent state) in response to a change in a condition, such as at least one of a change in temperature, a change in an electric field, a change in a magnetic field, a change in a light, a change in a voltage, and/or a change in a current, etc. Further, as described herein, the change in a condition (e.g. temperature, voltage, etc.) may influence how one or more compounds interact with a perovskite and/or influence how the compounds induce changes to occur in a perovskite (i.e. crystalline form) to ultimately cause the reversible switching between states (e.g. between an opaque state and a transparent state).

Figure 1:
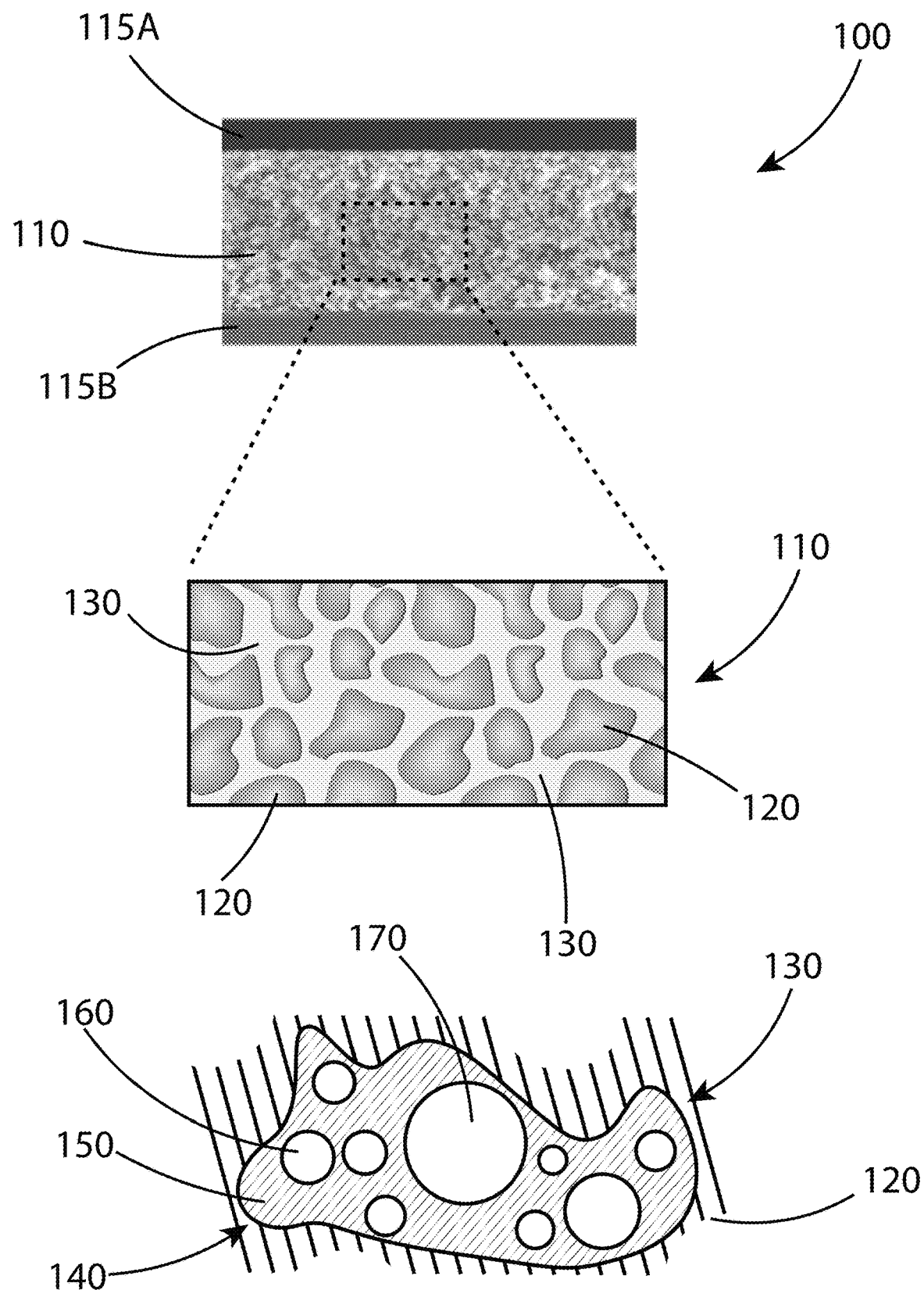
FIG. 1 illustrates a switchable device, according to some embodiments of the present disclosure.

The upper panel of FIG. 1 illustrates an electron microscopy image of a device 100 that includes a perovskite-containing composition 110 positioned between a first charge collecting layer 115A and a second charge collecting layer 115B, according to some embodiments of the present disclosure. The middle panel of FIG. 1 shows a cartoon representation of a magnified portion of the perovskite-containing composition 110. In some embodiments of the present disclosure, the composition 110 may include a solid scaffold having internal spaces positioned throughout the solid scaffold. In other words, a solid scaffold may contain an internal empty volume made of a plurality of pores and/or pores interconnected by a series of channels. For simplicity, the solid scaffold is referred to herein as the "scaffold" 120 and the empty space created by pores and/or channels as "space" 130.

Further, as shown in the lower panel of FIG. 1, each space 130 contained within a scaffold 120 may be substantially filled with a mixture 140 that includes a first phase 150 that includes a perovskite 200 (not shown) and a second phase 160 that includes, among other things, a perovskite precursor 170 (not shown) and/or a switching molecule 180 (not shown). In some embodiments of the present disclosure, a second phase 160 may also include an additive 190, as will be discussed in more detail below. In some embodiments of the present disclosure, by changing at least one local condition such as temperature, concentration of the switching molecule 180, amount of perovskite precursor 170, etc., an equilibrium reaction may be affected to reversibly shift the perovskite through different crystalline forms (e.g. 0D, 1D, 2D, and/or 3D) resulting in the perovskite reversibly shifting through different states, e.g. levels of transparency/opaqueness and/or different ranges of color.

For example, when in a first state, in the relative absence of a switching molecule 180, a perovskite 200 may be substantially in a first crystalline form that is substantially transparent to light, whereas in the second state, in the relative presence of the switching molecule 180, the perovskite 200 may be substantially in a second crystalline form that is substantially opaque to light. By reversibly switching the condition between suitable settings (e.g. a high temperature and a low temperature), the relative presence or absence of the switching molecule 180 relative to the perovskite 200 may be controlled, subsequently enabling the reversible switching of the perovskite 200 between the two crystalline forms, resulting in the reversible switching between the first opaque state and the second transparent state and/or between a first colored state and a second colored state. As shown herein, by controlling the relative amounts of switching molecule 180 and perovskite precursor 170 contained in the second phase 160 of the mixture, relative to the perovskite-containing phase 150, one can consistently, reliably, and reversibly switch the perovskite 200 between at least two extreme states; e.g. opaque and transparent and/or a first color and a second color. In some embodiments of the present disclosure, as described below, an additive 190 (not shown) may be included in the second phase 160 of the mixture 140 contained in the space 130 of the scaffold 120, providing an additional independent variable that can tune the reversible chromism of the device 100.

Thus, in some embodiments of the present disclosure, the reversible switching of a perovskite 200 between two crystalline forms may result in the reversible switching of the perovskite 200 between two different colors. In some embodiments of the present disclosure, the reversible switching of the perovskite 200 between the two crystalline forms may result in the reversible switching of the perovskite 200 between a more photovoltaically active perovskite and less photovoltaically active perovskite. Thus, as described herein, the reversible transfer of a switching molecule 180 to and from the vicinity of a perovskite 200 may result in at least one of a transparency (i.e. opacity) change, a color change, and/or a photovoltaic activity change. In some embodiments of the present disclosure, while in a relatively transparent state, a perovskite 200 may generate a voltage and/or a current. In some embodiments of the present disclosure, while in a relatively opaque state, a perovskite may generate a voltage and/or a current.

Figure 2A:
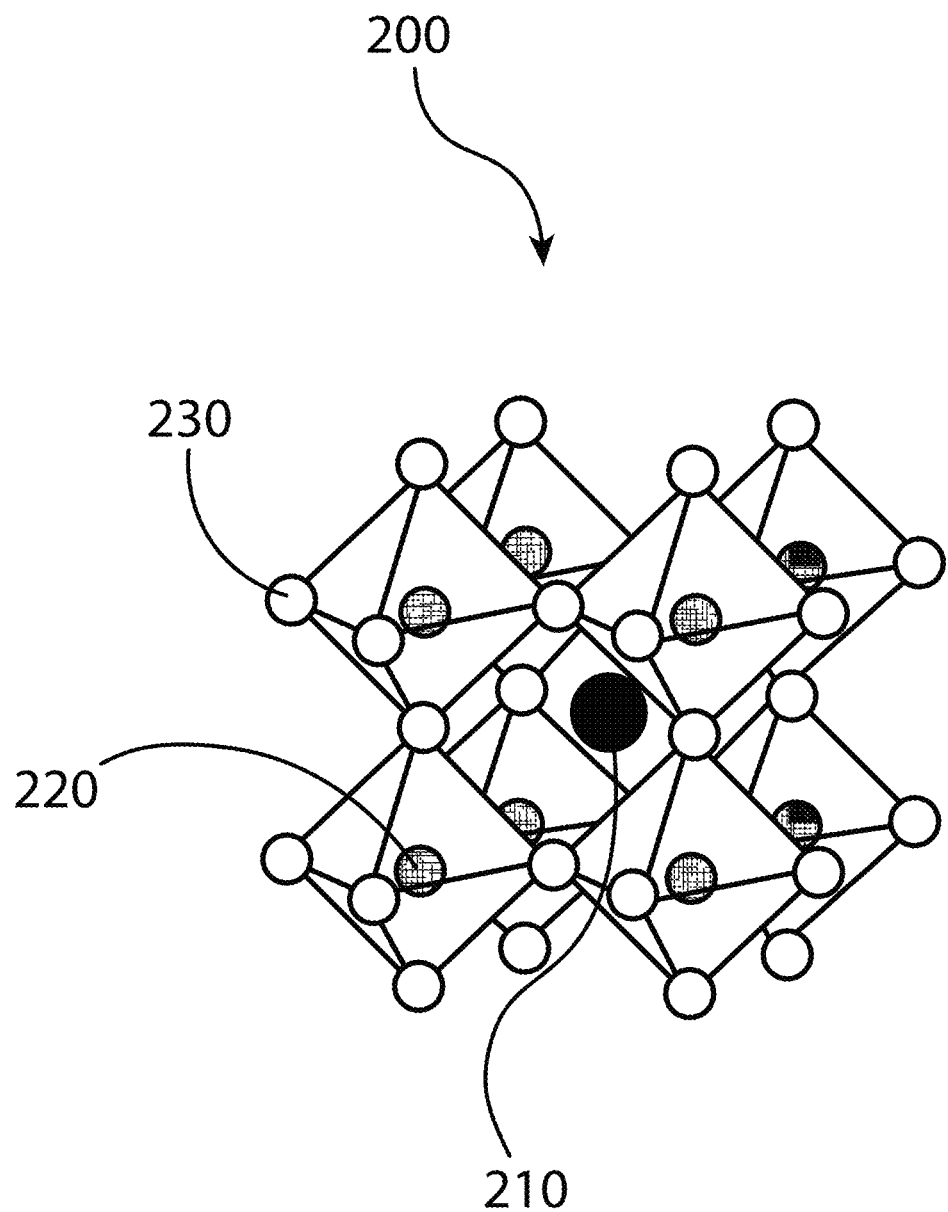
FIGS. 2A-2C illustrates perovskites, according to some embodiments of the present disclosure.
Figure 2B:
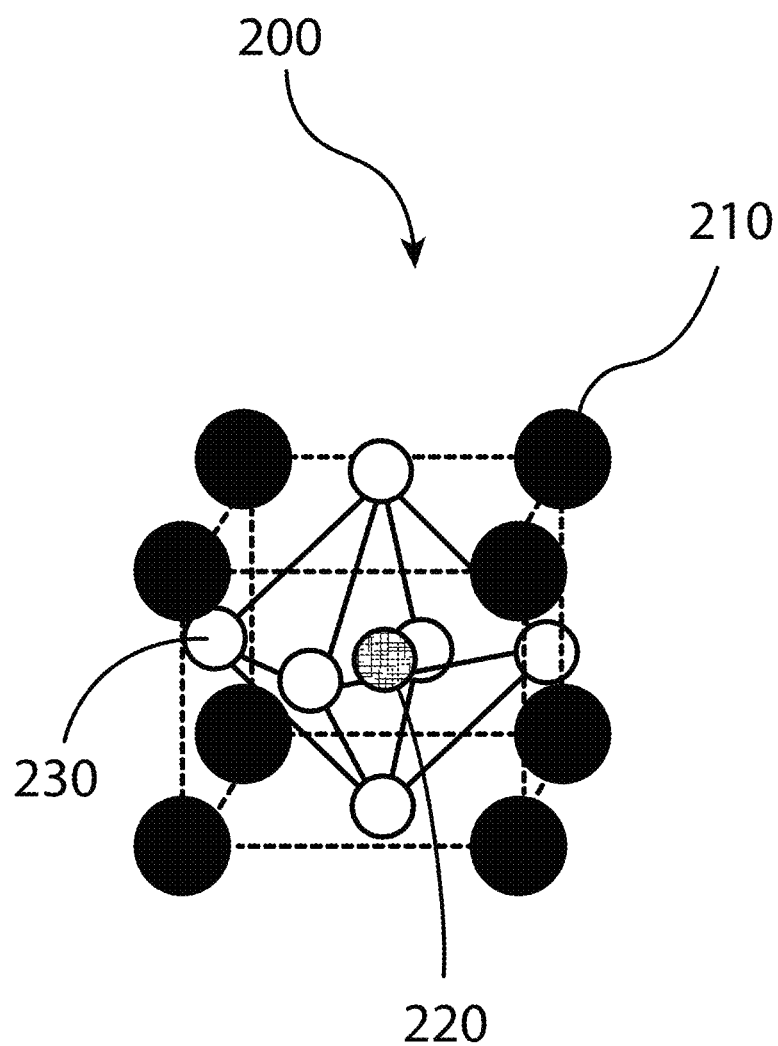
Figure 2C:
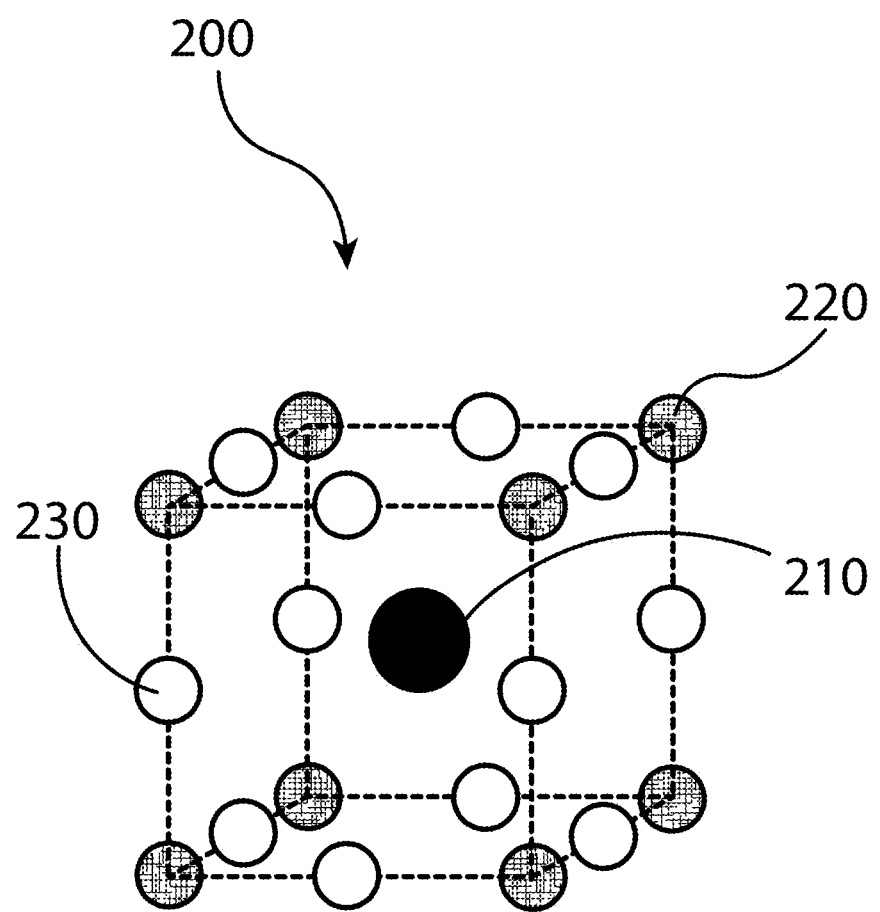

As described herein, some embodiments of the present disclosure may utilize one or more perovskites in a switchable PV device. FIGS. 2A, 2B, and 2C illustrate that perovskites 200, for example halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (230) is an anion and A (210) and B (220) are cations, typically of different sizes (A typically larger than B). FIG. 2A illustrates that a perovskite 200 may be organized into eight octahedra surrounding a central A-cation 210, where each octahedra is formed by six X-anions 230 surrounding a central B-cation 220. FIG. 2B illustrates that a perovskite 200 may be visualized as a cubic unit cell, where the B-cation 220 is positioned at the center of the cube, an A-cation 210 is positioned at each corner of the cube, and an X-anion 230 is face-centered on each face of the cube. FIG. 2C illustrates that a perovskite 200 may also be visualized as a cubic unit cell, where the B-cation 220 resides at the eight corners of a cube, while the A-cation 210 is located at the center of the cube and with 12 X-anions 230 centrally located between B-cations along each edge of the unit cell. For both unit cells illustrated in FIGS. 2B and 2C, the A-cations 210, the B-cations 220, and the X-anions 230 balance to the general formula $ABX_3$, after accounting for the fractions of each atom shared with neighboring unit cells. For example, referring to FIG. 2B, the single B-cation 220 atom is not shared with any of the neighboring unit cells. However, each of the six X-anions 230 is shared between two unit cells, and each of the eight A-cations 210 is shared between eight unit cells. So, for the unit cell shown in FIG. 2B, the stoichiometry simplifies to B=1, A=8*0.124=1, and X=6*0.5=3, or $ABX_3$. Similarly, referring again to FIG. 2C, since the A-cation is centrally positioned, it is not shared with any of the unit cells neighbors. However, each of the 12 X-anions 230 is shared between four neighboring unit cells, and each of the eight B-cations 220 is shared between eight neighboring unit cells, resulting in A=1, B=8*0.125=1, and X=12*0.25=3, or $ABX_3$. Referring again to FIG. 2C, the X-anions 230 and the B-cations 220 are shown as aligned along an axis; e.g. where the angle at the X-anion 230 between two neighboring B-cations 220 is exactly 180 degrees, referred to herein as the tilt angle. However, a perovskite 200 may have a tilt angle not equal to 180 degrees. For example, some embodiments of the present disclosure may have a tilt angle between 153 and 180 degrees.

Typical inorganic perovskites include calcium titanium oxide (calcium titanate) minerals such as, for example, $CaTiO_3$ and $SrTiO_3$. In some embodiments of the present invention, the A-cation 210 may include a nitrogen-containing organic compound such as an alkyl ammonium compound. The B-cation 220 may include a metal and the X-anion 230 may include a halogen. Additional examples for the A-cation 210 include organic cations and/or inorganic cations, for example Cs, Rb, K, Na, Li, and/or Fr. Organic A-cations 210 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 210 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2+$), hydrazinium, acetylammonium, dimethylammonium, imidazolium, guanidinium and/or any other suitable nitrogen-containing or organic compound. In other examples, an A-cation 210 may include an alkylamine. Thus, an A-cation 210 may include an organic component with one or more amine groups. For example, an A-cation 210 may be an alkyl diamine halide such as formamidinium ($CH(NH_2)_2$). Thus, the A-cation 210 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), iso-propyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 220 include, for example, lead, tin, germanium, and or any other 2+ valence state metal that can charge-balance the perovskite 300. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 230 include halogens: e.g. fluorine, chlorine, bromine, iodine and/or astatine. In some cases, the perovskite halide may include more than one X-anion 230, for example pairs of halogens; chlorine and iodine, bromine and iodine, and/or any other suitable pairing of halogens. In other cases, the perovskite 300 may include two or more halogens of fluorine, chlorine, bromine, iodine, and/or astatine.

Thus, the A-cation 210, the B-cations 220, and X-anion 230 may be selected within the general formula of $ABX_3$ to produce a wide variety of perovskites 200, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 200 may have more than one halogen element, where the various halogen elements are present in non-integer quantities; e.g. x is not equal to 1, 2, or 3. As described herein, the A-cation 210 of a perovskite 200, may include one or more A-cations, for example, one or more of cesium, FA, MA, etc. Similarly, the B-cation 220 of a perovskite 200, may include one or more B-cations 220, for example, one or more of lead, tin, germanium, etc. Similarly, the X-anion 230 of a perovskite 200 may include one or more anions, for example, one or more halogens. Any combination is possible provided that the charges balance.

For example, a perovskite having the basic crystal structure illustrated in FIG. 2A, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B4+X_6$, for example $Cs_2PbI_6$ and $Cs_2SnI_6$. Yet another example is described by $A_3B23+X_9$, for example $Cs_3Sb_2I_9$. For each of these examples, A is one or more cations, or for a mixed perovskite, A is two or more cations.

Figure 3:
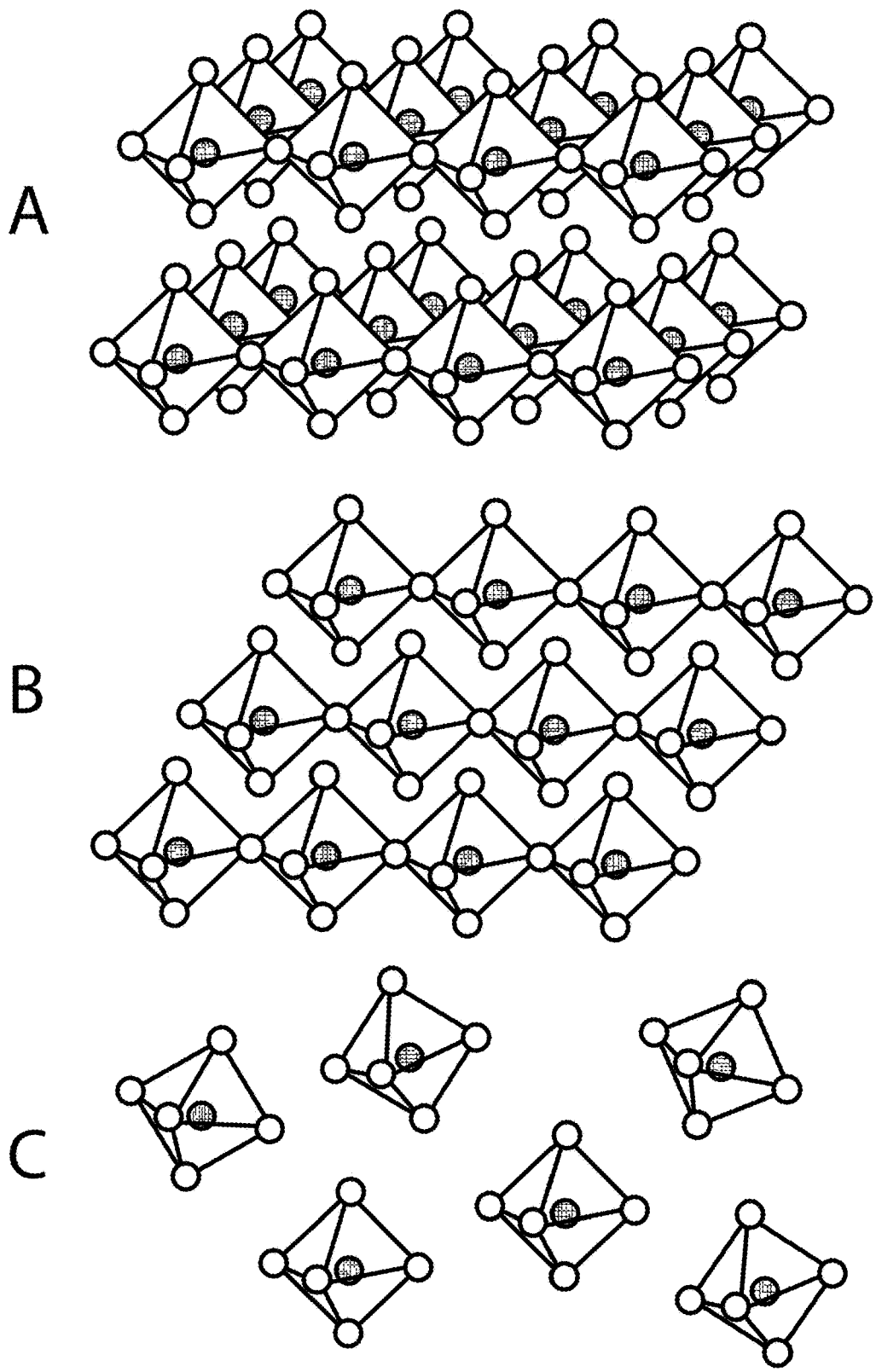
FIG. 3 illustrates 2D, 1D, and 0D perovskite structures, in Panels A, B, and C, respectively, according to some embodiments of the present disclosure.

In addition, perovskite halides, like other organic-inorganic perovskites, can attain different crystalline forms that can be described as three-dimensional (3D) networks, two-dimensional (2D) networks, one-dimensional (1D) networks and/or zero-dimensional (0D) networks, with each possessing the same unit structure. A perovskite's 3D crystalline form is illustrated in FIGS. 2A, 2B, and 2C. FIG. 3 illustrates a 2D crystalline form of a perovskite, a 1D crystalline form, and a 0D crystalline form, in Panels A, B, and C, respectively. As described above, a perovskite having a 3D crystalline form may adopt the general chemical formula of $ABX_3$, in which the A-cation may be a monovalent cation (e.g. methylammonium and/or formamidinium $CH(NH_2)_2^+$), the B-cation may be a divalent cation (e.g. $Pb^{2+}$ and/or $Sn^{2+}$), and the X-anion may be a halide anion (I—, Br—, and/or Cl—). In this formula, the 3D crystalline form of perovskites may be constructed by linking all corner sharing $BX_6$ octahedra, with the A-cation filling the space between eight octahedral unit cells to balance the crystal charge.

Referring to Panel A of FIG. 3, and as described below in more detail, through the chemically accomplished dimensional reduction of the 3D crystal lattice, 2D perovskites, $(A')_m(A)_{n-1}B_nX_{3n+1}$ may adopt a new structural and compositional dimension (A' not shown) where monovalent cations (m=2) and/or divalent cations (m=1) can intercalate between the X-anions of the 2D perovskite layers. Referring to Panel B of FIG. 3, 1D perovskites may be constructed by $BX_6$ octahedral chained segments spatially isolated from each other by surrounding, among other things, cations (not shown), leading to bulk assemblies of paralleled octahedral chains. Referring to Panel C of FIG. 3, typically, 0D perovskites may be constructed of isolated inorganic octahedral clusters and surrounded by small cations (not shown) which are connected via hydrogen bonding.

Referring again to the bottom panel of FIG. 1, a reversibly switchable window may be achieved using a composition 110 constructed of a solid scaffold 120 having internal porosity or space 130 that is at least partially filled with a mixture 140 of a perovskite-containing phase 150 and a second phase 160 that includes at least one of a perovskite precursor 170, a switching molecule 180, and/or an additive 190. By utilizing a control variable, i.e. condition, such as temperature, voltage, switching molecule 180 concentration, relative humidity for the case where the switching molecule 180 includes water, and/or perovskite precursor 170 amounts, etc., one may reversibly switch the perovskite 200 contained in the perovskite-containing phase 150 between a plurality of crystalline forms and between a plurality of corresponding states.

In some embodiments of the present disclosure, a scaffold 120 may be composed of a porous polymer such as at least one of polystyrene, polymethylmethacrylate, polyisobutylene, or polyethylene oxide, polyvinylpyrrolidone, or polyvinylbutyral. In some embodiments of the present disclosure, a scaffold 120 may be constructed of a transparent metal oxide, for example, at least one of $Al_2O_3$, $TiO_2$, $SiO_2$, NiO, ZnO, $ZrO_2$, ZnS, CdS, and/or BaS. A scaffold 120 may be a loose assembly of nanoparticles and/or an ordered rigid structure (e.g. columnar, honeycomb, troughs, etc.). The diameter of the nanoparticles used to construct a scaffold bay be between about 1 nm and about 100 nm. The nanoparticles may be coated with ligand molecules that consist of a head group (e.g. amines, carboxylic acids/carboxylates, thiols/thiolates, etc.) and an aliphatic group composed of aliphatic (e.g. ethyl, butyl, oleyl, etc.) or aromatic (e.g. benzyl, ethylbenzyl, phenyl, etc.). In some embodiments of the present disclosure, a nanoparticle network used to construct a scaffold may be held together by van der Waals forces. A metal oxide for a scaffold 120 may be in the form of nanoparticles that are sintered together, which may result in the removal of ligands and metal-oxide bonds between nanoparticles. Pores within a scaffold 120 may have an average pore size between about 1 nm and about 100,000 nm. A scaffold 120 may also be composed of multiple layers of porous polymers or metal oxides (e.g. $Al_2O_3$ on top of $TiO_2$) exhibiting any of the above-mentioned traits.

As shown herein, the presence of a porous scaffold 120 is important for the switching reversibility. As shown herein, a porous scaffold 120 allows the switching molecule 180 to easily penetrate or leave the perovskite (e.g. perovskite film, perovskite-containing phase, etc.). A porous scaffold 120 with pores less than about 100 nm can limit the size of the perovskite grains, which can reduce the distance that perovskite precursor 170, e.g. AX, must travel to leave and/or enter the perovskite grains. Both of these features increase the speed and reversibility of switching by facilitating the transport of the switching molecule 180 and/or the perovskite precursor 170, e.g. AX, between the perovskite-containing phase 150 and the second phase 160 of the mixture 140 contained within the space 130 (i.e. pores) of the scaffold 120. The thickness of the scaffold 120 may be between about 50 nm and about 1.5 µm. However, the concentration of the perovskite precursor 170 should be adjusted to control the thickness of a "perovskite overlayer", as discussed in detail below (see left panel of FIG. 23). The volume ratio of perovskite to scaffold can range between about 1000-to-1 and 1-to-1000. The volume ratio of the perovskite to the second phase 230 contained within the space 130 of a scaffold 120 can range from 1000-to-1 and 1-to-1000. The pore size may be between 1 and 10,000 nm. The molar ratio of perovskite precursor 170 (e.g. AX) to perovskite 200 can vary between 1000-to-1 down to 1-to-1000. The molar ratio of switching molecule 180 to perovskite 200 can vary between 100,000-to-1 down to 1-to-100,000.

Examples of an additive 190 includes at least one of dimethylsulfoxide (DMSO), dimethylformamide (DMF), N-methyl-2-pyrrolidone (NMP), 2-pyrrolidone, N-ethyl-2-pyrrolidone (NEP), N-butyl-2-pyrrolidone (NBP), N-(3-aminopropyl)-2-pyrrolidinone (NAP), N-(2-hydroxyethyl)-2-pyrrolidone (NHEP), 1-phenyl-2-pyrrolidinone (PPD), 1-benzyl-2-pyrrolidinone (BPD), and acetonitrile. Additives may also include ionic liquids. Examples of polar aprotic ionic liquids, which may function as additives according to embodiments of the present disclosure include 1-butyl-3-methylimidazolium tetrafluoroborate ($BMIMBF_4$), 1-hexyl-3-methylimidazolium chloride (HMImCl), 1-ethylpyridinium chloride, tetrabutylammonium chloride, 1-benzyl-3-methylimidazolium chloride (BMIMCl), and 1-allyl-3-methylimidazolium chloride (AMIMCl).

There are at least three considerations when designing a switchable perovskite-containing composition 110 like that shown in FIG. 1. First, the perovskite-containing phase 150 (e.g. $FA_{n+1}Pb_nX_{3n+1}$) should be accessible to the switching molecule 180; second a second phase 160, as described herein, should be present; and third the switching molecule 180 should interact favorably with the perovskite-containing phase 150 (e.g. $FA_{n+1}Pb_nX_{3n+1}$). In some embodiments of the present disclosure, access to a perovskite 200 by a switching molecule 180 may be achieved by the placement of the perovskite 200 into a scaffold 120 constructed of a mesoporous material, for example a metal oxide such as $Al_2O_3$ nanoparticles. The scaffold 120 may limit the size of perovskite domains and provide a pathway for the transport of the switching molecule 180. A second phase 160 (of the mixture 140 containing the perovskite-containing phase 150 and the second phase 160) may be formed by using an excess of a perovskite precursor 170, for example, FAX relative to $PbX_2$ (greater than 3:1 $FAX:PbI_2$), and combining the perovskite precursor 170 with at least one of the switching molecule 180 and/or the additive 190. Additives and/or switching molecules (e.g. water) may be retained in the perovskite by annealing at low temperatures (between about 20° C. and about 80° C.) in a relative humid atmosphere, relative humidity (RH) between about 20% and about 80%, without exposure to dry-air flow. Thus, in some embodiments of the present disclosure, a layer of a device (e.g. a photovoltaically active switchable window) may include a solid scaffold 120 having an internal space 130 (i.e. porosity) that provides a volume that may be filled with a mixture 140 that includes the perovskite (e.g. a perovskite-containing phase 150 that includes the perovskite 200) and a second phase 160 that includes at least one of a switching molecule 180 (e.g. water, methanol, ethanol, etc.), an additive 190 (e.g. DMSO, NMP, etc.), and/or a perovskite-precursor 170 (e.g. AX, such as FAI, FABr, and/or FACl).

Figure 4A:
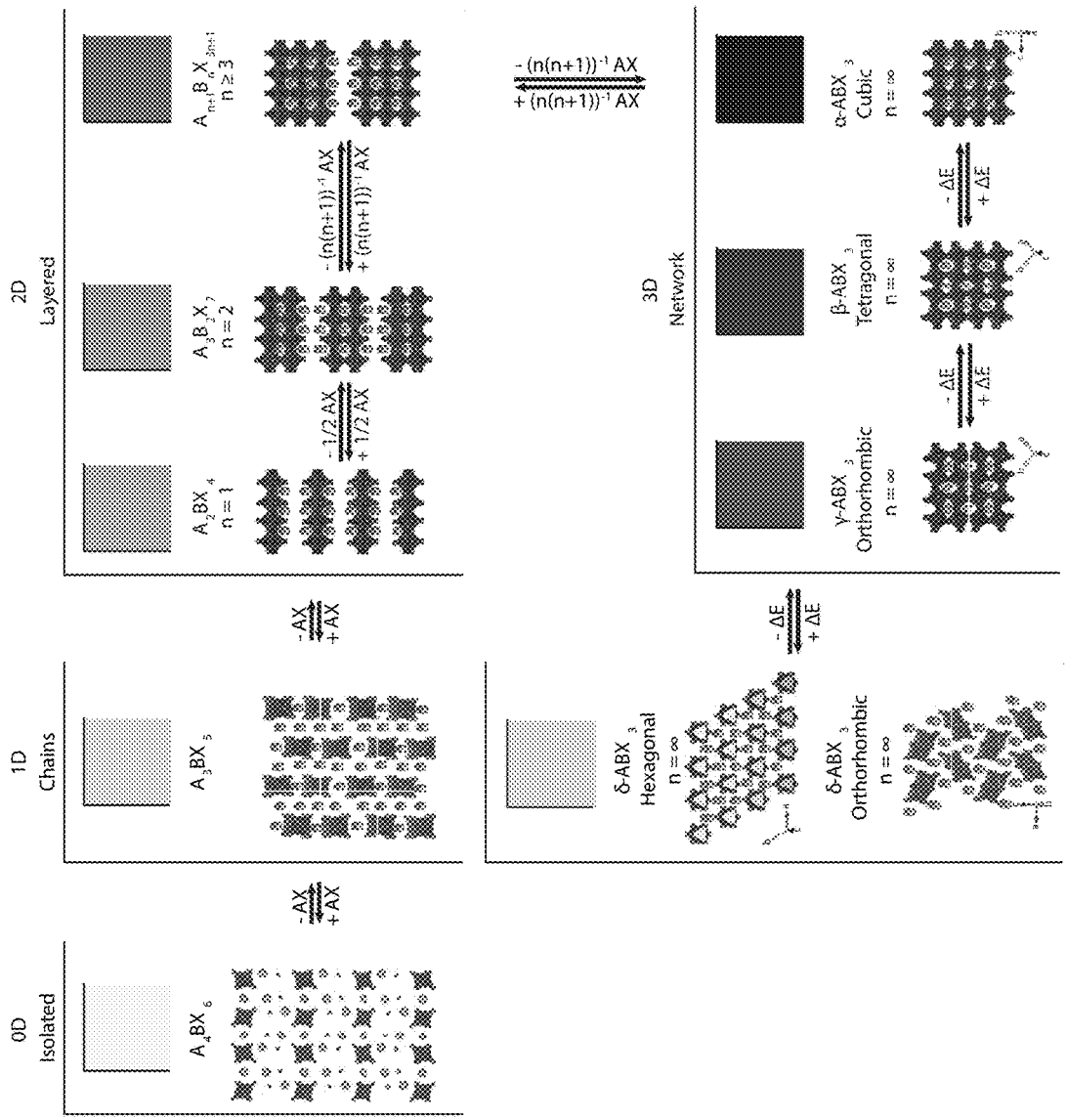
FIGS. 4A and 4B illustrate a switching mechanism for reversibly switching a perovskite through at least two states, e.g. transparent and opaque, according to some embodiments of the present disclosure.

FIG. 4A illustrates a mechanism that explains the reversible switching of a perovskite 200 between at least two states described in detail below, for example between a first substantially transparent state and a second substantially opaque state, by utilizing at least one compound (e.g. switching molecule 180 and/or perovskite precursor 170) that induces the perovskite to reversibly transition between different crystalline forms, e.g. 1D, 2D, and/or 3D, according to some embodiments of the present disclosure. As a result, the change in crystalline forms results in the perovskite reversibly transitioning between the different states, e.g. levels of opacity/opaqueness and/or ranges of color. FIG. 4A illustrates that a perovskite may demonstrate reversible chromism through the reversible separating and coalescing of the layers of a perovskite; through the reversible switching of a perovskite through its different crystalline forms. As shown herein, this reversible chromism may be achieved by the reversible transfer of at least one compound (e.g. switching molecule, additive, and/or perovskite precursor) to and from the vicinity of the perovskite, which in turn is affected by the reversible switching of a local condition (e.g. temperature, relative humidity, etc.) of the perovskite and/or the perovskite-containing device.

Referring again to FIG. 4A, the illustrated mechanism outlines a plurality of perovskite crystalline forms and reversible transformations between the crystalline forms due to the addition or removal of at least one compound, mechanical energy, and/or thermal energy. In some embodiments of the present disclosure, the reversible switching (i.e. transformation) between crystalline forms may be induced by a perovskite precursor 170 that supplies the A-cation and X-anion incorporated into the perovskite crystalline forms. In some embodiments of the present disclosure, a perovskite precursor may include an AX salt, with examples including MAX, FAX, CsX, etc., where X includes at least one halide. Further, the ability of a perovskite precursor 170 to transfer in and out of the crystalline form of a perovskite 200 may be influenced by the relative presence, absence, and/or concentration of a switching molecule 180 in the mixture 140 contained in the internal pores, volume, space 130 of the scaffold 120.

As shown in FIG. 3 and FIG. 4A, 0D perovskites may have isolated $[BX_6]^{4-}$ octahedra. As shown in FIG. 4A, a perovskite precursor 170, e.g. an AX salt unit, may be removed from an 0D perovskite to form a 1D perovskite, which may have octahedra connected to form metal halide chains. Referring again to FIG. 4A, removing another AX salt pair unit from a 1D perovskite may yield a 2D perovskite where metal halide octahedra are connected in planes (i.e. layers) where n is the number of metal halide octahedra layers. Subsequently, when partial units of AX salt (n(n+1)$^{-1}$) are removed from a 2D perovskite, a 2D structure with layers of 3D perovskite may be formed. When n>3,3D perovskites may be formed with octahedra units that share all of their halide atoms with an adjacent octahedra. As additional AX salt pairs (i.e. perovskite precursors) are removed, and as n approaches ∞, all octahedra units may share their corner halide atoms with adjacent octahedra to form a 3D perovskite with the general form $ABX_3$. As a result of the changes to the perovskites, through different crystalline forms and dimensionality, the perovskites change their states; as the dimensionality increases, the perovskite states change from more transparent to more opaque (relative levels of transparency/opacity and/or different colored states are indicated by the gray-scale squares in FIG. 4A).

This observation is due to at least the following. As a perovskite structure is transformed from a 0D crystalline form to a 3D crystalline form, the optical bandgap of the material may be reduced. 0D structures absorb little to no visible light, whereas 1D and 2D materials may absorb some portion of the visible spectrum. In other words, as a perovskite moves from a lower dimensional crystalline form to a higher dimensional crystalline form, the perovskite demonstrates chromism by moving through a continuum of transparency and opacity, starting with a substantially transparent 0D perovskite and ending with a substantially opaque 3D perovskite. 3D perovskites in the cubic phase ($\alpha$-$ABX_3$) with axially aligned octahedra have the narrowest band gap and are the most opaque. Further, a 3D perovskite in the cubic phase may be reversibly transformed by adding energy to the system, which results in tilting the octahedra of the perovskite off of a first reference axis. Perovskites with tilted octahedra may be in the tetragonal phase ($\beta$-$ABX_3$), which reduces crystal symmetry, widens the bandgap, and increases the transparency of the perovskite. Tilting the octahedra along a second axis yields the orthorhombic phase ($\gamma$-$ABX_3$), further reducing symmetry, widening the bandgap, increasing the transparency of the perovskite. Finally, $ABX_3$ perovskites, with the addition of energy, may undergo a reversible phase transition to form the 1D phase ($\delta$-$ABX_3$), which takes two possible symmetry forms: hexagonal (P63/mmc) and orthorhombic (Pnma). Both forms have wide bandgaps and absorb less visible light than their higher dimensional counterparts. Both forms have wide bandgaps and absorb less visible light than their higher dimensional counterparts.

In more detail, discrete optical transitions observed in the absorbance spectra occur due to the separation or coalescence of 2D octahedra layers. The optical bandgap of 2D $FA_{n+1}Pb_nI_{3n+1}$ materials increases monotonically as n approaches 1 due to formation of minibands in the quantum well superlattice structure that emerges due to alternating layers of formamidinium and connected lead halide octahedra layers. The optical bandgap increase relative to 3D $\alpha$-$FAPbI_3$ is written as:

$$E_{g,2D} = E_{g,3D} + E_e + E_h \quad \text{Equation 1}$$

where $E_{g,3D}$=1.52 eV is the bulk bandgap of $\alpha$-$FAPbI_3$ and $E_{e(h)}$ is the minimum energy of the lowest-energy miniband. $E_{e(h)}$ was determined by adapting the Kronig-Penney (KP) model for an electron (hole) in a one-dimensional periodic potential. The KP-like model has successfully described conventional III-V superlattice structures and has recently been applied to MHP materials. The dispersion relation for electrons (holes) in the x direction is:

$$\cos(\beta L_{qw})\cosh(\alpha L_b) + \frac{1}{2}(\gamma - \gamma^{-1})\sin(\beta L_{qw})\sinh(\alpha L_b) = \quad \text{Equation 2}$$
$$\cos(k(L_{qw} + L_b))$$

where $L_{qw}$ is the width of the metal halide quantum well layer, and $L_b$ is the width of the barrier layer composed of formamidinium. Both widths are determined from XRD studies ($L_{qw}$=0.624 nm and $L_b$=0.690 nm). k is the superlattice wavevector, which is bound by $-\pi(L_{qw}+L_b)$ and $\pi(L_{qw}+L_b)$. The minimum energy of the lowest-energy miniband occurs when k=0. For simplicity: $\beta^2 = 2m_{qw,e(h)}E_{e(h)}\hbar^{-2}$ and $\alpha^2 = 2m_{b,e(h)}(V_e(h)-E_{e(h)})\hbar^{-2}$. The effective masses of electrons and holes are assumed to be the same for the quantum well ($m_{qw}=m_{qw,e}=m_{qw,h}$) and barrier ($m_b=m_{b,e}=m_{b,h}$). Literature values were applied for the effective mass in the metal halide layer ($m_{qw}$=0.1$m_0$, where $m_0$ is the rest mass of an electron) and the barrier layer ($m_b=m_{qw}/0.4$). The barrier height ($V_{e(h)}$) for the electrons (holes) is an expression of the bandgap of the formamidinium layers that separate metal halide layers. For simplicity, it was assumed $V_e=V_h$. The expression for $\gamma$ is modified from the classic KP model ($\gamma=\alpha/\beta$) to take into account the difference in effective mass of the electrons (holes) in the quantum well and barrier layers: $\gamma = \alpha m_{qw,e(h)}/\beta m_{b,e(h)}$.

PL shows discrete miniband transitions from the optical bandgaps of a mixture of $FA_{n+1}Pb_nI_{3n+1}$ thicknesses (n) that increase as the RH increases (see FIG. 25B). As the RH increased to 80%, the PL peak shifts from 2.28 eV to 1.71 eV. It is notable that the PL is tuned in the visible region over a 0.56 eV window by simply varying the RH. The PL was quenched upon reaching 82% RH. The experimental PL data was successfully modeled by numerically solving Equation 1 for $E_{e(h)}$ to produce $E_{g,2D}$ as a function of quantum well width ($L_{qw}$) (not shown). The thickness of a monolayer in $FA_{n+1}Pb_nI_{3n+1}$ is about 0.624 nm. The KP-like model nicely reproduced the optical bandgap data determined from PL measurements for n>2. A potential barrier height of $V_e(h)=1.2$ eV best fits the data, which is a reasonable bandgap for a FAI salt layer ($E_{g,FAX}=E_{g,3D}+e(V_e+V_h)=3.92$ eV) between the lead halide sheets. The data is captured by varying the barrier height between 0.8 and 1.6 eV. The barrier height may be affected by the presence of water vapor interacting with the system.

The transformations of a perovskite between different dimensionalities and states, as shown in FIG. 4A, may be described by the equilibrium reaction shown in Reaction (1) below, where the left side of the equation describes a perovskite having a relatively low dimensional form and the right side of the equation describes a perovskite having a relatively high dimensional form and FAX represents a perovskite precursor, AX, where A is FA (formamidinium).

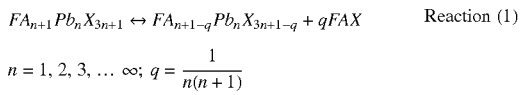

$$FA_{n+1}Pb_nX_{3n+1} \leftrightarrow FA_{n+1-q}Pb_nX_{3n+1-q} + qFAX \quad \text{Reaction (1)}$$

$$n = 1, 2, 3, \ldots \infty; \quad q = \frac{1}{n(n+1)}$$

As shown herein by optical absorption and photoluminescence (PL) data confirms each observed color in a perovskite-containing mixture corresponds to perovskites having multiple thicknesses that span n=1 to n=∞. Without wishing to be bound by the theory, the dynamic equilibrium represented by Equation (1), the ability of a perovskite precursor 170 to access a perovskite 200 and incorporate into the perovskite layers resulting in the coalescing of adjacent layers and/or reversibly leave a perovskite resulting in the splitting of a perovskite into separate layers, may be modulated by, among other things, the strength and/or number of hydrogen bonds available to the perovskite. As described in more detail below, the strength and/or number of hydrogen bonds available may be influenced by the presence or absence of at least one switching molecule 180 such as water, an alcohol, and/or an amine. As discussed above, the reversible switching of a perovskite between different states, due to reversible changes in the crystalline form of a perovskite, may be induced by the presence and/or absence of at least one compound. In other words, a switching molecule 180 may affect the ability of a perovskite precursor 170 to intercalate between the perovskite layers of a lower dimensional perovskite resulting in the forming of a higher dimensional perovskite. As this process is reversible, the cations and anions making up a higher dimensional perovskite may be removed in the form of the perovskite precursor 170, e.g. FAX, from the crystalline structure and to de-intercalate from between the crystalline structure to form a lower dimensional perovskite. As shown below, the availability of a perovskite 200 to a perovskite precursor 170 may be influenced by the presence (or absence) of switching molecule 180 reversibly changing the relative strength of hydrogen bonds available to the perovskite 200.

Figure 4B:
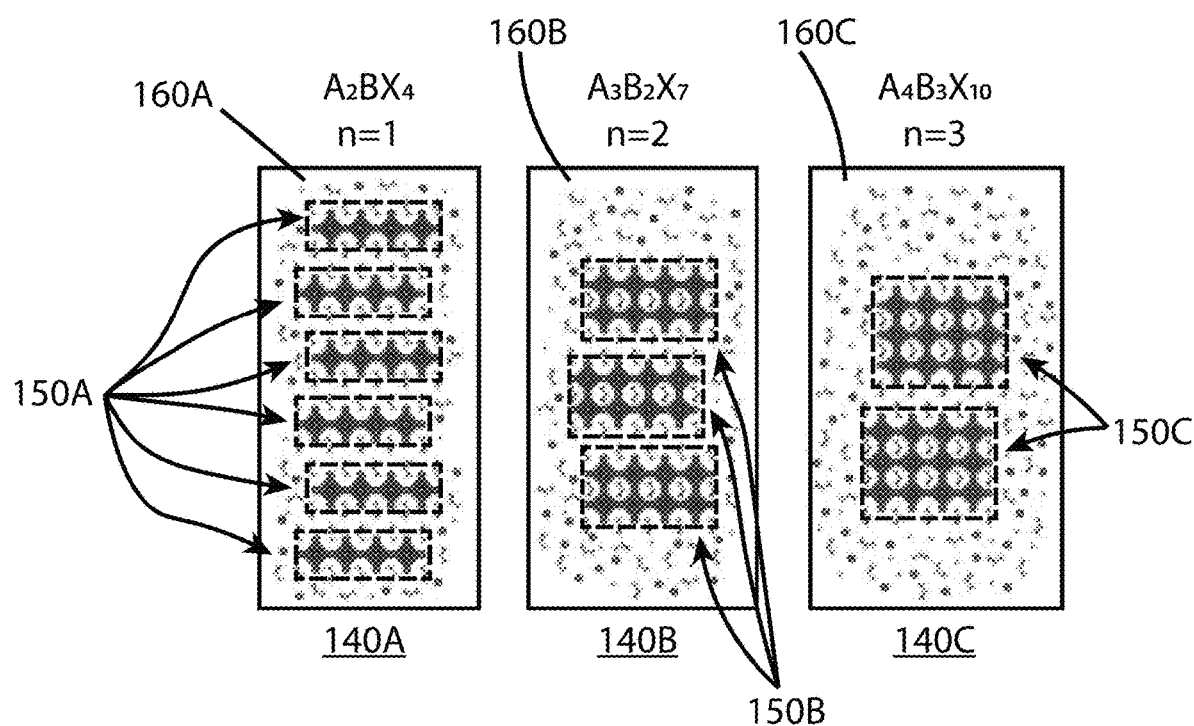

FIG. 4B illustrates the 1D, 2D, and 3D crystalline forms of a perovskite previously illustrated in FIG. 3 and FIG. 4A, to better illustrate the other features included in a mixture 140 containing a perovskite-containing phase 150 and a second phase 160, according to some embodiments of the present disclosure. When in the 1D crystalline form, a first mixture 140A contains a first perovskite-containing phase 150A of $BX_6$ octahedral chain segments spatially isolated from each other by a second phase 160A containing at least one of perovskite precursor 170 units (e.g. AX salt pairs), switching molecules 180 (e.g. water), and/or additives 190 (e.g. DMSO). As the hydrogen-bonding capacity of the mixture 140A is increased and Equation (1) is shifted to the right and AX perovskite precursor molecules are removed from the first perovskite-containing phase 150A, the bulk assemblies of parallel octahedral chain segments coalesce to form 2D octahedral sheets. The resultant AX perovskite precursor molecules are transferred into the second phase 160A forming a second mixture 140B that includes a second perovskite-containing phase 150B of the 2D crystalline octahedral sheets interspersed in a "second" second phase 160B. As the hydrogen-bonding capacity of the mixture is increased even further, and additional AX molecules are removed from the second perovskite-containing phase 150B and transferred into the "second" second phase 160B, the 2D octahedral sheets coalesce to form third a perovskite-containing phase 150C of perovskite crystals in a 3D crystalline form, interspersed within the "third" second phase 160C forming a third mixture 140C.

Thus, in summary, the control of the reversible transfer of a perovskite precursor 170 into and out of a perovskite-containing phase 150, may be precisely controlled by controlling the amount of a switching molecule 180 present in a second phase 160 of a mixture 140, which also contains the perovskite-containing phase 150. For example, switching from a relatively high concentration of switching molecule 180 contained in the second phase 160 of a mixture 140 to a relatively low concentration of the switching molecule 180, can result in the reversible switching of the perovskite 200 contained in the perovskite-containing phase 150 from a first crystalline form having a relatively high order of dimensionality (e.g. 3D and/or 2D crystalline form) to a second crystalline form having a relatively low order of dimensionality (e.g. 0D and/or 1D crystalline form), further resulting in the reversible switching of the perovskite between a relatively opaque state to a relatively transparent state and/or a first colored state to a second colored state, and/or from a first opaque state to a second less opaque state. Referring again to Equation (1), this example corresponds to the removal of AX perovskite precursor 170 salts from the second phase 160 and the subsequent transfer of the AX perovskite precursor 170 salts to the perovskite-containing phase 150, resulting in the splitting of perovskite crystals to form lower dimensionality crystalline forms of perovskite in the resulting perovskite-containing phase 150.

According to some embodiments of the present disclosure, a "relatively opaque state" and a "relatively transparent state" may be defined by two extremes, or end-states, that bracket a continuum of transparency/opacity values and/or color values, such that, depending on the relative concentration and/or presence/absence of a perovskite precursor, the transparency/opacity and/or color may be set to some desired intermediate state (i.e. value) between the two end-states. As described above, a perovskite may have more than two crystalline forms resulting in more than two states. In some embodiments of the present disclosure, a perovskite may have a plurality of both across a continuum bracketed by two extreme states, or two end-states.

Thus, a perovskite may have a first end-state corresponding to first crystalline form that is substantially in the 0D crystalline form of a perovskite and a second end-state corresponding to a second crystalline form that is substantially in the 3D crystalline form of a perovskite, with a plurality of intermediate crystalline forms that may include a mixture of perovskite crystalline forms, including 0D, 1D, 2D, and/or 3D as one moves across the continuum from the first end-state to the second end-state. For example, when being transformed (e.g. by a change in a condition such as temperature) from a first end-state having essentially only the 0D crystalline form of a perovskite, a perovskite may switch to a first intermediate crystalline form that includes essentially only 0D and 1D forms of a perovskite, followed by a second intermediate crystalline form that includes essentially only 0D, 1D, and 2D forms, to a third intermediate crystalline form that includes essentially only 1D and 2D forms, to a fourth crystalline form that includes essentially only 1D, 2D, and 3D forms, to a fifth crystalline form that includes essentially only 2D and 3D forms, and ending at the second end-state including essentially only the 3D form of a perovskite. These combinations of perovskite crystalline forms are given for illustrative purposes, and a perovskite having a wide range of mixtures across a continuum are within the scope of the present disclosure. Similarly, in some embodiments of the present disclosure, a perovskite (or a perovskite-containing material) may switch across a plurality of colors, degrees of transparency, and/or degrees of opaqueness, as a result of switching across different combinations of perovskite crystalline forms (0D, 1D, 2D, and/or 3D). As described above, this reversible switching of crystalline forms and perovskite states may be induced by the relative concentration of at least one of a switching molecule 180, a perovskite precursor 170, e.g. an AX salt, and/or an additive 190 in the vicinity of the perovskite.

In some embodiments of the present disclosure, a first end-state may correspond to a perovskite-containing phase 150 that includes a collection of $FA_2BX_4$ perovskite having a substantially 1D crystalline form, surrounded by a second phase 160 that includes a relatively low concentration of FAX molecules and water as a switching molecule 180. As described above, the B-cation of the perovskite may include at least one of lead or tin. The presence of the switching molecule 180, water, which increases the H-bonding in the vicinity of the perovskite, induces the neighboring 1D $FA_2BX_4$ perovskite crystals to merge, resulting in the formation of a first intermediate state having a more ordered crystalline form defined by $FA_3BX_7$. This transformation may be represented by Reaction (2),

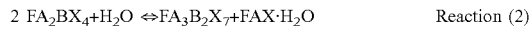

$$2\ FA_2BX_4 + H_2O \Leftrightarrow FA_3B_2X_7 + FAX \cdot H_2O \qquad \text{Reaction (2)}$$

where the FAX molecules formed are transferred into the second phase 160 of FAX and water (and in some embodiments of the present disclosure, an additive 190 such as DMSO). H-bonding can also shift the thermodynamic equilibrium of Reaction (1) to the left, where perovskite precursor is transferred to the second phase. Further addition of the switching molecule in the vicinity of the perovskite may induce neighboring perovskite layers defined by $FA_3B_2X_7$ to merge, resulting in the formation of a second intermediate state having a more ordered crystalline form defined by $FA_4B_3X_{10}$. This transformation may be represented by Reaction (3),

$$3FA_3B_2X_7 + H_2O \Leftrightarrow 2FA_4B_3X_{10} + FAX \cdot H_2O \qquad \text{Reaction (3)}$$

where the FAX molecules formed are transferred from the perovskite-containing phase 150 into the second phase 160 of perovskite precursor 170 (e.g. FAX) and switching molecule 180, e.g. water. Further addition of the switching molecule 180, in the vicinity of the perovskite-containing phase 150 may induce neighboring perovskite layers defined by $FA_4B_3X_{10}$ to merge, resulting in the formation of additional intermediate states, having progressively more order moving towards the end-state of a perovskite having a substantially 3D crystalline form defined by $FABX_3$. Each of Reactions (1) through (3) illustrate reversible reactions between perovskites having different crystalline forms, where the individual elements are balanced by the production or consumption of a perovskite precursor molecule, AX in general, and FAX in particular. Referring again to FIG. 4A, as a perovskite changes between different crystalline forms, having different dimensionalities (e.g. 1D, 2D, and 3D), layers, chains, and/or octahedral units of perovskite merge or split, where the basic perovskite building blocks are separated by the second phase 130 containing at least one of switching molecules 180, additives 190, and/or perovskite precursors 170, e.g. AX.

In some embodiments of the present disclosure, a perovskite used in a device may be reversibly switched between a first crystalline form having a first state that is relatively opaque to light (or portion of light defined by one or more wavelengths) and a second crystalline form having a second state that is relatively transparent to light (or a portion of light). In the case of window applications, the change in light transmittance between the two states may correspond to at least one wavelength in the visible spectrum of light.

In some embodiments of the present disclosure, a switching molecule 180 may include at least one of water and/or an alcohol, although other molecules may be used. As described herein, a perovskite 200 may be controllably and reversibly switched between a relatively opaque crystalline form and a relatively transparent crystalline form by the manipulation of a controllable process parameter. For example, the relative humidity (i.e. the concentration of the water present in a carrier gas such as air and/or an inert gas such as helium and/or argon) in the device may be controlled by changing the temperature and/or pressure within the device, thereby changing the amount (e.g. concentration) of the switching molecules (e.g. water) present in the local environment of the perovskite, thereby influencing the hydrogen-bonding capacity of the system, and the availability of the perovskite to accept/reject perovskite precursor to cause a dimensionality change in the perovskite, as described above.

In other words, by reversibly switching a condition of a device between suitable settings (e.g. a relatively high temperature and a relatively low temperature and/or a relatively high pressure and a relatively low pressure, etc.), the relative presence or relative absence of the switching molecule available to interact with a perovskite may enable the reversible switching of the perovskite material between a first crystalline form having a relatively high dimensional network (e.g. at least one of a 2D network such as $A_2BX_4$ and/or $A_3B_2X_7$ and/or a 3D network such as $ABX_3$) and a second crystalline form having a relatively low dimensional network (e.g. at least one of a 0D network such as $A_4BX_6$ and/or a 1D network such as $A_3BX_5$). As a result the perovskite and the device containing the perovskite may be reversibly switched between a first relatively opaque state and a second relatively transparent state, respectively, and/or between a first colored state and a second colored state or from a first opaque state to a more opaque state. Again, in some embodiments of the present disclosure, the reversible switching between crystalline forms may result in the reversible switching between a first substantially less transparent state of the perovskite to a second transparent state of the perovskite. In some embodiments of the present disclosure, the reversible switching between crystalline forms may result in the reversible switching of the perovskite between a first colored state and a second colored state.

For the example of two specific perovskite crystalline forms, 0D to 3D, and their corresponding states, relatively transparent to relatively opaque, this reversible switching behavior can be represented by Reaction (4) below:

Reaction (4)

Figure 5:
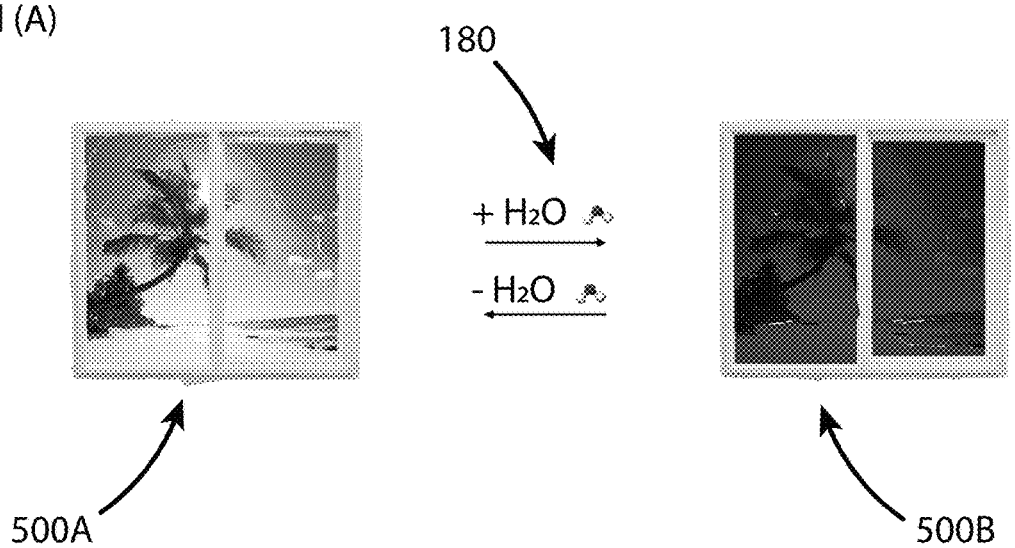
FIG. 5 illustrates a switchable device (Panel A) resulting from a switchable perovskite (Panel B), according to some embodiments of the present disclosure.
Figure 5:
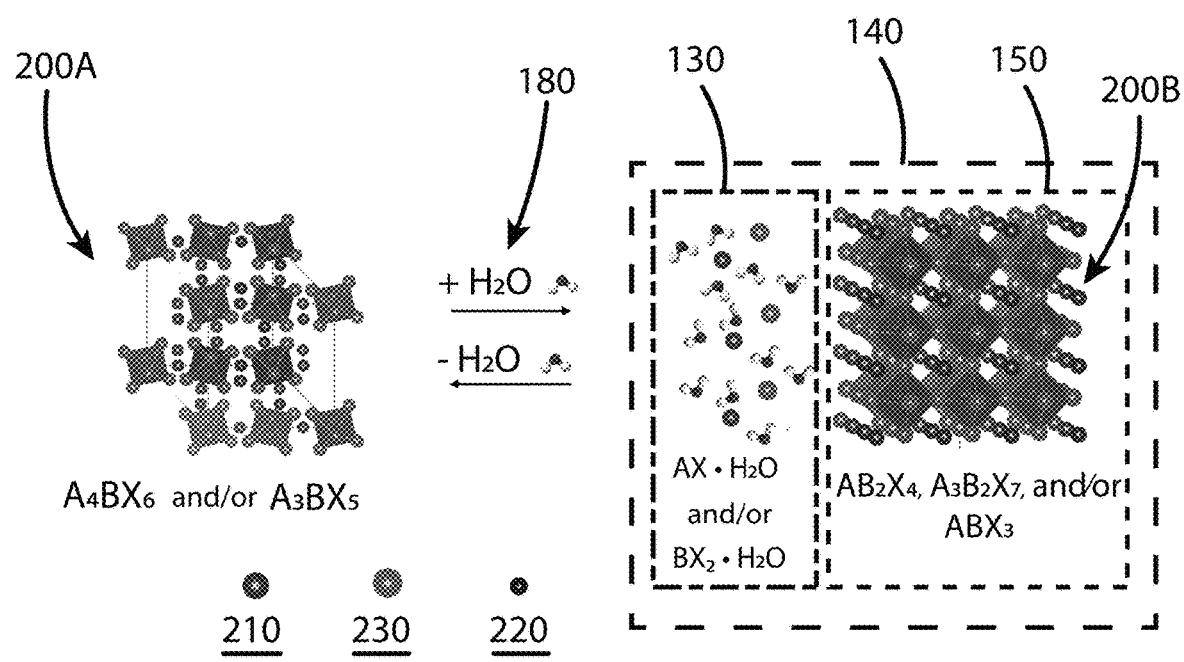

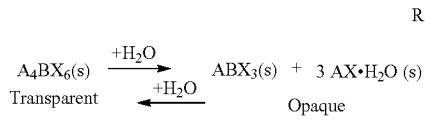

$$A_4BX_6(s) \underset{+H_2O}{\overset{+H_2O}{\rightleftarrows}} ABX_3(s) + 3\,AX{\cdot}H_2O\,(s)$$
Transparent  Opaque Reaction (4) is summarized schematically in FIG. 5. Panel (A) of FIG. 5 illustrates a perovskite-containing device 500, a switchable window, having a substantially transparent state (e.g. a first state) 500A and a substantially opaque state (e.g. a second state) 500B. The device 500 is capable of being reversibly switched between the first state 500A and the second state 500B, as a result of the absence or presence (or relative concentrations) of a switching molecule 180, e.g. water, in the vicinity of the perovskite, respectively, that influences the perovskite 200 contained in the device 500 to switch between crystalline forms and, as a result, to switch between states (e.g. 500A and 500B). In this example, the switching molecule 180 is water in the vapor and/or gas state. In the absence (or at a relatively low concentration) of the switching molecule 180, the perovskite 200 and hence, the device, remains in a relatively transparent state 500A, whereas upon the addition (or change to a relatively high concentration) of the switching molecule 180, the perovskite/device switches to a relatively opaque state 500B.

Upon removal (or lowering of the concentration) of the switching molecule 180, the perovskite/device switches back from the relatively opaque state 500B to the relatively transparent state 500A. So as described herein, the transparent state 500A may correspond to a first end-state and the opaque state 500B may correspond to a second end-state, with a continuum of states bracketed between the two end-states. In addition, the trend may occur in reverse depending on the identity of the elements in the specific perovskite form as well as the identity of the switching molecule. For example, when a high concentration of a switching molecule is added to a 3D perovskite (e.g. α-ABX$_3$ such as MAPbI$_3$, β-ABX$_3$ such as CsPbI$_3$, and/or γ-ABX$_3$ such as CsPbI$_{3-x}$Br$_x$), the perovskite may switch to a transparent state 500A by converting to a 1D form (e.g. Hexagonal δ-ABX$_3$ such as FAPbI$_3$ or Orthorhombic δ-ABX$_3$ such as CsPbI$_3$). This transformation to different 3D perovskite forms may also be achieved by the addition of energy/heat to the perovskite, as shown in FIG. 4A.

Panel (B) of FIG. 5 illustrates the mechanism previously presented above in and illustrated in FIG. 4A. Again, a switching molecule 180 of water, a perovskite precursor 170 (e.g. AX) and a perovskite 200 may interact to induce reversible changes to the perovskite from a first essentially 0D crystalline form 200A in the absence (or the relatively low concentration) of the switching molecule 180, to a perovskite having a second essentially 2D and/or 3D crystalline form 200B in the presence of the switching molecule 180 (e.g. water in this example, with other examples including alcohols such as methanol, ethanol, and/or isopropylalcohol). In the absence of the switching molecule 180, the perovskite may have a first crystalline form 200A that is substantially a 0D and/or 1D network; e.g. Cs$_4$SnI$_6$ and/or (MA)$_3$PbBr$_5$ respectively. However, upon the addition of the switching molecule 180, the switching molecule 180 may interact with the first crystalline form 200A, 0D and/or 1D, of the perovskite such that at least one of the X-anions 230, the A-cations 210, and/or the B-cations 220 are removed from the first crystalline form 200A, resulting in the formation of a mixture 140 of the perovskite in a second crystalline form 200B, having at least one of a 2D network and/or a 3D network as a first phase, e.g. Cs$_2$SnI$_4$ (2D) and MA$_2$PbBr$_4$ (2D) or CsSnI$_3$ (3D) and MAPbBr$_3$ (3D), and contained within a second phase 160 made up of a combination of switching molecules 180 associated with perovskite precursors 170, e.g. AX and/or B$_2$X species, that were released from the first perovskite crystalline form 200A. In some embodiments of the present disclosure, the perovskite having a second crystalline form 200B may be essentially insoluble with the second phase 130 mixture of water, AX and/or B$_2$X species (i.e. perovskite precursors). As described in more detail below, a second phase 160 made up of water and perovskite precursors 170 may define a mixture 140 contained in the pores and/or spaces 130 of a scaffold 120, which altogether form a composition 110 (e.g. in the form of a film) positioned within a device (e.g. a switchable window.)

In some embodiments of the present disclosure, a perovskite having a first crystalline form with a corresponding relatively transparent first state (in the absence of a switching molecule, e.g. water or ethanol) may include perovskites having at least one of a 0D network and/or a 1D network. Examples include at least one of an iodide-based composition, such as MA$_4$PbI$_6$ (where MA is methylammonium), Cs$_4$PbI$_6$, FA$_4$PbI$_6$ (where FA is formamidinium), and mixtures of A-cations such as MA$_2$FA$_2$PbI$_6$, CsFA$_3$PbI$_6$, and/or MA$_3$FAPbI$_6$. Some embodiments may include bromide and/or chloride compositions (FA$_4$PbCl$_6$, MA$_3$FAPbBr$_6$) and halide mixtures such as MA$_2$FA$_2$PbI$_3$Br$_3$ and/or CsFA$_3$PbI$_5$Cl. Examples of 2D perovskite are C$_4$N$_2$H$_{14}$PbBr$_4$ and (AD)Pb$_2$Cl$_5$] (AD=acridinium). Examples of 1D perovskites are 6-FAPbI$_3$, δ-CsPbI$_3$, FA$_3$PbI$_5$, and/or Cs$_3$PbIs.

In some embodiments of the present disclosure, a perovskite having a second crystalline form with a corresponding relatively opaque second state (in the presence of a switching molecule, e.g. water) may include perovskites having at least one of a 2D network and/or a 3D network. Examples of 2D perovskites include MAPb$_2$I$_5$, CsSn$_2$I$_5$, FAPb$_2$I$_5$, MA$_2$PbI$_4$, FA$_2$PbI$_4$, Cs$_2$PbI$_4$, MA$_3$Pb$_2$I$_7$, Cs$_3$Pb$_2$I$_7$, FA$_3$Pb$_2$I$_7$, MA$_4$Pb$_3$I$_{10}$, Cs$_4$Pb$_3$I$_{10}$, FA$_4$Pb$_3$I$_{10}$, MA$_{1-x}$FA$_x$Pb$_2$I$_5$(0≤x≤1), Cs$_{1-x}$FA$_x$Pb$_2$I$_5$(0≤x≤1), MA$_{1-x}$FA$_x$Pb$_2$I$_5$(0≤x≤1), FAPb$_2$Cl$_5$, MA$_{1-x}$FA$_x$Pb$_2$Br$_5$, MA$_{1-x}$FA$_x$Pb$_2$I$_3$Cl$_2$, and/or MA$_{1-x}$FA$_x$Pb$_2$Br$_5$. Accordingly, examples of 3D perovskites 100B include α-MAPbI$_3$, α-CsPbI$_3$, α-FAPbI$_3$, α-FAPbBr$_3$, α-MAPbI$_2$Br, α-FASnI$_3$, α-MASnI$_{3-x}$Br$_x$ (0≤x≤3), α-FAPbI$_{3-x}$Cl$_x$ (0≤x≤3), β-CsPbI$_3$, γ-CsPbI$_{3-x}$Br$_x$, β-Cs$_{1-x}$FA$_x$Pb$_2$I$_5$(0≤x≤1), γ-MA$_{1-x}$FA$_x$Pb$_2$I$_5$ (0≤x≤1) etc.

As stated above, a switching molecule 110 suitable for some embodiments of the present disclosure includes at least one of water and/or an alcohol such as methanol, ethanol, propanol, and/or butanol. However, other switching molecules 110 may be used in place of and/or in addition to water, including at least one containing amine (e.g. ammonia, methylamine, dimethylamine, ethylamine, aniline, pyridine, ethanolamine, oleylamine, etc.) and/or carboxylic acid (e.g. formic acid, acetic acid, propionic acid, carbonic acid (carbon dioxide+water), oleic acid, 3-mercaptopropionic acid etc.) and/or thiol (e.g. dihydrogen sulfide (H$_2$S), methanethiol, ethanethiol, propanethiol, butanethiol, ethylenediol, octanedithiol, etc.) and/or thiocarboxylic acid (e.g. thioformic acid, thioacetic acid, etc.) functional groups.

Figure 6A:
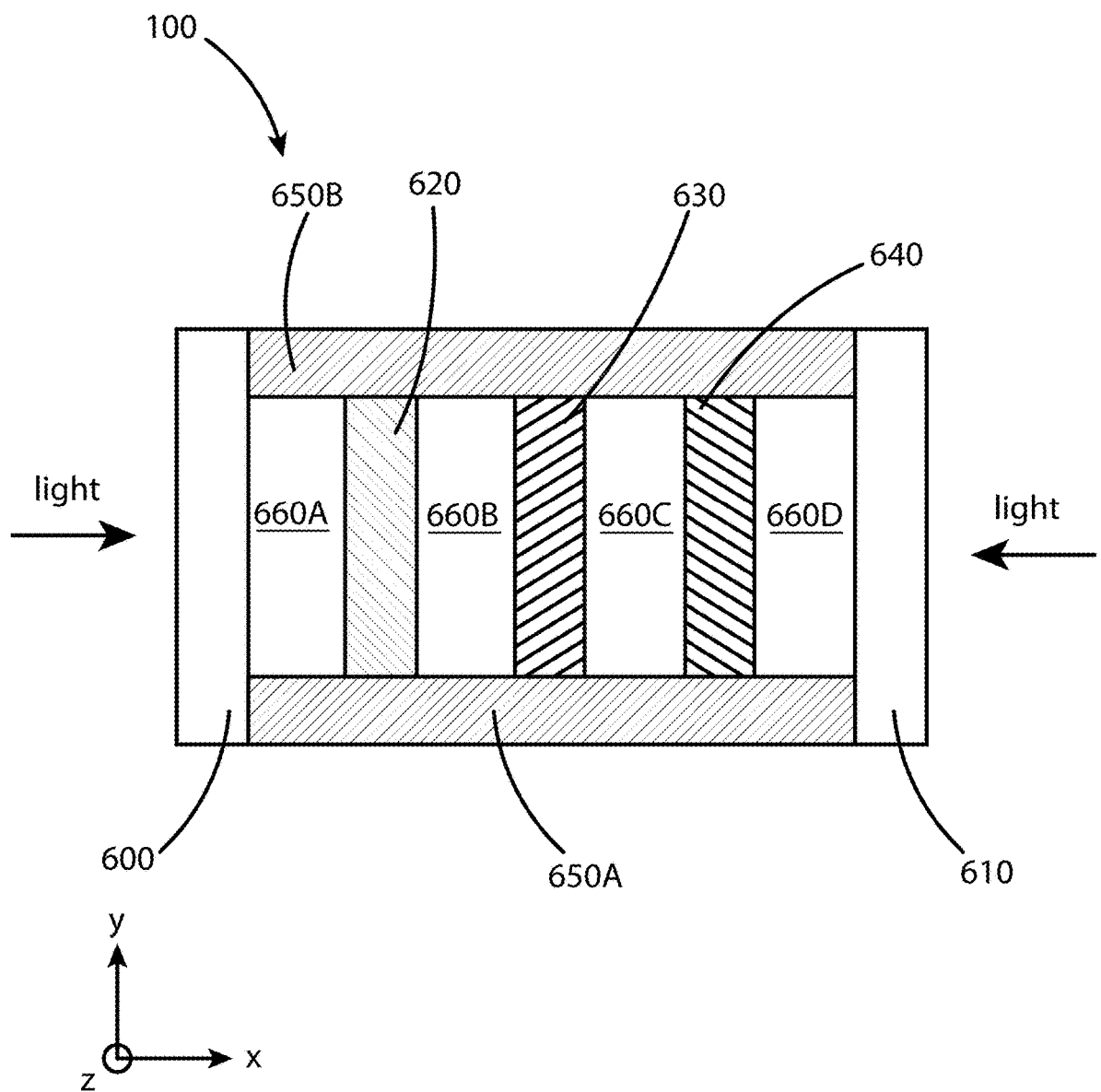
FIGS. 6A-6C illustrate devices that utilize switchable perovskites, according to some embodiments of the present disclosure.

FIG. 6A illustrates a cross-section of an exemplary device 100, in the xy-plane, that utilizes at least some of the elements and features described above. This is provided for illustrative purposes and should not be considered limiting. FIG. 6A illustrates the thicknesses of each element in the x-direction, and the heights of each element or feature, in the y-direction. Each element also has a width dimension, in the z-direction. Thus, as shown in FIG. 6A, light (e.g. sunlight from an outside environment) may be directed to a first transparent layer 600 (e.g. glass), where substantially all of the light is transmitted through the first transparent layer 600 to the PV stack 620, where depending on its state (relatively opaque or relatively transparent), either a first amount (e.g. a relatively small amount when opaque) of the light is transmitted through the PV stack 620, or a second amount (e.g. a relatively large amount when transparent) of light is transmitted through the PV stack. In some embodiments of the present disclosure, substantially all of the light transmitted through the PV stack 620 may then be transmitted through the remaining gaps (660B, 660C, and 660D), internal elements (630 and 640 described below), and the second layer 610 (e.g. glass) to pass into an internal environment (e.g. a room or compartment).

In the exemplary device 100 of FIG. 6A, the device 100, containing a perovskite, may be reversibly switched between a transparent state and an opaque state as a result of the reversible switching of the perovskite between a first crystalline form and second crystalline form, with a resultant switching between a first state (e.g. transparent) and a second state (e.g. opaque) as described above. The reversible switching of the perovskite, and hence the device, may be achieved by the reversible transfer of at least a switching molecule (e.g. water) to and from the perovskite and/or the local environment around the perovskite. The exemplary device 100 of FIG. 6A includes a number of internal elements (620, 630, 640, and 660) positioned between several outer elements (600, 610, and 650 described below). The inner elements include a photovoltaic (PV) layer 620 that contains, among other things, a perovskite layer capable of reversibly switching between a first crystalline form having 0D and/or 1D network and a second crystalline form having a 2D and/or 3D network, as described above. In this example, adjacent to the PV stack 620, is a reservoir 630 for the switching molecule 180 that, in some embodiments of the present disclosure, is capable of reversibly storing and delivering the switching molecule (e.g. water) used to switch the perovskite between the two crystalline forms; e.g. a 0D and/or 1D network (relatively transparent) and a 2D and/or 3D network (relatively opaque). In some embodiments of the present disclosure, a reservoir 630 for the switching molecule 180 may include any material, solid and/or liquid, capable of physically and/or chemically absorbing the switching molecule used to switch the perovskite, provided the switching molecule storage material is capable of reversibly releasing and reabsorbing/readsorbing the switching molecule. In some embodiments of the present disclosure, as shown in FIG. 6A, a material acting as the reservoir 630 for the switching molecule 180 may be positioned normal to the light path into the device 100, where the material acting as the reservoir 630 for the switching molecule 180 may be substantially transparent to at least the wavelength of light desired to pass through the perovskite and the device 100 (e.g. at least a portion of the visible light spectrum). In some embodiments of the present disclosure, the exemplary device 100 of FIG. 6A may be achieved using a transparent hydrogel as the reservoir 630 for the switching molecule 180.

The exemplary device 100 of FIG. 6A also illustrates a switching element 640. A switching element may have at least two settings. When the switching element 640 is in a first setting, the switching element 640 may induce a material acting as a reservoir 630 for a switching molecule 180 to release the switching molecule (e.g. water) into a gap 660B, thereby raising the concentration of the switching molecule in the local environment of the perovskite contained in the PV stack, thereby causing it to attain a crystalline forming having a 2D and/or 3D network and a corresponding opaque state. When the switching element 640 is in a second setting, the switching element 640 may induce the material acting as the reservoir 630 for the switching molecule 180 to reabsorb/readsorb the switching molecule (e.g. water), thereby reducing the concentration of the switching molecule in the local environment of the perovskite, thereby causing it to attain a crystalline form having a 0D and/or 1D network and a corresponding transparent state. As described above, this change in the perovskite material may also be accompanied by a color change.

For example, a switching element 640 may be a wire mesh of resistive heating elements, such that the mesh is effectively transparent to light. The wire mesh switching element 640 may have a first "on" setting that causes the wire mesh to heat up. The heated wire mesh may then transfer heat (by at least one of conduction, convection, and/or radiation) to a material acting as the reservoir 630 for the switching molecule 180, thereby raising its temperature, resulting in the release of the switching molecule (e.g. water) into the gap 660B between the material acting as the reservoir 630 of the switching molecule 180 and the perovskite-containing PV stack 620. The molecules released from the material acting as the reservoir 630 of the switching molecule 180, may then increase the local concentration of the switching molecule relative to the perovskite, which may then switch from a first crystalline form having a 0D and/or 1D network which a relatively transparent state, to a second crystalline form having a 2D and/or 3D network and a corresponding relatively opaque state (or vice-versa). As described above, this change in the perovskite may also be accompanied by a color change. The wire mesh switching element 640 may have a second "off" setting that results in the wire mesh cooling to ambient temperature (e.g. between 20° C. and 30° C.). As a result of the wire mesh cooling, the material behaving as the reservoir 630 for the switching molecule 180 may also cool and reach a new equilibrium that reabsorbs the switching molecule (e.g. water) from the gap 660B between the perovskite-containing PV stack 620 and the material (e.g. in the form of a layer) acting as the reservoir 630 for the switching molecule 180, lowering the switching molecule's concentration and thereby switching the perovskite (and the device) from the opaque state to the transparent state.

Referring again to FIG. 6A, a perovskite-containing PV stack 620, a layer of material acting as the reservoir 630 of the switching molecule 180 (e.g. in the form of a layer), and/or the switching element 640 may be positioned within the device 100 and separated from the external environment by a first transparent layer 600 and a second transparent layer 610 in the vertical dimension, and by a first spacer 650A and a second spacer 650B in the horizontal dimension. For example, a first transparent layer 600 may be a pane of glass and/or a sheet of plexiglass outwardly facing an external environment and a second transparent layer 610 may be a pane of glass and/or sheet of plexiglass inwardly facing an interior environment (e.g. a room within a building). In some embodiments of the present disclosure the first layer 600 and/or the second layer 610 may be constructed of a material that is transparent to visible light such as glass, plexiglass, and/or plastics such as polyethylene terephthalate, polyethylene naphthalate, polyester, and/or polyethylene. A spacer (650A and/or 650B) may, for the example of a window device, be a part of the window's frame and may cover the entire circumference of at least one of the first transparent layer 600, the second transparent layer 610, the PV stack 620, and/or a layer behaving as the reservoir 630 for the switching molecule 210. In some embodiments of the present disclosure, a spacer (650A and/or 650B) may isolate the internal components of the device 100 from the external environment and may prevent the switching molecule 180 from escaping the PV stack 620, the reservoir for the switching molecule 180, and/or the gap 660B.

Further, in some embodiments of the present disclosure, there may be no intervening layers and/or physical barriers, between the perovskite-containing PV stack 620 and the reservoir 630 for the switching molecule (e.g. a layer of material) 180, that may hinder the reversible flow of the molecule used to switch the perovskite between crystalline forms and states. In the example of FIG. 6A, a gap 660B is positioned between the PV stack 620 and the layer of material acting as the reservoir 630 for the switching molecule 180, where the gap 660 may be filled with a medium (e.g. vacuum, gas, and/or liquid) that enables the mass transfer of the switching molecule between the PV stack 620 and a switching molecule source material making up the reservoir 630. In some embodiments of the present disclosure, the PV stack 620 may be at least partially in physical contact with the reservoir 630 for the switching molecule 180, and in further embodiments, the gap 660B may be eliminated altogether by placing a surface of the perovskite-containing PV stack 620 entirely in contact with a corresponding adjacent surface of the reservoir 630 (e.g. a molecule source material made of a hydrogel). FIG. 6A illustrates that in some embodiments of the present disclosure, a device 100 may have more than one gap 660 positioned between its various layers (e.g. 600, 610, 620, 630, and/or 640). In some embodiments of the present disclosure, any one of the gaps (e.g. 660A, 660B, 660C, and/or 660D) may be a substantially empty gap or space; e.g. not containing a gas, liquid, and/or solid. For example, a gap 660 may be at or close to absolute vacuum or at a pressure below one atmosphere of pressure. In some embodiments, a gap 660 may contain a gas, for example, an inert gas such as nitrogen and/or a noble gas. In some embodiments of the present disclosure, a gap 660 between adjacent layers may have a distance between 10 microns and 50 mm. In some embodiments of the present disclosure, a device 100 may include less than four gaps 660. In some embodiments, at least one of the internal elements (620, 630, 640) may be in direct physical contact with one another. Further, in some embodiments of the present disclosure, at least one of the outer elements (600, 610, 650) may be in direct physical contact with at least one of the internal elements (620, 630, 640).

Figure 6B:
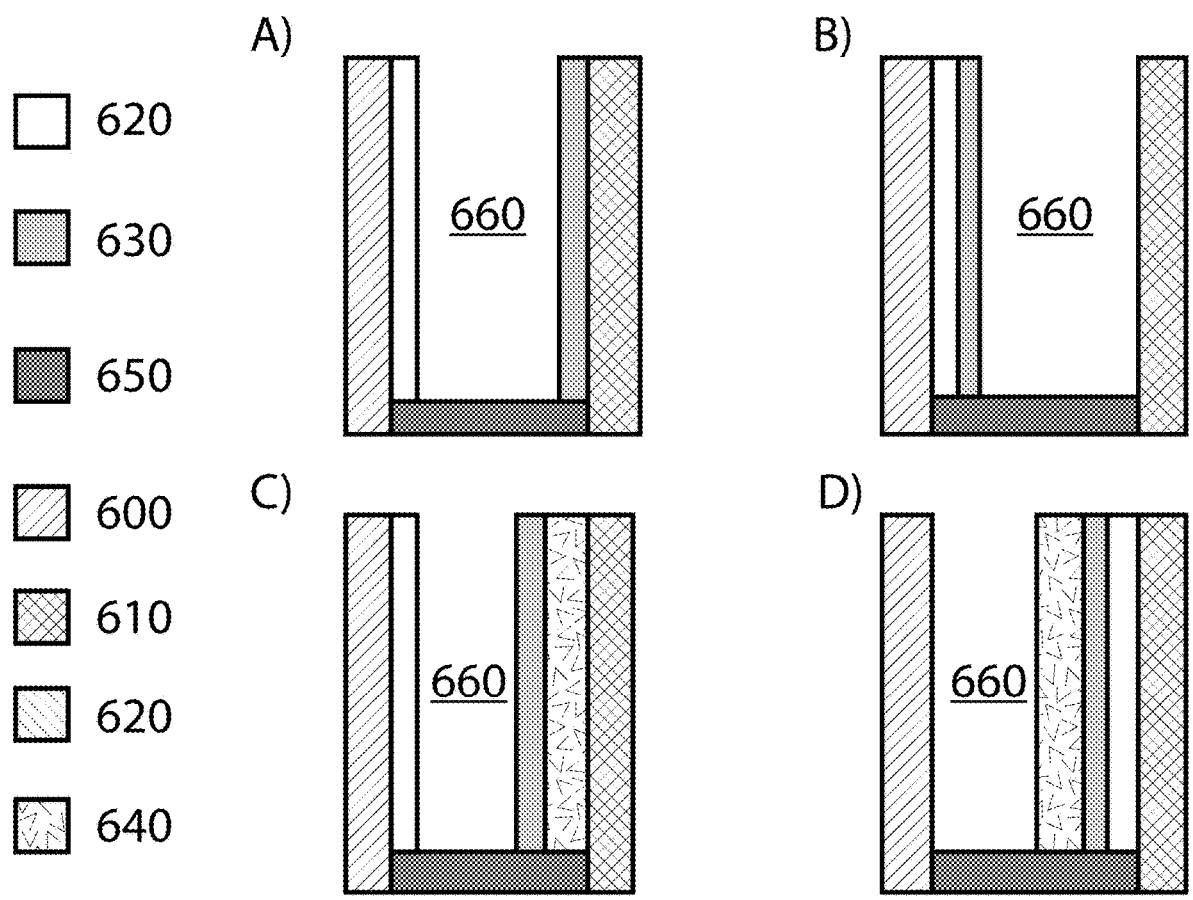
Figure 6C:
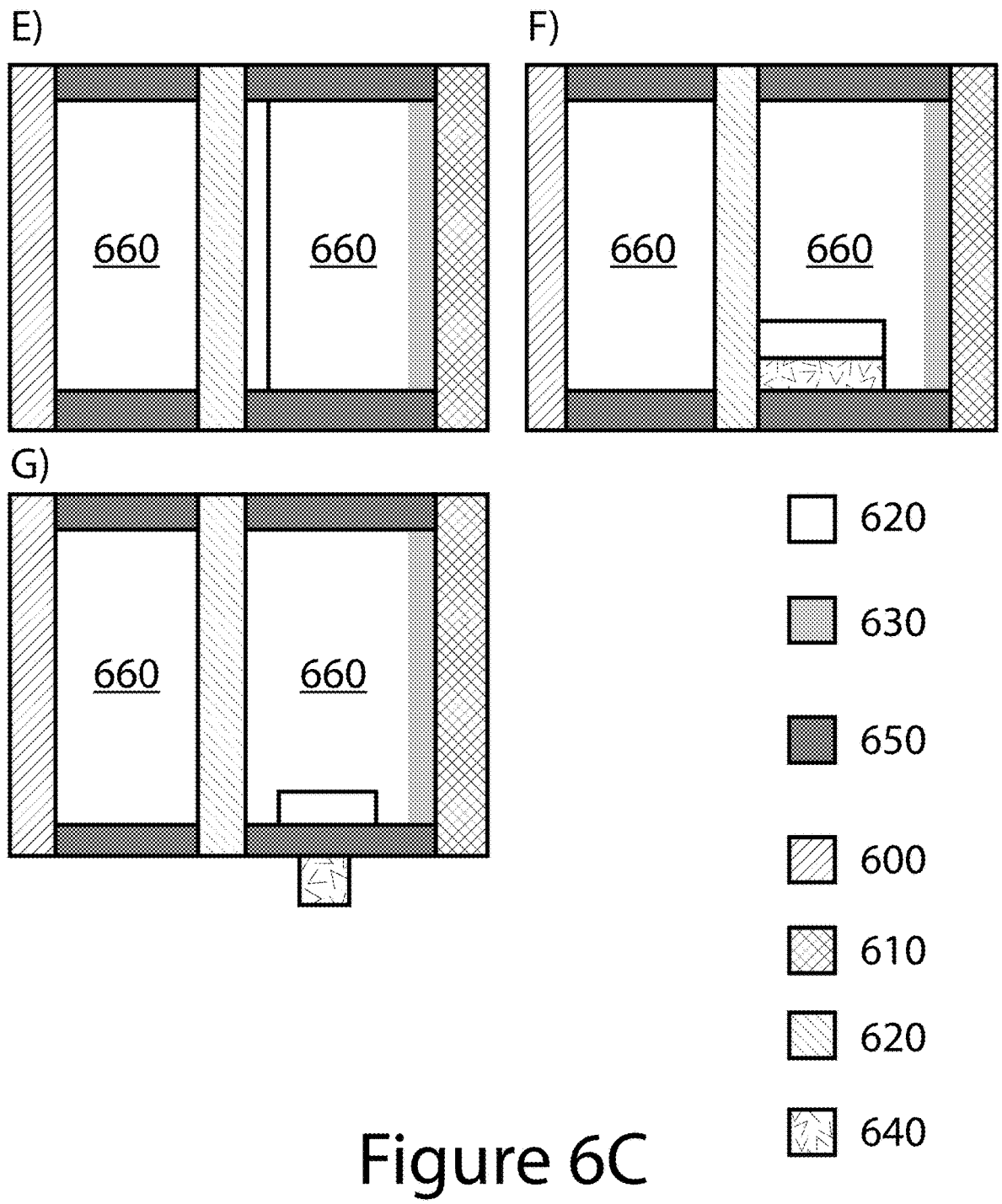

Referring again to FIG. 6A, in some embodiments of the present disclosure, a first transparent layer 600, a second transparent layer 610, and a perovskite-containing PV stack 620 may all be parallel to one another and positioned such that a significant portion of the desired ambient light, present where the device is installed for its intended use, passes through each of the first transparent layer 600, the second transparent layer 610, and the PV stack 620. The other two internal elements, the layer of material acting as the reservoir 630 for the switching molecule 180 and the switching element 640, need not be positioned parallel to the outer first and second layers (600 and 610) and the PV stack 620, and other arrangements fall within the scope of the present disclosure. Referring again to FIG. 6A, in this example, the material acting as the reservoir 630 of the switching molecule 180 is in the form of a layer positioned substantially parallel to the perovskite-containing PV stack 620. This is for illustrative purposes and other embodiments fall within the scope of the present disclosure. For example, a layer of material for reversibly storing the switching molecule (i.e. reservoir) may be placed in a device 100 with its thickness dimension normal to the path of the light passing through the device 100 and to the plane of the PV stack 620. Refer to FIGS. 6B and 6C for additional embodiments of devices that fall within the scope of the present disclosure.

In some embodiments of the present disclosure, a storage material acting as a source for the switching molecule (i.e. a reservoir) may be at least one of a solid adsorbent including at least one of a metal-organic framework, a zeolite, a silica gel, a silica-based composite, an activated carbon, an alumina, and/or a clay-based composite. Further examples include at least one of a porous metal oxide, a polyelectrolyte, a hydrophilic polymer and/or a thermo-responsive hydrogel. The molecular storage materials may reversibly store/release vapor via physical adsorption and/or store/release water via chemical absorption upon cooling/heating.

In some embodiments of the present disclosure, a reservoir 630 for the switching molecule 180 may include a pipe with a valve (not shown) positioned between a storage vessel (e.g. a tank, second pipe, other suitable container, etc.) and the perovskite-containing PV stack 620. When open, the valve may provide the switching molecule 180 to the device 100 via a higher pressure supply of the switching molecule at a first pressure (i.e. setting) that provides the switching molecule 180 at a first concentration sufficiently high to induce the device to obtain an opaque state. In addition, when open, the valve may place the device 100, including the PV stack 620, at a second pressure that is lower than the first pressure (e.g. at a vacuum), such that the switching molecule 180 is substantially removed from the device, and as a result, switches the device to its transparent state. In some embodiments of the present disclosure, a first valve may be connected to a relatively high pressure supply line that provides the switching molecule, and a second valve may be connected to a relatively low pressure line for removing switching the molecule from the device.

In some embodiment of the present disclosure, a switching element 640 may add or remove heat using a solid-state device like a thermoelectric element. In some embodiments of the present disclosure, heat may be added or removed using conduit (e.g. pipes, tubing, etc.) filled with a heat transfer fluid such as water, air, oil, or other heat exchange fluid. Hot or cold fluid may be provided through the pipe to manipulate the state of the switching element 640.

Figure 7:
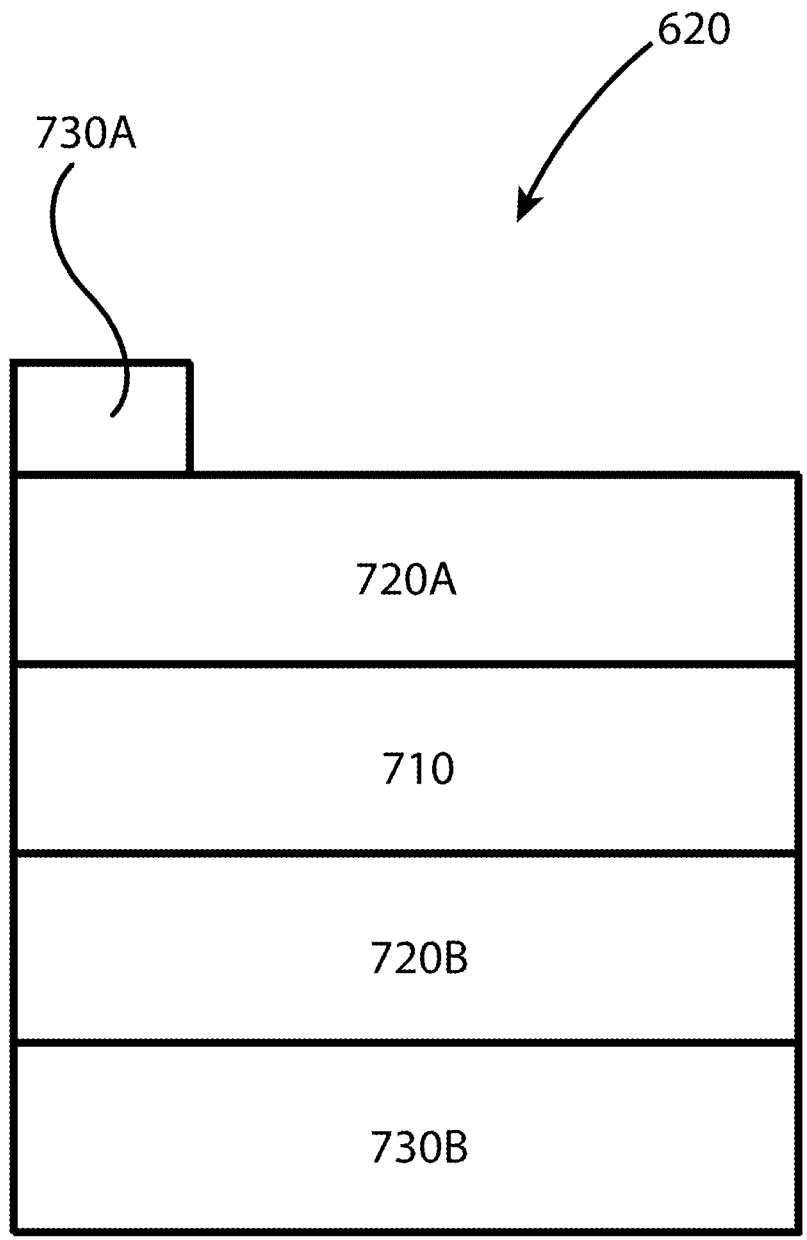
FIG. 7 illustrates a photovoltaic stack that includes a switchable perovskite layer, according to some embodiments of the present disclosure.

FIG. 7 illustrates an example of perovskite-containing PV stack 320 of the exemplary devices shown in FIGS. 6A-6C, according to some embodiments of the present disclosure. The PV stack 620 may include an active layer 710 (e.g. a perovskite-containing layer) positioned between a first charge transport layer 720A and a second charge transport layer 720B. The PV stack 620 may also include a first charge collecting layer 730A electrically connected to the first charge transport layer 720A, and a second charge collecting layer 730B electrically connected with the second charge transport layer 720B. In some embodiments of the present disclosure, an active layer 710 may absorb light to generate a voltage and/or a current, or an active layer 710 may emit light when a voltage and/or current is applied to the active layer 710. The example of FIG. 7 illustrates only one active layer 710. However, it is to be understood that a such a PV stack 620 may include one or more active layers, for example, stacked on top of each other to maximize the amount of the sun's energy that is converted to electricity in a photovoltaic device.

In general, a charge transport layer 720 (720A and/or 720B) may be a hole transport layer or an electron transfer layer to enable the generation of charge separation within the first PV stack 620. In some embodiments of the present disclosure, at least one of the first charge transport layer 720A and/or the second charge transport layer 720B may include a single-walled carbon nanotube (SWCNT) and/or multi-walled carbon nanotube (MWCNT) layer. As used herein, "CNT" includes SWCNTs and MWCNTs. A CNT layer may be doped and/or wrapped in a polymer. The doping may include immersing the SWCNT network in a solution comprising a charge-transfer dopant until a charge carrier (electron or hole) doping level of the SWCNT network is saturated; e.g. having a carrier density between $1\times10^{19}$ and $1\times10^{21}$ per cubic centimeter. The charge carrier doping level of the SWCNT network can be further tuned by immersing the SWCNT network in a solvent to intentionally re-dissolve some of the adsorbed dopant. The charge-transfer dopant may include at least one of triethyloxonium hexachloroantimonate (OA, a p-type dopant), 2,3,5,6-Tetrafluoro-7,7,8,8-tetracyanoquinodimethane ($F_4$TCNQ, a p-type dopant), amines (ammonia, primary, secondary, and tertiary alkyl- or arylamines, n-type dopants), phosphines (n-type dopants), and/or alkali crown ether complexes (n-type dopants). Carbon substitution dopants, such as nitrogen or boron, may also be employed.

In general, a charge collecting layer 730 (730A and/or 730B) may be any suitable, highly conductive material that enables the removal of the charges generated in or provided to the active layer 710. In some embodiments of the present disclosure, at least one of the first charge collecting layer 730A and/or the second charge collecting layer 730B may include at least one of the CNT combinations described above for the charge transport layers (720A and 720B) with a higher dopant density. The specific number, combination, and order of the various layers of a specific PV stack 620 will be dictated by the specific use and/or design requirements of the device.

Figure 8:
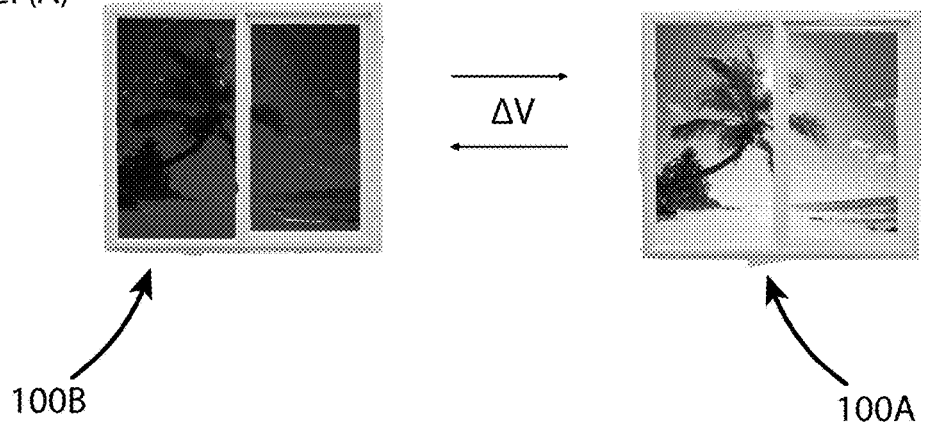
FIG. 8 illustrates a switchable device (Panel A) resulting from a switchable perovskite (Panel B), according to some embodiments of the present disclosure.
Figure 8:
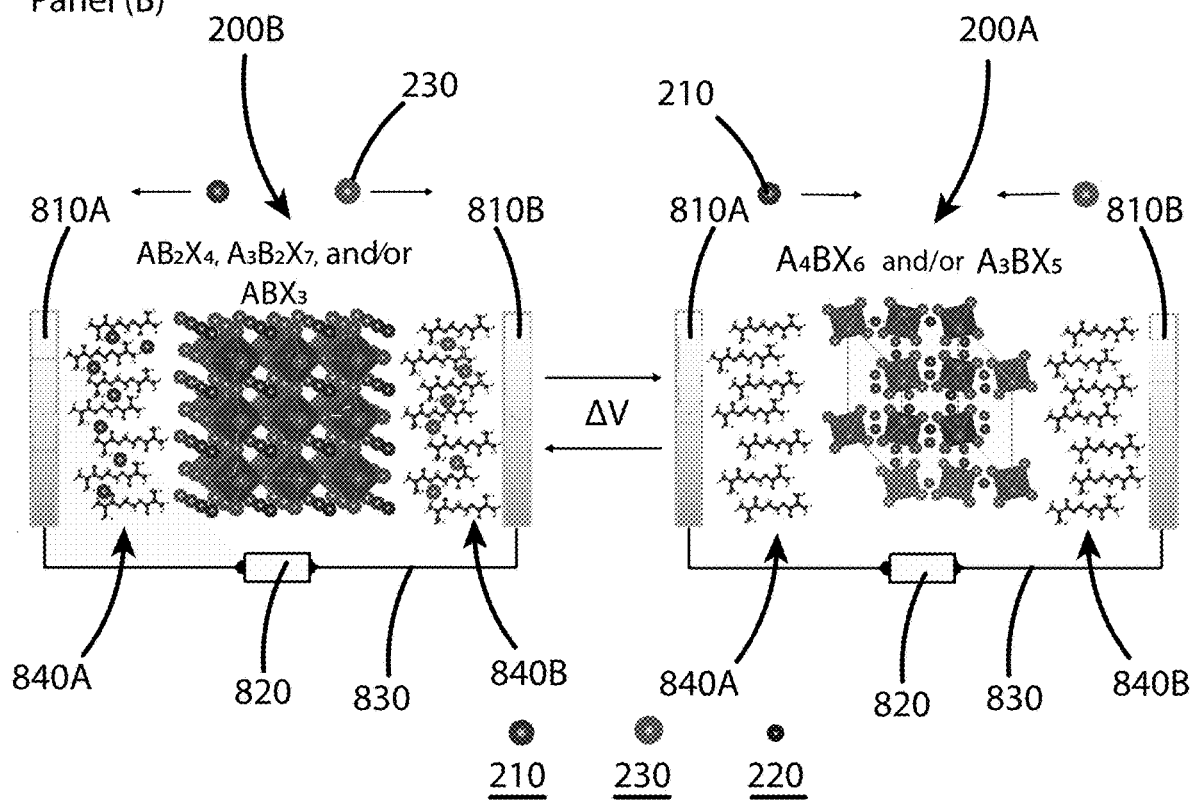

Panel (A) of FIG. 8 illustrates another example of a reversibly switchable device 100 (e.g. window), according to some embodiments of the present disclosure. Referring to Panel (B) of FIG. 8, the device 100 contains a perovskite capable of being reversibly switched between a substantially opaque state where the perovskite is substantially in at least one of a 3D and/or a 2D crystalline form 200B and a substantially transparent state where the perovskite is substantially in at least one of a 0D and/or 1D crystalline form 200A. This switching between different perovskite crystalline forms results in the device 100 reversibly switching between a substantially transparent state 100A and a substantially opaque state 100B. In this example, a mechanism for reversibly switching the perovskite between the two crystalline forms (and, therefore, between the two states) may be electrochromic. Referring again to Panel (B) of FIG. 8, electrochromic switching of the perovskite 200 between transparent and opaque states may be achieved by positioning the perovskite 200 between two transparent electrodes (810A and 810B). The two transparent electrodes (810A and 810B) may then be electrically connected by a conductor 830 (e.g. a wire), with a voltage source 820 electrically connected to the conductor 830 and positioned between the first transparent electrode 810A and the second transparent electrode 810B. In addition, the device 100 may include an electrolyte 840, where a first portion of the electrolyte 840A may be positioned between the first transparent electrode 810A and the perovskite 200 and a second portion of the electrolyte 840B may be positioned between the second transparent electrode 810B and the perovskite 200. In some embodiments of the present disclosure, an electrolyte 840 may include a solid electrolyte that is inorganic (e.g. $RbAg_4I_5$, $\beta$-alumina, etc.) or organic (e.g. polyethylene oxide, polyaniline, or polyvinylidene fluoride), a liquid electrolyte (e.g. an iodide salt such as lithium iodide dissolved in acetonitrile, 1,3-dioxolane, dimethoxyethane) and/or a gel electrolyte (e.g. polymers such as polyethylene oxide, polyaniline, or polyvinylidene fluoride with salts such as lithium iodide or cesium iodide and a solvent such as ethylene carbonate, propylene carbonate, diethyl carbonate (DEC), dimethyl carbonate, ethyl methyl carbonate, and tetrahydrofuran).

Referring again to FIG. 8, the device 100 may be reversibly switched between the transparent state and the opaque state by at least one of, using the voltage source 820, turning a voltage on and off, and/or switching the polarity of a voltage applied across the two transparent electrodes (810A and 810B). For example, at a first voltage condition, the first transparent electrode 810A may attain a significant negative charge, while simultaneously the second transparent electrode 810B may attain a significant positive charge. As a result, at least some of A-cations 210 may migrate out of the perovskite, previously significantly in the 0D and/or 1D crystalline form, into the first portion of electrolyte 840A towards the negatively charged first transparent electrode 810A. Simultaneously, at least some of the X-anions 230 may migrate out of the perovskite, previously significantly in the 0D and/or 1D crystalline form, into the second portion of electrolyte 840B towards the positively charged second transparent electrode 810B. As a result of the voltage induced migration of A-cations 210 and X-anions 230 out of the perovskite crystal structure, into the electrolyte 840, the perovskite may switch from a substantially 0D and/or 1D crystalline form having a substantially transparent state 100A to a substantially 2D and/or 3D crystalline form having a substantially opaque state.

The device 100 may be switched back to its original crystalline form and state by at least one of removing the first voltage, reducing the first voltage, and/or switching the polarity of the voltage across the first transparent electrode 810A and the second transparent electrode 810B. As a result of this switching, the first transparent electrode 810A may attain at least one of a smaller negative charge, a neutral charge, and/or a positive charge, while simultaneously the second transparent electrode 810B may attain at least one of a smaller positive charge, a neutral charge, and/or a negative charge. As a result, at least some of A-cations 210 may migrate from the electrolyte 840A back into the perovskite, previously significantly in the 3D and/or 2D crystalline form. Simultaneously, at least some of the X-anions 230 may migrate from the electrolyte 840B back into the perovskite, previously significantly in the 0D and/or 1D crystalline form. As a result of this voltage change induced migration of A-cations 210 and X-anions 230 from the electrolyte 840 into the perovskite crystal structure, the perovskite may switch from the substantially 2D and/or 3D crystalline form having a substantially opaque state 200B to the substantially 0D and/or 1D crystalline form having a substantially transparent state 200A. In some embodiments of the present disclosure, a voltage for switching a device as described herein may be between 0.01 volts and 10 V volts.

Further, as described herein, formamidinium-based (FA-based) perovskites may be switched between a first, opaque, higher-dimensionality crystalline form in the absence of a switching molecule (e.g. water) and a second transparent, low-dimensionality crystalline form in the presence of the switching molecule. In some embodiments of the present disclosure, the switching may be accompanied by a corresponding change in color (i.e. chromism). As shown herein, layered FA-based metal halide perovskites of the general formula $FA_{n+1}PbnX_{3n+1}$ (X=I, Br) including $FA_2PbI_4$ were fabricated having reversible chromism as a result of reversible switching between two end-states (i.e. two crystalline forms with corresponding states). As shown herein, a FAX–Z—$H_2O$ mixture (see Panel B of FIG. 3), where Z represents an additive (e.g. a polar aprotic solvent) such as dimethyl sulfoxide (DMSO), provides a reservoir (see FIG. 6A) for FAX molecules, such that FAX may reversibly transfer between the reservoir and neighboring FA-based perovskite, as a result of the reversible exposure of the perovskite to a switching molecule, e.g. water, as described above.

Figure 9:
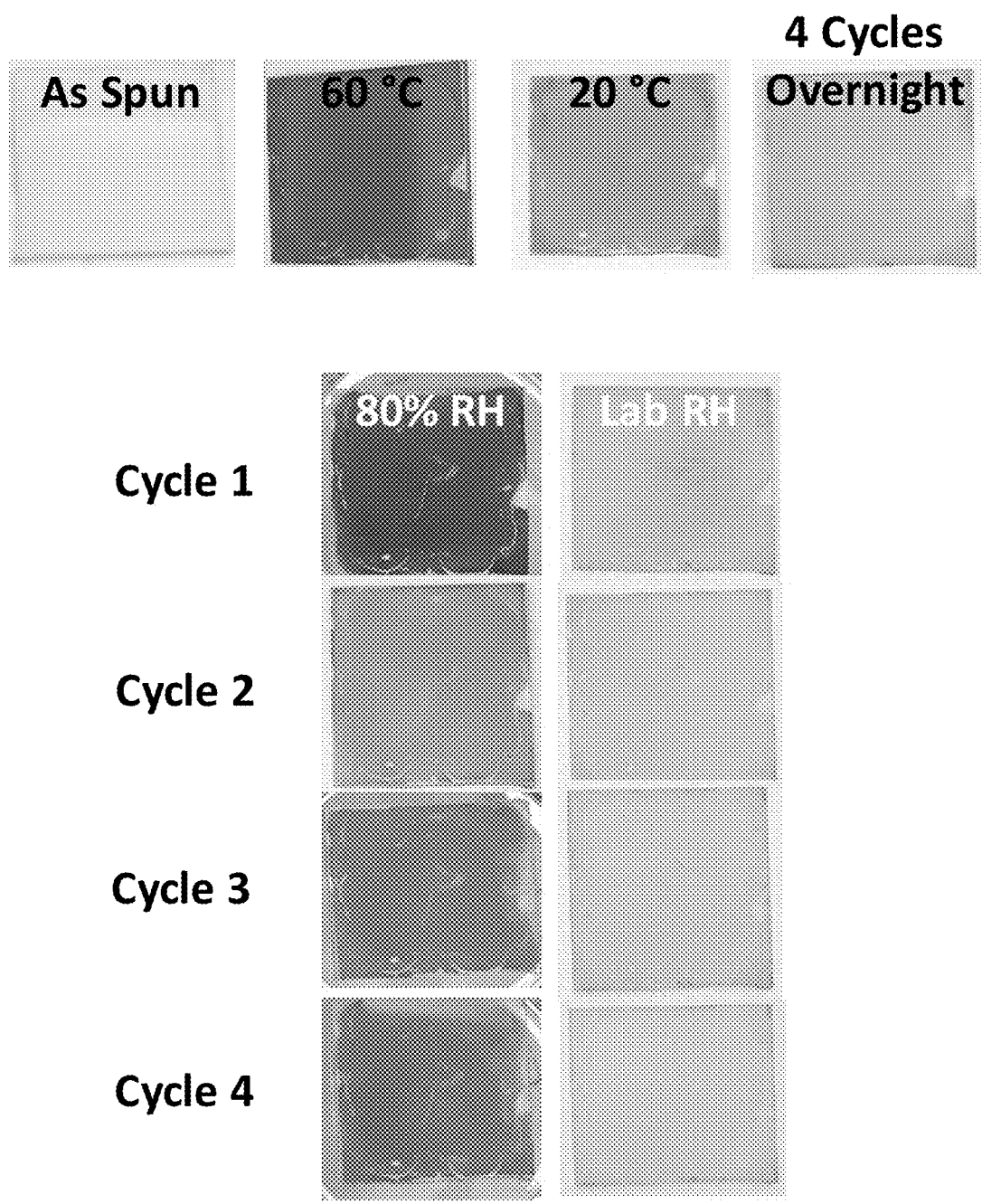
FIG. 9 illustrates an example of a switchable perovskite that includes $MA_4PbI_6$, according to some embodiments of the present disclosure.

FIG. 9 illustrates an example of the perovskite switching behaviors described herein. In this example, subjecting a $MA_4PbI_6$ perovskite in a substantially 0D crystalline form to 80% relative humidity (RH) by the addition of water (i.e. the switching molecule) via a humidifier in a glovebox, transformed the perovskite to a $MAPbI_3$ perovskite having a substantially 3D crystalline form, as evidenced by the dark color. When the RH was reduced by the removal of water via a dehumidifier in a glovebox, the 3D $MAPbI_3$ crystalline form switched back into the 0D $MA_4PbI_6$ perovskite crystalline form, as evidenced by the transparent color. FIG. 10A illustrates the optical properties of the $MA_4PbI_6$ perovskite in the 0D crystalline form that exhibited minimal absorbance of visible light with weak photoluminescence (see FIGS. 10B and 10C, respectively). FIG. 11 illustrates the switching behavior in the case of $FA_4PbI_6$ perovskite. When in a 0D crystalline form, the $FA_4PbI_6$ perovskite was yellow under ambient conditions, but switched into a dark brown 3D crystalline form, $FAPbI_3$ perovskite, when exposed to 80% RH (i.e. using water as the switching molecule). This perovskite then switched back into the yellow 0D $FA_4PbI_6$ crystalline form upon removal of the moisture.

FIGS. 12A-12D illustrate results obtained for a device that included a $FA_4PbI_6$ perovskite layer, according to some embodiments of the present disclosure. The $FA_4PbI_6$ layer was prepared by spin-coating a precursor solution of $PbI_2$ and FAI in DMSO with a 1:4 ratio onto an $Al_2O_3$ nanoparticle scaffold. As shown in FIG. 12A, the color of the perovskite layer depended on the relative humidity (i.e. concentration of switching molecule, water) caused by a humidity-induced transition between 0D, 1D, 2D and 3D networks (i.e. crystalline forms). When exposed to increasing relative humidity (RH), the color of the perovskite layer switched from yellow to orange to reddish brown and then to colorless. These color changes were reversible when exposed to decreasing RH. Thus, in some embodiments of the present disclosure, hygrochromic properties are only observed when the $FAI:PbI_2$ ratio is greater than 3.0:1.0, which suggests that enough FAI must be present to form both the second phase and a layered $FA_{n+1}Pb_nI_{3n+1}$ in the perovskite-containing phase.

Referring to FIGS. 12B, 12C, and 12D, the optical properties of each color were measured by subjecting the $FA_4PbI_6$ perovskite, contained in a quartz cuvette, to varying levels of RH by changing the flow of moisture from a humidifier in a humidity glovebox. After exposure, the cuvette was closed with a cap to maintain the RH at the desired level. The perovskite was yellow at 40% RH with absorption peaks at 450 and 493 nm. These peaks gradually decreased in the orange perovskite, which resulted at 80% RH. Exposure to 90% RH caused the perovskite to turn colorless with an absorption peak located outside the visible spectrum at 387 nm. Reducing the RH to about 60% caused the perovskite to switch to a reddish-brown color that exhibited a significantly red-shifted absorption. The perovskite switched to orange at about 50% RH and then to yellow at less than about 40% RH. The photoluminescence (PL) red shifted between 540-650 nm when exposed to higher RH. The PL then dramatically shifted to blue, 450 nm, at 90% RH, which is consistent with the absorption shifts. Lowering the RH caused the PL to shift back into the 540-650 nm region. These results demonstrate that the optical properties of $FA_4PbI_6$ perovskite (e.g. in the form of films) can be manipulated upon exposure to different RH levels. $FA_4PbI_6$ perovskite may undergo dramatic changes in their optical properties at different RH levels accompanied by color changes between yellow, orange, reddish brown, and colorless.

As shown herein, the $FA_{n+1}Pb_nX_{3n+1}$ perovskites show a brilliant array of coloration, e.g. numerous intermediate states between the end-states, upon exposure to a switching molecule. The visual appearance of $FA_{n+1}Pb_nX_{3n+1}$ perovskites ranged from colorless to yellow, orange, red, and deep brown (see FIG. 13). The mechanism of color change, as described above, may be due to a dynamic equilibrium between a perovskite precursor, e.g. FAX salt pairs, intercalated into a $FA_{n+1}Pb_nX_{3n+1}$ perovskite-containing phase and/or transferred to an adjacent second phase, e.g. an amorphous domain composed of at least one of FAX, additive (i.e. solvent Z such as DMSO), and the switching molecule water (see FIG. 1 and Reaction (1)). The FAX-containing second phase solvates and stores the FAX that has been removed from the $FA_{n+1}Pb_nX_{3n+1}$ perovskite.

As shown herein, these transformations of FA-containing perovskite layers can switch the perovskite, and the device containing the perovskite, between multiple colored states, including yellow, orange, red, brown, and white/colorless/transparent. Furthermore, the 2D crystalline forms of these perovskite layers can lead to significantly improved moisture stability as evidenced by repeated and reversible color cycling between 20-82% RH, storage at ≤40% RH in air for months, and storage at 75% RH in air for over a month (see FIG. 14).

In some embodiments of the present disclosure, some FA-based metal halide perovskite films were synthesized by spin-coating a precursor solution containing 3 M FAX and 0.75 M $PbX_2$ (4:1 FAX:$PbX_2$; X=I, Br) in DMSO onto a 1.58±0.2 μm-thick $Al_2O_3$ nanoparticle (NP) scaffold. Annealing the resultant film at 60° C. for 10 minutes converted the perovskite layer from transparent to colored ranging from bright yellow (100% I) to white (100% Br) depending on the halide ratio (see FIG. 15A). As-prepared perovskites exhibited compositionally tunable optical properties that varied linearly as the halide ratio was varied from 100% iodide to 100% bromide (see FIG. 15B). As-prepared perovskites exhibited two absorption peaks: a strong excitonic peak tunable between 450-360 nm and an absorption edge tunable between 500-390 nm that are consistent with n=1 and 2 layers, respectively.

As-prepared perovskites containing 100% I and 100% Br exhibited Bragg peaks at 9.9°, 19.6°, and 29.0° as well as 10.4°, 20.9°, and 30.7°, respectively, that correspond to the (200), (400), and (101) planes of $FA_2PbX_4$ (n=1) (see FIG. 15C). These perovskites were prepared with excess perovskite precursor, e.g. FAX, rather than the long-chain or bulky cations typically used in Ruddlesden-Popper phases, so a smaller spacing between perovskite layers is expected when FAX separates the layers (see FIGS. 4A and 4B). Indeed, a smaller interlayer space of 8.9 Å (I) and 8.5 Å (Br) was observed compared to the >11 Å spacing typically observed in Ruddlesden-Popper phases. Strong Bragg peaks consistent with $\alpha$-FAPbX$_3$ that corresponds to n;>2 were also observed. Thus, optical properties and XRD results suggest these as-prepared perovskites were composed of $FA_{n+1}Pb_nX_{3n+1}$ (X=I, Br) with predominantly n=1 and n=2 layers (see FIGS. 4A and 4B).

As shown herein, among other perovskites, layered FA-based metal halide perovskite layers can be rendered reversibly chromic when strategically placed into a scaffold and processed in a way that leaves a second phase containing, among other things, switching molecules. When these conditions are met, switchable chromism can occur due to two different stimuli: at least one of changing the switching molecules concentration and/or changing the system temperature. Layered FA-based metal halide perovskite layers were exposed to a variety of switching molecules including water, MeOH, EtOH, IPA, pyridine, THF, chloroform, and DCM (see FIG. 16). Switching molecules having H-bond donors/acceptors (water, MeOH, EtOH, IPA) successfully induced reversible chromism in the perovskite layers with the degree of color change depending on the polarity and, therefore, the strength of H-bonding between the switching molecules and both an additive (e.g. DMSO) and perovskite precursor (e.g. FAX) remaining in the second phase. Water molecules induced the highest degree of chromism with five colors produced (yellow, light orange, dark orange, brown, and white). When the amount of solvent vapor was constant, the chromism could be reversed by gentle heating at temperatures as low as 35° C. (see FIG. 17). Thus, using water molecules (hygrochromism) as the switching molecule, is especially interesting due to the variety of colors (see FIGS. 13, 17, and 18) and speed of switching compared to other switching molecules (e.g. solvents).

As shown herein, the degree of water-induced chromism may depend on the processing conditions used to fabricate the perovskite-containing device, including annealing temperature, scaffold thickness, precursor concentration, the humidity when spun or annealed, and storage conditions. Annealing (i.e. heating) these perovskites at temperatures greater than 60° C. irreversibly darkened the yellow perovskites to orange (when annealing in the range between 100° C. and 150° C.) and brown (when annealing in the range between 150° C. and 175° C.), with the brown film exhibiting absorbance characteristics of bulk $\alpha$-FAPbI$_3$ (see FIGS. 19A and 19B). High temperatures likely drive off the additive (e.g. DMSO) and/or the switching molecule (e.g. water), which, as described herein, play a role in the switching mechanism. In some embodiments of the present disclosure, a scaffold appears to be needed for the observed hygrochromic properties to occur as for this example no chromism was observed without a scaffold even though the phases determined by XRD were identical (see FIG. 20B).

The concentration of the perovskite and reservoir precursor solution may be optimized to a given scaffold thickness for optimum hygrochromic properties to occur. If the perovskite (contained in the perovskite-containing phase) and/or perovskite precursor concentration in the second phase is too high for a given scaffold thickness, a thick perovskite layer may be formed on top of the scaffold (i.e. overlayer) and no color changes are observed (see FIG. 21A) similarly to when no scaffold is used (see FIG. 20A). If the precursor concentration is too low for a given scaffold thickness, the resulting film is much darker with optical properties characteristic of bulk $\alpha$-FAPbI$_3$ (see FIG. 21A). Optimal precursor concentrations based on [PbI$_2$] in an additive (e.g. DMSO, NMP, etc.) ([FAI]=4[PbI$_2$]) for a given Al$_2$O$_3$ scaffold thickness appear to be as follows: [PbI$_2$]=0.7-1 M for 1.0-1.6 µm thick alumina scaffold, [PbI$_2$]=0.4-0.6 M for 600-1000 nm thick alumina scaffold, and [PbI$_2$]=0.3-0.4 M for 300-600 nm thick alumina scaffold. When exposed to high RH, the darker perovskite films are irreversibly switched to white/colorless similar to bulk $\alpha$-FAPbI$_3$ (except upon further heating to 175° C.). DRIFTS shows the scaffold is hydroxyl-terminated (see FIG. 22). Without wishing to be bound by theory, all of these results suggest that the scaffold assists in the switching mechanism by acting as a "moisture highway" that transports the switching molecule, e.g. water, along its hydrophilic surface (see FIG. 23).

In some embodiments of the present disclosure, these hygrochromic perovskite layers were spun and annealed in the presence of >30% RH with ~40-45% RH yielding the most optimum hygrochromic properties (see FIGS. 24A-D). If the perovskite films were both spun and annealed in a N$_2$ glovebox (0% RH) or at 15% RH in air, only incomplete yellow to orange hygrochromism was observed. Yellow to orange hygrochromism was also observed if the perovskite film was spun in a N$_2$ glovebox (0% RH) but annealed at 40% RH in air. Yellow to orange to brown hygrochromism with significantly slowed transition to white/colorless was observed when the perovskite layer was spun at 40% RH in air but annealed in a N$_2$ glovebox (0% RH). Complete hygrochromism as shown in FIG. 24A was only observed if the perovskite film was both spun and annealed at 40% RH in air. Absorbance collected on perovskite films prepared by all of the above methods was similar with no systematic change. However, XRD shows significant texturing in films exhibiting only yellow to orange hygrochromism. In addition, the intensity of all XRD peaks increased, which indicates greater crystallinity. Thus, some moisture appears to be needed during film preparation for complete hygrochromic properties to be exhibited by the resultant perovskite layers.

In some embodiments of the present disclosure, complete hygrochromic properties may be susceptible to prolonged dry-air flow. In the examples described here, perovskite films stored in a flowing N$_2$ box, in a fume hood, or on the counter of a lab with high airflow, irreversibly darkened to brown over several hours to days depending on the flow rate and dryness. These conditions appear to have removed volatile DMSO (i.e. additive) and H$_2$O (i.e. switching molecule) from the second phase of the mixture contained in the scaffold pores. Storage of the perovskite layers in a closed container demonstrated stable chromic properties under these storage conditions for several months.

Hygrochromic layered FA-based metal halide perovskites. The mechanism of chromism in these perovskite layers was determined using an iodide film with water vapor as the model system. Representative images showing hygrochromism as well as the reversible switching mechanism is illustrated in FIGS. 4A and 4B, and detailed fabrication details are described below. Exposing these perovskite layers to increasing relative humidity (RH) via a humidity-controlled glovebox converted the perovskite layers from yellow (<68% RH where n=1 in the structure $FA_{n+1}Pb_nX_{3n+1}$) to orange (68-76% RH where n=2-3 in the structure $FA_{n+1}Pb_nX_{3n+1}$) to brown (76-79% RH where n>3 in the structure $FA_{n+1}Pb_nX_{3n+1}$) to white/colorless (>80% RH where the grains $FA_{n+1}Pb_nX_{3n+1}$ grains have transformed to $\delta$-FAPbI$_3$) (see FIG. 17). Furthermore, decreasing the RH reversed these color changes. As described above, the switchability of these hygrochromic perovskite layers appear to depend on the processing conditions including annealing temperature, scaffold thickness, precursor concentration, the humidity when spun and/or annealed, and storage conditions.

Optical properties (see FIG. 15A-15C) were observed that are consistent with Ruddlesden-Popper 2D metal halide perovskites described by the general formula $A'_2A_{n-1}Pb_nI_{3n+1}$ where n=1, 2, 3, . . . ∞ corresponds to the number of discrete PbI$_2$ 2D layers. The optical data suggests that each observed color is a mixture of multiple thicknesses ('n' values) and that varying the RH changes the relative ratios of these 'n' values. Increasing the RH up to 78% resulted in a decrease of the excitonic peak at 445 nm and an increase in the absorption edge at 495 nm as well as the emergence of new absorption edges located at 540 nm, 600 nm, and 700 nm that presumably correspond to n=3, 4, and 5, respectively. Subjecting the film to 80% RH caused a decrease in all peaks, which suggests the perovskite layer was beginning to turn white/colorless. A dramatic absorption change was observed upon reaching 82% RH in which absorbance in the visible region becomes effectively zero and a strong molecular absorbance peak located at 390 nm emerged that is consistent with formation of $\delta$-FAPbI$_3$.

Furthermore, PL clearly shows a mixture of 'n' values that increased as the RH increased (see FIGS. 25B and 25C). As the RH increased to 80%, the PL shifted from 545 nm to 724 nm, which shows the PL can be tuned in the visible region over a 179 nm window. The PL peak positions observed between 75-80% RH are primarily located between 700-725 nm even though absorbance still shows peaks/shoulders at 445 nm, 500 nm, 540 nm, and 600 nm. Furthermore, the PL was completely quenched upon reaching 82% RH, which is consistent with the transition to non-photoactive $\delta$-FAPbI$_3$. This optical data is consistent with a mixture of n=1 and n=2 layers that merge to form layers of n>1 that eventually become so large that the thermodynamically favored $\delta$-FAPbI$_3$ phase is formed.

To gain a better understanding into the structural evolution of the perovskite layers upon exposure to humidity, in situ X-ray diffraction (XRD) data at the Stanford Synchrotron Radiation Light Source (SSRL) were collected. Starting at ambient RH, perovskite films were exposed to humid air at 82% RH by monitoring the humidity in the sample chamber with a humidity sensor. High humidity was achieved by connecting a humidifier to the sample chamber which was regulated by a humidity control system. Dry conditions (~40% RH) were achieved by flowing helium through the system. The perovskite layers were cycled through humid/dry conditions three times while the high-resolution XRD data was collected.

Flowing humid air at 82% RH caused the Bragg peaks corresponding to 2D FA$_2$PbI$_4$ and 3D $\alpha$-FAPbI$_3$ to gradually disappear over 10.5 minutes and 18 minutes, respectively, while Bragg peaks corresponding to 1D $\delta$-FAPbI$_3$ began to emerge at about 9 minutes, which is consistent with absorbance collected at 82% RH (see FIG. 15B). The complete disappearance of 2D FA$_2$PbI$_4$ before 3D $\alpha$-FAPbI$_3$ further suggests that n=1 layers gradually merge to form layers of n>1 that eventually become so large that the thermodynamically favored 1D $\delta$-FAPbI$_3$ phase is formed. In this example, this structural change is accompanied with hygrochromism with the yellow film changing colors to orange, brown, and then white/colorless. It was noted that since the 1D $\delta$-FAPbBr$_3$ phase is only stable below −8° C. (265 K), the formation of 1D $\delta$-FAPbBr$_3$ at high RH was not expected. Instead, persistence of the 3D $\alpha$-FAPbBr$_3$ phase even at high RH occurs, which is supported by PL observed at 99% RH and synchrotron XRD (see FIG. 27).

The (100) reflection from 3D $\alpha$-FAPbI$_3$ that is initially located at 14.024° is shifted by +0.1160 compared to 13.908° expected for single-crystalline 3D $\alpha$-FAPbI$_3$ (see FIG. 26C). This positive shift is a result of a reduced lattice volume that suggests a relaxation of the tensile strain of the anisotropically strained (111) 3D $\alpha$-FAPbI$_3$ lattice plane. This positive shift is characteristic of compressive strain induced by 2D. Interestingly, as the film was exposed to 82% RH for increased time, a shift was observed in the (100) peak of 3D $\alpha$-FAPbI$_3$ from 14.024° to 13.972° ($\Delta$=0.052°) caused by increased tensile strain as the 2D $FA_{n+1}Pb_nX_{3n+1}$ perovskite layers gradually merged to become 3D nanocrystals as illustrated in FIGS. 4A and 4B. In contrast to the (100) peak of $\alpha$-FAPbI$_3$ at ~14°, the (100) peak of 1D $\delta$-FAPbI$_3$ at ~11.8° did not exhibit a shift in 2$\theta$ due to the relatively nonexistent strain in the 1D $\delta$-FAPbI$_3$ lattice.

Furthermore, Scherrer analysis showed two distinct trends. The first was a decrease in crystallite size from 0 minutes to 7.5 minutes during which the 2D perovskite layers merged together. The second was an increase in crystallite size as the newly formed 3D nanocrystals absorbed more water, which can catalytically convert 3D $\alpha$-FAPbI$_3$ into 1D $\delta$-FAPbI$_3$ by interacting with the anisotropically strained (111) lattice plane. The transition between these two regimes (7.5 minutes to 9 minutes) corresponded to the formation of 1D $\delta$-FAPbI$_3$. Scherrer analysis shows an increase in crystallite size as 1D $\delta$-FAPbI$_3$ grew until a constant crystallite size was reached. After exposure to flowing 82% RH N$_2$ gas until the perovskite film was completely white/colorless, exposure of flowing dry He gas completely reversed the above phase transformations: the (100) peak of 1D $\delta$-FAPbI$_3$ at ~11.8 completely disappeared while the (100) peak of 3D $\alpha$-FAPbI$_3$ at ~14° as well as the (200), (400), and (101) peaks of 2D FA$_2$PbI$_4$ at 9.9°, 19.6°, and 29.0° reemerged (see FIG. 26A). As H$_2$O was removed from the perovskite film, the a/$\delta$-FAPbI$_3$ crystallites were exfoliated to re-form the layered 2D $FA_{n+1}Pb_nX_{3n+1}$ structure. FIG. 26A highlights the structural reversibility of this phase change mechanism over three complete cycles.

This reversibility suggests that residual DMSO and H$_2$O, that was described to be important for hygrochromic properties, behave as an "FAI reservoir" that can accept or donate FAI from or to the perovskite layers. Thus, as the RH was varied, FAI perovskite precursor molecules were transported from between the perovskite layers and the FAI reservoir as illustrated in FIGS. 4A and 4B. One may conclude that a dynamic equilibrium exists between the FAI reservoir and the perovskite layers and that this equilibrium is modulated by the RH (concentration of water vapor). This suggests that the perovskite layers may be thermodynamically driven together as RH is increased because of molecular interactions.

The dynamics of the reversible phase transformation illustrated in FIGS. 4A and 4B was investigated using in-situ diffuse-reflectance infrared Fourier transform spectroscopy (DRIFTS). DRIFTS collected on the as-prepared film at 17.3% RH shows vibrational modes corresponding to the FA$^+$ cation, DMSO, and H$_2$O, which signifies that all three are in the as-prepared film (see FIGS. 28A-28D). Specifically: N—H stretching modes between 3400-3200 cm$^{-1}$ and C—N asymmetric stretching at 1716 cm$^{-1}$ corresponding to the FA$^+$cation[44]; C—H bending modes between 1400-1300 cm$^{-1}$, S═O stretching at 1056 cm$^{-1}$, and C—H rocking at 1028 cm$^{-1}$ corresponding to DMSO[45]; and O—H stretching at 3510 cm$^{-1}$ corresponding to intermolecularly bound H$_2$O.[46, 47]

As the humidity increased from 17.3% RH to 83.1% RH and the perovskite layer changed color from yellow (<68% RH where n=1 in the structure FA$_{n+1}$Pb$_n$X$_{3n+1}$) to orange (68-76% RH where n=2-3 in the structure FA$_{n+1}$Pb$_n$X$_{3n+1}$) to brown (76-79% RH where n>3 in the structure FA$_{n+1}$Pb$_n$X$_{3n+1}$) to white/colorless (>80% RH where the grains FA$_{n+1}$Pb$_n$X$_{3n+1}$ grains have transformed to δ-FAPbI$_3$). the DRIFTS spectra underwent several changes showing that H$_2$O not only incorporates into the film but also hydrogen bonds to both FA$^+$ and DMSO. The increased intensity of O—H stretch located between 3550-3200 cm$^{-1}$ suggests that increasing amounts of H$_2$O were incorporated into the perovskite layer and were intermolecularly hydrogen bonded. An isosbestic point at 3688 cm$^{-1}$ was also observed that signifies a reduction in free H$_2$O (>3688 cm$^{-1}$) and an increase in intermolecularly hydrogen-bonded H$_2$O (3550-3200 cm$^{-1}$). A broadening of the N—H stretching modes was observed, which suggests that their bonding environment was changing over time likely through hydrogen bonding with water and/or DMSO. In fact, the N—H stretching modes underwent blue-shifting at high RH values, which indicates both shortening and strengthening of the N—H bond. The C—N asymmetric stretching peak began to decrease as the RH was increased and a shoulder at 1730 cm$^{-1}$ began to grow in. Both S═O stretch and C—H rocking modes red shift at higher RH values, which is characteristic with hydrogen bonding to water. The reversibility of the phase transformation illustrated in FIGS. 29A and 29B was also demonstrated by cycling a freshly prepared sample between 17-83% RH with an increasing RH rate of 3.2±0.2%/min and a decreasing RH rate of 1.9±0.3%/min during data acquisition. Thus, these data strongly suggest that water (i.e. switching molecule), the FA$^+$ cation (i.e. perovskite precursor), and DMSO (i.e. additive) undergo reversible hydrogen bonding with each other as the RH is varied.

Further evidence for molecular interactions as the thermodynamic driving force for chromism in these films is the identity of the switching molecule and chromism induced through temperature. The switching molecule is likely a polar protic H-bond acceptor/donor for chromic properties to occur (see FIG. 16). This shows that the identity of the switching molecule is important because it likely interacts with the FAI-DMSO-H$_2$O mixture (i.e. second phase 230) and the perovskite per Panel (A) of FIG. 5. Furthermore, when the concentration of the switching molecule is held constant, heating the perovskite can also induce chromic properties. In this case, the relative strength of H-bonds is weakened when heated and strengthened when cooled. So, as described herein, a perovskite may be switched between states by changing at least one of the concentration of the switching molecule in the vicinity of the perovskite and/or by changing the temperature of the perovskite.

By considering all characterization techniques, one may conclude that these hygrochromic perovskite films are composed of layered 2D perovskites that are surrounded by a dynamic reservoir composed of a FAI-DMSO-H$_2$O mixture (i.e. second phase). The degree of hydrogen bonding between the reservoir, perovskite, and switching molecule (water) is changed at varying RH, which either merges or exfoliates the 2D metal halide perovskites if the RH is increased or decreased, respectively. At high enough RH, the merged layers form a perovskite layer that is large enough to induce significant tensile strain that allows moisture to easily convert α-FAPbI$_3$ to δ-FAPbI$_3$.

Since these hygrochromic perovskite films are transitioning between 2D FA$_{n+1}$Pb$_n$I$_{3n+1}$ layers, 3D α-FAPbI$_3$ layers, and 1D δ-FAPbI$_3$ layers upon varying the RH, one might expect sizable differences in the photoconductivity of each phase based on differences in excitonic character and binding energy. These differences were measured using contactless flash-photolysis time-resolved microwave conductivity (fp-TRMC) by photoexciting Al$_2$O$_3$ scaffold-impregnated films at 450 nm at the lowest possible laser fluences (ca. 10$^{11}$-10$^{12}$ photons/cm$^2$) to obtain satisfactory S/N while avoiding higher-order recombination effects associated with high charge densities. Indeed, a significant change in the yield-mobility product (φΣμ) was observed when comparing perovskite films exposed to 20% RH (yellow) to those at 70-78% RH (orange and brown). The orange and brown perovskite phases demonstrate ca. 5-6 times higher φΣμ values compared to the yellow phase (Table 1), which is likely due in part to increases in charge yield (φ) as the exciton binding energy decreases for larger (higher n) crystallites. Additionally, it is feasible that electron and hole mobilities (represented by Σμ) may increase concomitantly with charge yield. Furthermore, the values of the orange phase are more similar to the brown phase likely due to an appreciable number density of n=4-5 crystallites that dominate the fp-TRMC signal over smaller (n=1-3) layers for the reasons described above. Putting limits on the sum of the hole and electron mobilities for these compounds, it was estimated that values of 0.003-0.3 and 0.019-1.9 cm$^2$V$^{-1}$s$^{-1}$ are possible for yellow and brown phases, respectively, assuming charge yields between 100-1%.[51]

φΣμ values obtained for the brown (most photoconductive) phase were comparable to those obtained for (BA)$_2$(MA)$_2$Pb$_3$I$_{10}$ and (BA)$_2$(MA)$_3$Pb$_4$I$_{13}$ (n=3 and 4, respectively) Ruddlesden-Popper 2D perovskites (0.03-0.04 cm$^2$V$^{-1}$s$^{-1}$) at the lowest available fluences (ca. 10$^{13}$ photons/cm$^2$), although these films were measured at up to 2 orders of magnitude higher fluence than the brown films measured here ("BA" corresponds to butylammonium). As such, values for BA-based 2D perovskites are likely higher than reported since low fluence regimes where #Ep values exhibit minimal fluence-independence, and are maximized, were unobtainable. Furthermore, brown phase #Ep values are roughly 50 times smaller (ca. 1 cm$^2$V-is$^{-1}$) than (MA)$_2$Pb(SCN)$_2$I$_2$(n=1) and (BPEA)$_2$(MA)Pb$_2$I$_7$(n=2), and over three orders of magnitude smaller than BA$_2$MA$_{n-1}$PbnI$_{3n+1}$]$^{2-}$(n=4-5, ca. 15-30 cm$^2$V$^{-1}$s$^{-1}$). Scaffold-impregnated perovskite layers likely have random crystallite orientation, which will lower our #Ep values with crystallographic anisotropy due to only a subpopulation of charges in crystallites with the proper orientation being detected by linearly polarized microwaves. Despite the large differences in φΣμ magnitudes compared to the literature analyzed here, the free charge lifetime in the brown phase (ca. 50 ns) is only roughly half that of (MA)$_2$Pb(SCN)$_2$I$_2$(n=1) and BA$_2$MA$_{n-1}$Pb$_n$I$_{3n+1}$(n=4-5). Relative to the brown phase, yellow exhibited only slightly shorter free charge lifetimes (ca. 25 ns). Measurements of φΣμ of the white/colorless phase was not possible as the lowest fluences were sufficient to convert this phase into the brown phase via a heat-induced dehydration mechanism (see FIG. 30). In fact, temperatures as low as 35° C. are sufficient for this conversion to occur (see FIG. 16).

TABLE 1 fp-TRMC Data

| RH (%) | Color | $\phi\Sigma\mu$ (cm$^2$V$^{-1}$s$^{-1}$) |
|---|---|---|
| 20 ± 3 | Yellow | 0.003 ± 0.002 |
| 70 ± 3 | Orange | 0.014 ± 0.002 |
| 78 ± 3 | Brown | 0.019 ± 0.008 |

Experimental

Materials. Aluminum oxide nanoparticles ($Al_2O_3$, <50 nm particle size, 20 wt % in isopropanol) and dimethyl sulfoxide (DMSO, anhydrous, >99.9%) were purchased from Sigma-Aldrich; lead(II) iodide ($PbI_2$, 99.99%) from TCI; formamidinium iodide (FAI) from GreatCell Solar Materials.

Film preparation. Glass substrates (25 mm×25 mm×1 mm) were sonicated in isopropanol for 10 min and blown dry with $N_2$. The substrates were then treated in a UV-ozone cleaner for 10 min before spin-coating 200 μL of 16 wt % $Al_2O_3$ nanoparticles (20-40 nm) in isopropanol at 3000 rpm for 30 s. The resulting film was annealed at 150° C. for 5 min followed by 500° C. for 25 min. This process yielded a 1.58±0.2 μm-thick $Al_2O_3$ scaffold. The $Al_2O_3$ NP precursor can be diluted with IPA to yield thinner films. Next, 75 μL of a precursor solution containing 3 M FAI and 0.75 M $PbI_2$ (4:1 FAI:$PbI_2$) in DMSO was spin-coated at 4000 rpm for 30 s followed by annealing at 60° C. for 10 min. We note here that precursor concentration must be optimized for a given scaffold thickness. Optimal precursor concentrations based on $PbI_2$ ([FAI]=4[$PbI_2$]) for a given scaffold thickness are as follows: 0.7-1 M $PbI_2$ for 1.0-1.6 μm thick, 0.4-0.6 M $PbI_2$ for 600-1000 nm thick, and 0.3-0.4 M $PbI_2$ for 300-600 nm thick. In general, use a more concentrated precursor for thicker scaffolds and a less concentrated precursor for thinner scaffolds. Both spin-coating and annealing were performed in air while maintaining the relative humidity (RH) between 40-45%. The substrates were then stored in a drawer (<20% RH) or desiccator in air until needed.

Humidity control. The majority of humidity-controlled experiments were performed in a humidity glovebox equipped with a humidity controller connected to a humidity sensor (error of ±3%), humidifier, and dehumidifier unless noted elsewhere. The controller maintains the humidity with an accuracy of ±0.1-0.3% The humidity controller was calibrated to saturated KBr in water, which exhibits a relative humidity (RH) of 81.67±0.21% at 20° C.[55] Alternatively to a humidity controlled glovebox, saturated salt water solutions in a closed jar or container can be used; however, this method is not as compatible with common characterization techniques. Useful saturated salt water solutions for the materials outlined in this study are: NaI (39.65±0.59% RH), NaBr (59.14±0.44% RH), KI (69.90±0.26%), NaCl (75.47±0.14%), and KBr (81.67±0.21%) at 20° C.[55]

RH is different at sea level compared to high altitudes (NREL, this study). Therefore, the RH's reported herein are converted to absolute humidities (AH's) using 25° C. and 752 mmHg as a typical barometric pressure of NREL in Golden, Colo.:

TABLE 2

Relative vs. Absolute Humidities

| RH (%) | AH (g/m$^3$) |
|---|---|
| 20 | 4.61 |
| 40 | 9.23 |
| 60 | 13.84 |
| 65 | 15.00 |
| 70 | 16.15 |
| 75 | 17.31 |
| 78 | 18.00 |
| 80 | 18.46 |
| 82 | 18.92 |

Optical characterization. Absorbance was collected using with a photodiode array Hewlett-Packard 8453 UV-vis spectrometer with $Al_2O_3$ scaffold and glass absorbance subtracted from all spectra. Steady-state PL measurements were taken using a home-built system. Samples were excited using a Thorlabs fiber-coupled 405 nm light-emitting diode (LED) pulsed at 10 Hz using a Thorlabs DC2200 LED driver. Visible detection was made using an Ocean Optics OceanFX spectrometer. Spectra were stitched using a LabVIEW program developed in-house. Detector calibration was done using an Ocean Optics HL-2000-HP blackbody lamp. Prior to data acquisition, the substrate was sealed into an air-tight optical holder filled with the desired RH. Optical measurements were collected on films prepared with a 326±22 nm thick $Al_2O_3$ NP scaffold.

Structural characterization. In situ X-ray diffraction data was collected at the Stanford Synchrotron Radiation Light Source (SSRL) at beamline 11-3. The samples were measured at an incident angle of 3 deg with an incident X-ray energy of 12.7 keV. A Rayonix MX225 2D detector was used to collect and a $LaB_6$ standard used to calibrate the data. A commercial room humidifier was powered by a humidity controller, which was connected to a humidity sensor within the sample chamber. To reduce the humidity in the sample chamber, helium gas was flown through the chamber until the RH reached 35%. At this level, the He flow was manually reduced to stabilize the humidity. This enabled a stable RH of 82%. The data collection was continuous except for brief interruptions for changing the sample chamber connection between the humidifier and the He. The integration time per measurement was 30 s. The data was integrated using GSAS-II. 2θ values were obtained by converting the data relative to Cu Kα (1.5406 Å, 8.04 eV). Scherrer analysis was performed using a K value of 0.9 and FWHM values obtained by fitting peaks to a Gaussian function. Non-synchrotron XRD was collected using a Bruker D8 Discover diffractometer with GADDS 4-circle detector (General Area Detector Diffraction System).

DRIFTS measurements. A Bruker Alpha FTIR spectrometer outfitted with a diffuse-reflectance infrared Fourier transform spectroscopy (DRIFTS) attachment was used in the study and all measurements were performed in a humidity glovebox as described above. Samples were prepared as described above except Au-coated Si was used instead of glass as the substrate. FTIR data was collected between 350-4000 cm$^{-1}$ with a resolution of 2 cm$^{-1}$. RH and temperature data were collected using a data logger with points collected every second. Each FTIR spectrum was collected over 45s, so 45 individual RH and temperature points were averaged to determine the average RH and temperature of each spectrum. The RH was increased at a rate of 3.2±0.2%/min and decreased at a rate of 1.9±0.3%/min during data acquisition.

Flash-Photolysis Time-Resolved Microwave Conductivity (fp-TRMC). Our fp-TRMC measurement system and methods has been described in detail elsewhere.[49,50] Photo-excitation was accomplished using a Nd:YAG (Spectraphysics Quanta Ray SP Pro 230-30H) laser with 9 W of 355 nm at 30 Hz to pump an OPO (Spectraphysics GWU PremiScan ULD/500) with output over the range of 410-2500 nm with 7 ns pulses (ca. 3 W output, varies by wavelength). Blank quartz substrates and quartz substrates with only the alumina scaffold were used to gauge any background contributions to the TRMC transients and showed no appreciable response. All samples were excited at 450 nm with fluences in the range of ca. $1\times10^{11}$—to—$2\times10^{15}$ photons/cm$^2$ depending on the strength of the sample response and phase stability during illumination. A 399 nm long pass filter and 700 nm short pass filter were used to cut out residual 355 and 1064 nm light from the OPO, respectively. Maintaining the RH levels necessary to stabilize the brown phase during measurements was achieved by sealing samples in a leak-resistant microwave cavity within the humidified glovebox described previously. At higher fluences, phases held at higher RH tended to revert back to phases at lower ones, possibly due to heat-driven dehydration of the film. For this reason, the white/colorless phase could not be measured at even the lowest fluences. Phase purity was assessed by monitoring the steady-state photoluminescence for films in-situ during fp-TRMC measurements using a camera lens to focus emitted photons from the microwave cavity into an optical fiber that was coupled to a Princeton Instruments SpectraPro 2500i spectrometer with a liquid-nitrogen cooled CCD detector. A 500 nm long pass filter was used to filter out excitation light (450 nm) and photoluminescence spectra were typically acquired by averaging 60 seconds to monitor phase stability on a minute-to-minute basis. The yellow phase was the only sample for which the entire fluence range was measured. Typical fluences for orange and brown samples were ca. $1\text{-}20\times10^{11}$ photons/cm$^2$. Most transients were acquired for 30,000 shots or until S/N=10. For some yellow and orange samples with lower S/N at low fluences, 60,000 shots were acquired. Transient fitting was done using a custom global fitting routine in Igor Pro 8 using a biexponential fit. Yield mobility products at each fluence were extracted by summing the amplitudes of the optimized fit coefficients. For each sample, an average of the yield mobility product values over the lowest four-to-five fluences were taken to represent the average yield mobility product for that sample. These values were then further averaged over three samples to obtain the values and uncertainties reported here.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
   a scaffold comprising an internal space and at least one of a metal oxide or a polymer; and
   a mixture positioned within the space, wherein:
   the space is defined by a plurality of pores having a pore size between about 1 nm and about 0.1 mm,
   the mixture comprises a first phase comprising a metal halide perovskite and a second phase comprising at least one of a perovskite precursor or a switching molecule,
   the composition is capable of reversibly switching between a first state comprising a first transparency and a second state comprising a second transparency,
   the first state corresponds to the metal halide perovskite being substantially in a first crystalline form comprising at least one of a zero-dimensional network or a one-dimensional network,
   the first crystalline form comprises at least one of $FA_4PbI_6$ or $FA_3PbI_5$, wherein FA is formamidinium,
   the second state corresponds to the metal halide perovskite being substantially in a second crystalline form comprising at least one of a two-dimensional network or a three-dimensional network,
   the second crystalline form comprises at least one of $FA_2PbI_4$, $FA_3Pb_2I_7$, or $FAPbI_3$, and the metal halide perovskite comprises a first cation (A), a second cation (B), and an anion (X).

2. The composition of claim 1, wherein the metal oxide comprises at least one of $Al_2O_3$, $TiO_2$, $SiO_2$, NiO, ZnO, $ZrO_2$, ZnS, CdS, or BaS.

3. The composition of claim 1, wherein the switching molecule comprises at least one of water, an alcohol, or an amine.

4. The composition of claim 1, wherein the perovskite precursor comprises A and X.

5. The composition of claim 1, wherein the second phase further comprises an additive.

6. The composition of claim 5, wherein the additive comprises at least one of a polar solvent or a polar aprotic ionic liquid.

7. The composition of claim 1, wherein both the first state and the second state further comprise least one of a colorless appearance or a color comprising at least one of yellow, orange, red, brown, or black.

8. A device comprising:
   a photovoltaic layer comprising the composition of claim 1, wherein the photovoltaic layer has a thickness between about 50 nm and about 1.5 µm.

9. The device of claim 8, further comprising a reservoir capable of supplying the switching molecule to the mixture.

10. The composition of claim 1, wherein:
    the first crystalline form comprises the structure $A_{n+1}BnX_{3n+1}$,
    the second crystalline form comprises the structure $A_{n+1-q}B_nX_{3n+1-q}$,
    the perovskite precursor comprises the structure AX,
    the reversible switching follows the equilibrium reaction $$A_{n+1}BnX_{3n+1} \Leftrightarrow A_{n+1-q}B_nX_{3n+1-q} + qAX,$$

n for the first crystalline form is an integer greater than or equal to 1, n for the second crystalline form is an integer greater than the integer for the first crystalline form, and $q=1/n(n+1)$.

* * * * *